(12) United States Patent
Sugimachi

(10) Patent No.: US 8,865,536 B2
(45) Date of Patent: Oct. 21, 2014

(54) SEMICONDUCTOR DEVICE AND MANUFACTURING METHOD THEREOF

(75) Inventor: Tatsuya Sugimachi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/170,711

(22) Filed: Jun. 28, 2011

(65) Prior Publication Data

US 2012/0074478 A1    Mar. 29, 2012

(30) Foreign Application Priority Data

Sep. 28, 2010   (JP) .................................. 2010-217026

(51) Int. Cl.
*H01L 27/06*   (2006.01)

(52) U.S. Cl.
USPC ........... 438/201; 438/268; 438/253; 438/396; 438/211

(58) Field of Classification Search
USPC .......... 257/315, 316, 348; 438/268, 253, 396, 438/201, 211
See application file for complete search history.

(56) References Cited

U.S. PATENT DOCUMENTS

| 6,020,610 | A  | * | 2/2000  | Ueno et al. ..................... 257/315 |
| 6,153,463 | A  | * | 11/2000 | Wei et al. ........................ 438/253 |
| 6,414,351 | B2 | * | 7/2002  | Clampitt et al. ............... 257/315 |
| 7,112,841 | B2 | * | 9/2006  | Eldridge et al. ............... 257/314 |
| 7,256,125 | B2 |   | 8/2007  | Yamada et al. |
| 7,314,797 | B2 | * | 1/2008  | Iwai et al. ...................... 438/258 |
| 7,601,635 | B2 |   | 10/2009 | Yamada et al. |
| 8,049,267 | B2 |   | 11/2011 | Sugimae et al. |
| 2003/0022445 | A1 | * | 1/2003  | Taniguchi et al. ............. 438/257 |
| 2004/0124477 | A1 | * | 7/2004  | Minami et al. ................. 257/379 |
| 2005/0269663 | A1 | * | 12/2005 | Minami et al. ................. 257/510 |
| 2006/0243978 | A1 |   | 11/2006 | Wakamiya et al. |
| 2010/0295137 | A1 | * | 11/2010 | Zhou ............................. 257/392 |

FOREIGN PATENT DOCUMENTS

| JP | 5-021808     | A | 1/1993  |
| JP | 2000-150789  | A | 5/2000  |
| JP | 2001-237327  | A | 8/2001  |
| JP | 2002-016230  | A | 1/2002  |
| JP | 2005-72237   | A | 3/2005  |
| JP | 2006-310601  | A | 11/2006 |
| JP | 2009-295781  | A | 12/2009 |

OTHER PUBLICATIONS

Office Action dated Mar. 4, 2014, issued in Japanese Patent Application No. 2010-217026 with Partial English Translation (7 pages).

* cited by examiner

*Primary Examiner* — Julio J Maldonado
*Assistant Examiner* — Jaehwan Oh
(74) *Attorney, Agent, or Firm* — Westerman, Hattori, Daniels & Adrian, LLP

(57) ABSTRACT

As for a bypass capacitor, a first capacitor insulating film, together with a tunnel insulating film of a storage element, is formed of a first insulating film, a first electrode being a lower electrode, together with floating gate electrodes of the storage element, is formed of a doped-amorphous silicon film (a crystallized one), a second capacitor insulating film, together with a gate insulating film of transistors of 5 V in a peripheral circuit, is formed of a second insulating film, and a second electrode being an upper electrode, together with control gate electrodes of the storage element and gate electrodes of the transistors in the peripheral circuit, is formed of a polycrystalline silicon film.

16 Claims, 47 Drawing Sheets

STORAGE ELEMENT PORTION
(GATE VERTICAL DIRECTION)

BYPASS CAPACITOR PORTION

STORAGE ELEMENT PORTION

BYPASS CAPACITOR PORTION

PERIPHERAL TRANSISTOR PORTION

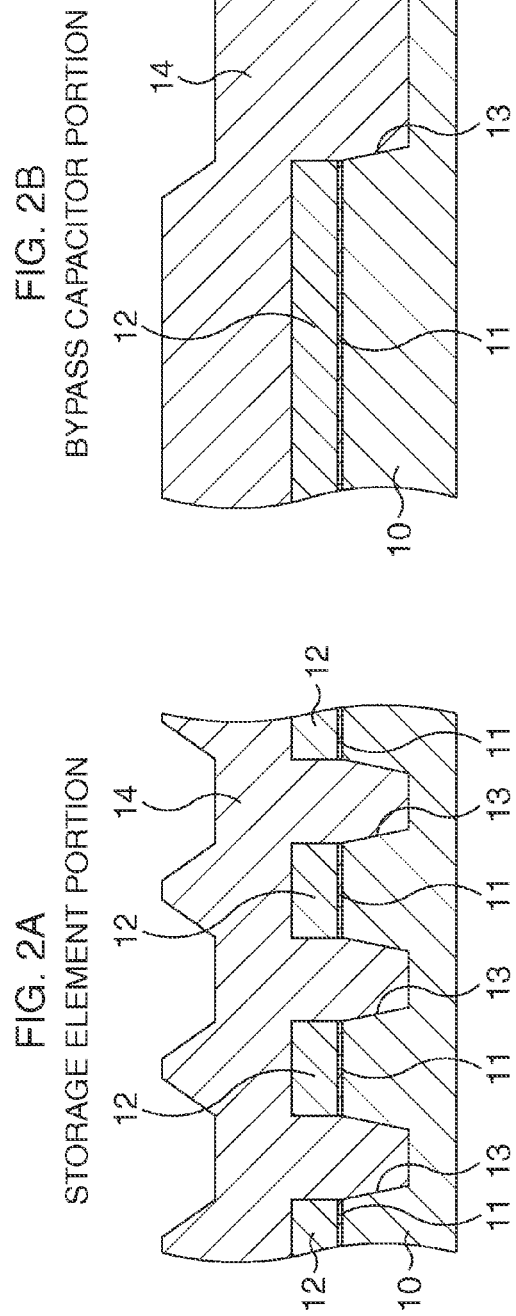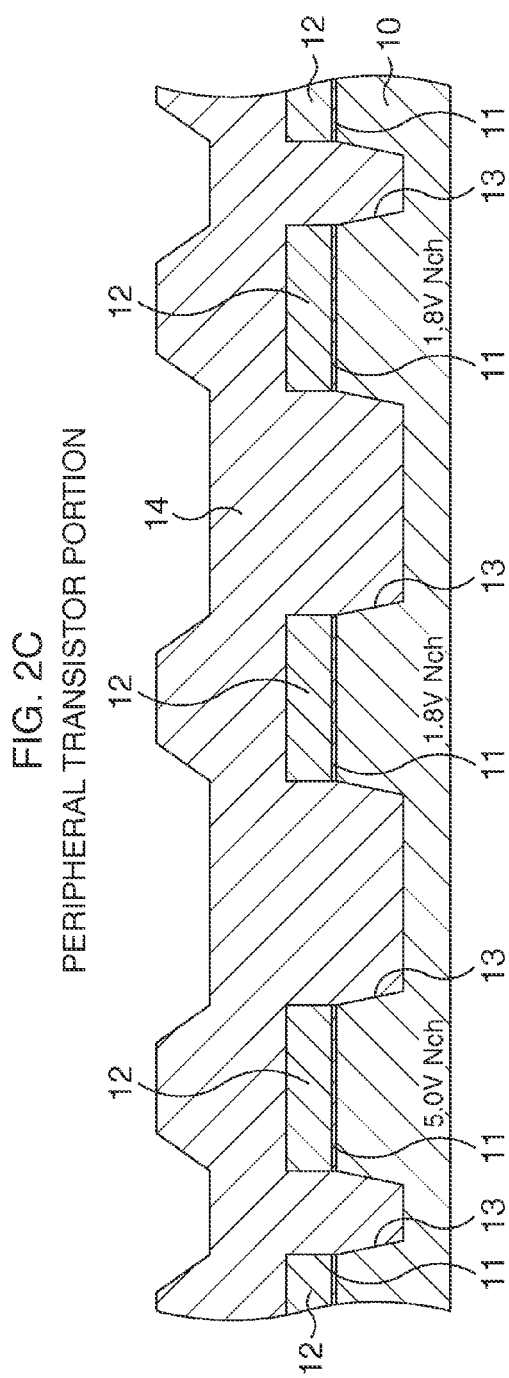

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

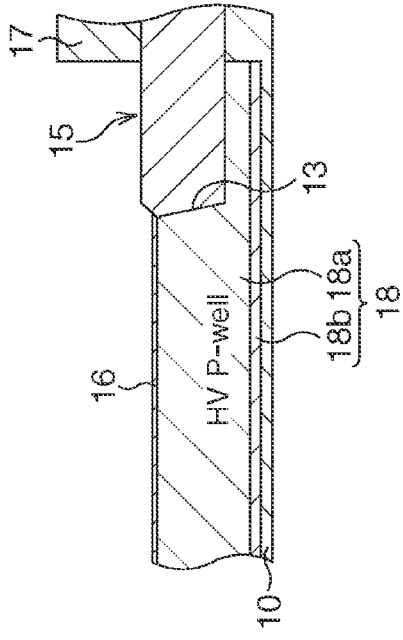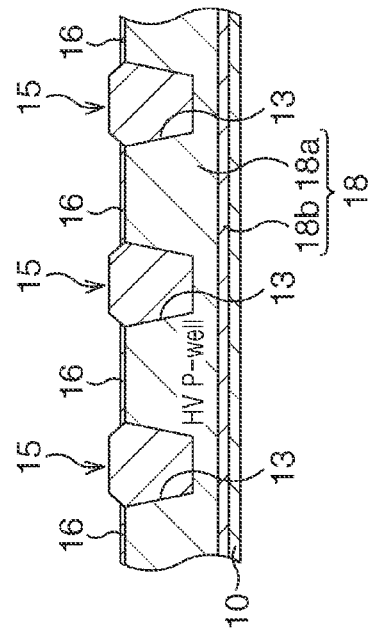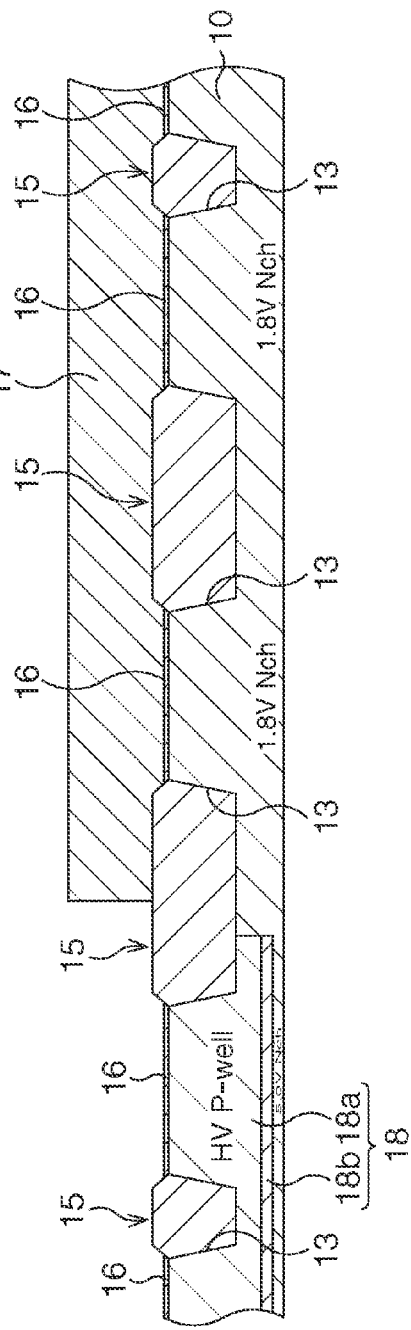

BYPASS CAPACITOR PORTION

STORAGE ELEMENT PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION
(GATE VERTICAL DIRECTION)

BYPASS CAPACITOR PORTION

PERIPHERAL TRANSISTOR PORTION

STORAGE ELEMENT PORTION
(GATE VERTICAL DIRECTION)

BYPASS CAPACITOR PORTION

PERIPHERAL TRANSISTOR PORTION

STORAGE ELEMENT PORTION
(GATE VERTICAL DIRECTION)

BYPASS CAPACITOR PORTION

PERIPHERAL TRANSISTOR PORTION

BYPASS CAPACITOR PORTION

STORAGE ELEMENT PORTION

PERIPHERAL TRANSISTOR PORTION

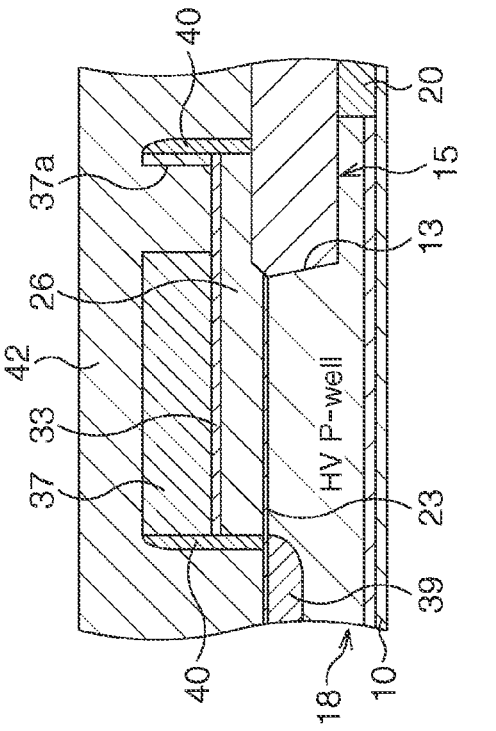
FIG. 22B BYPASS CAPACITOR PORTION
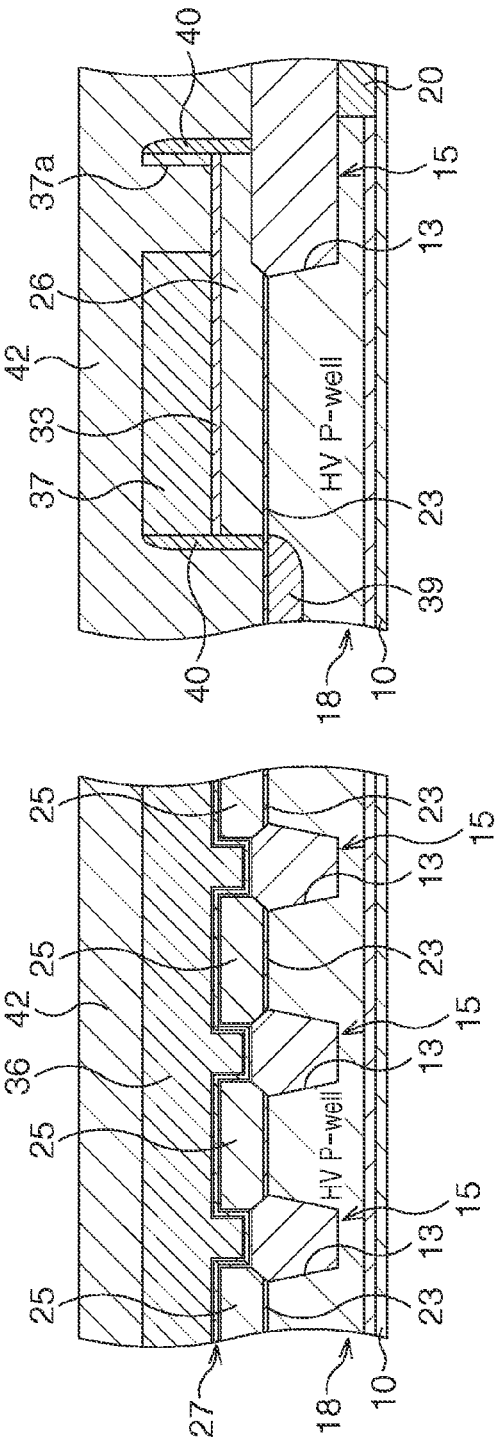
FIG. 22A STORAGE ELEMENT PORTION
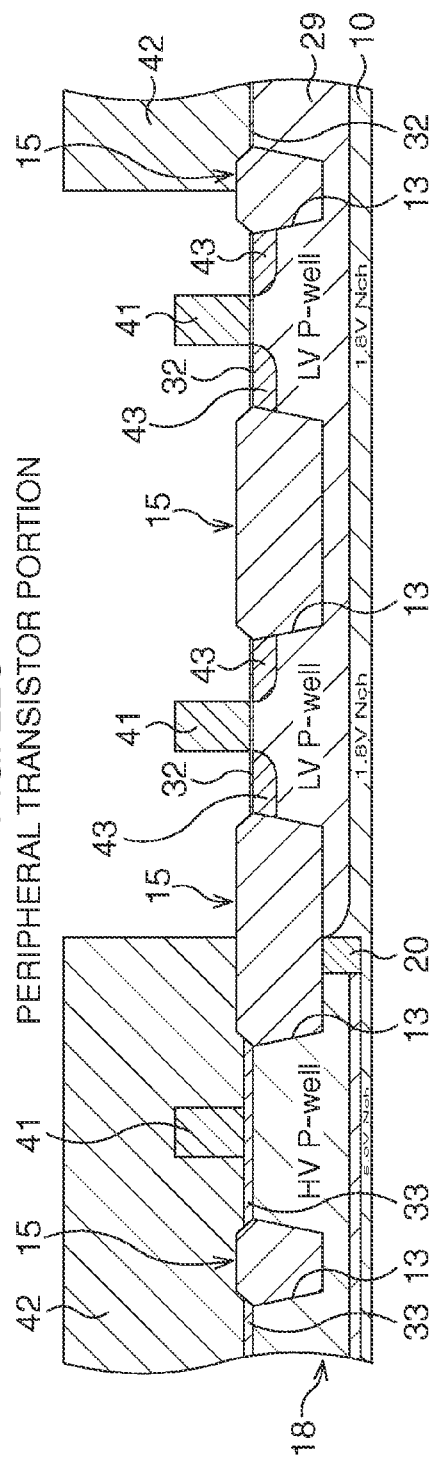
FIG. 22C PERIPHERAL TRANSISTOR PORTION

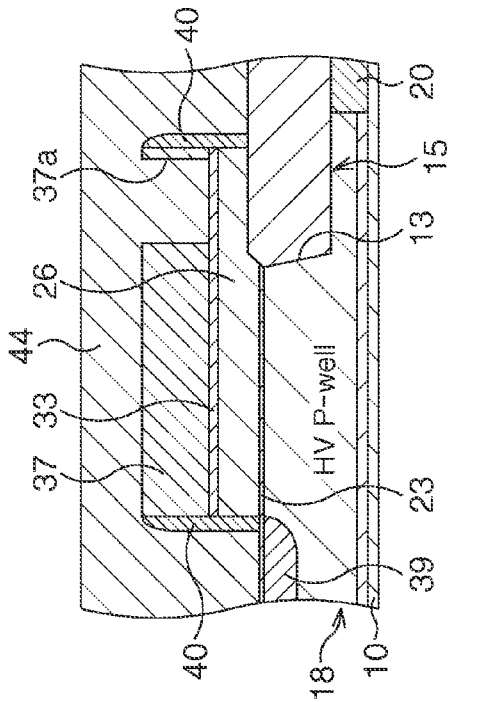
FIG. 23A STORAGE ELEMENT PORTION
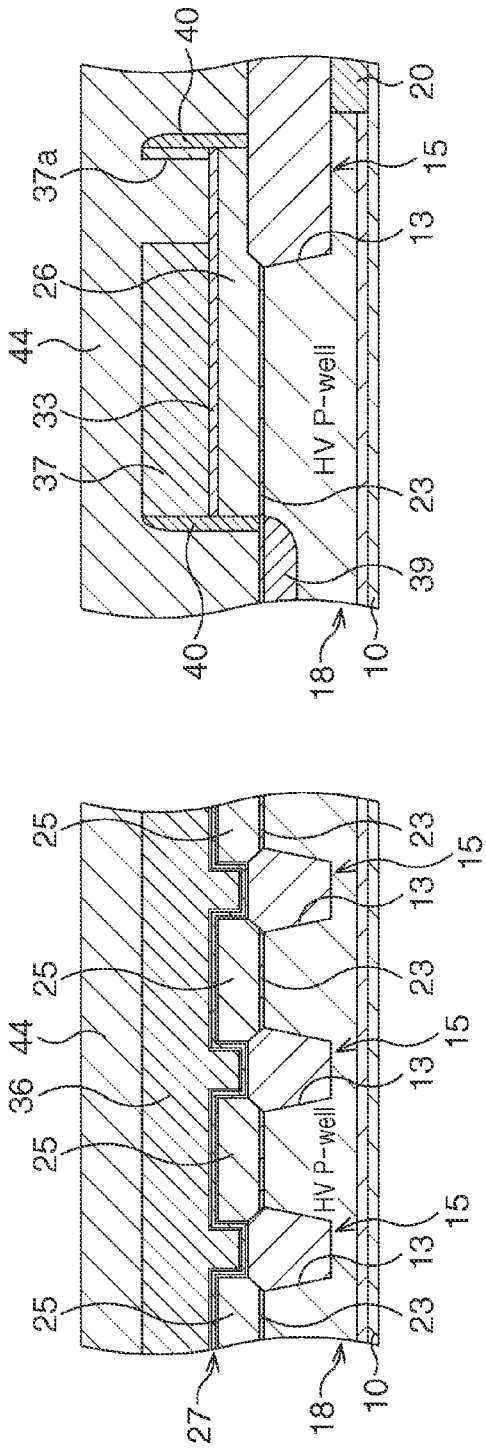
FIG. 23B BYPASS CAPACITOR PORTION
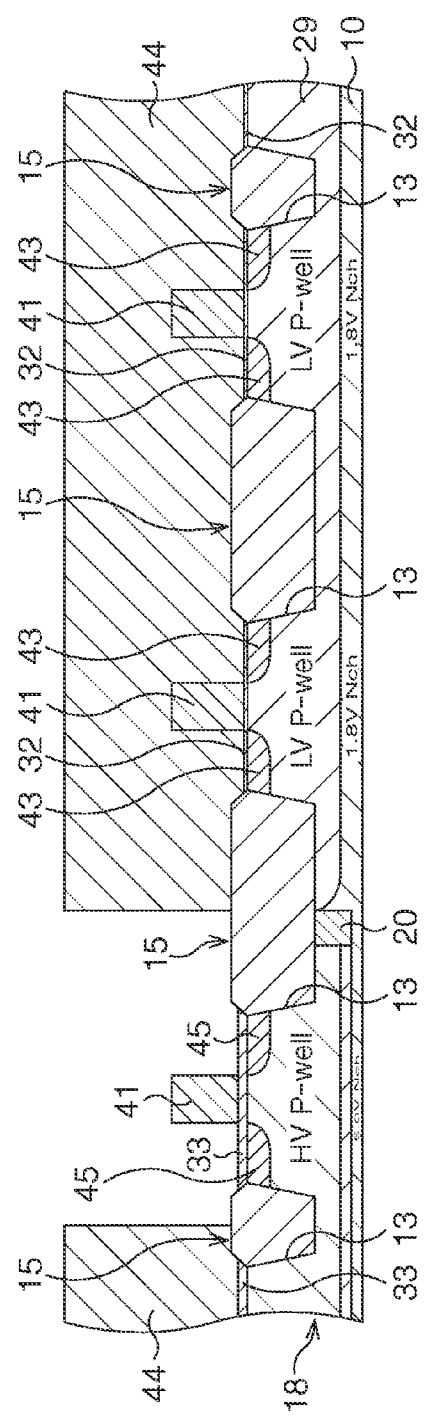
FIG. 23C PERIPHERAL TRANSISTOR PORTION

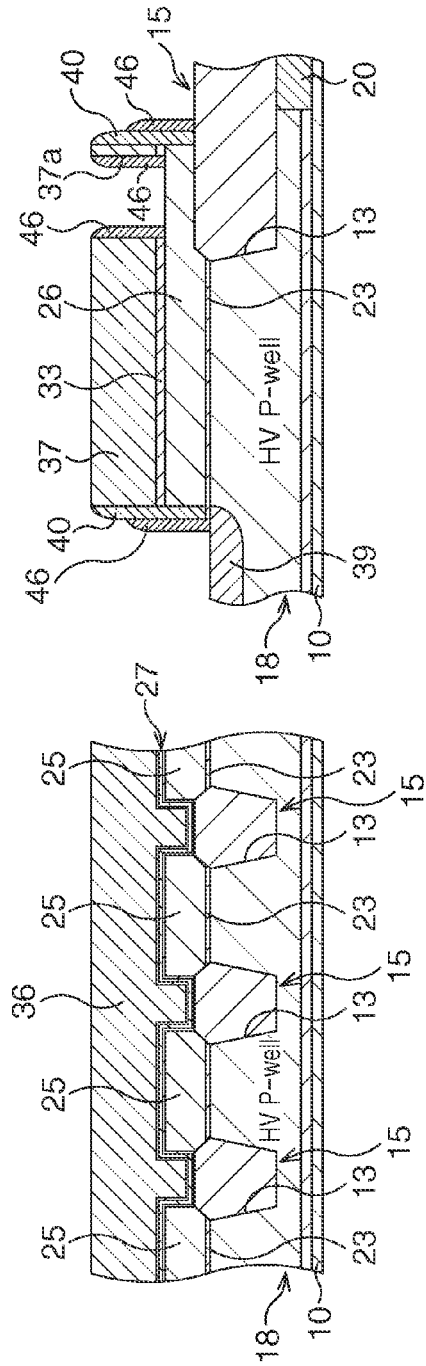
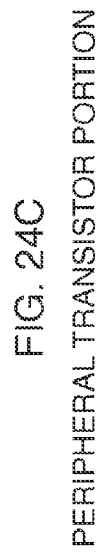
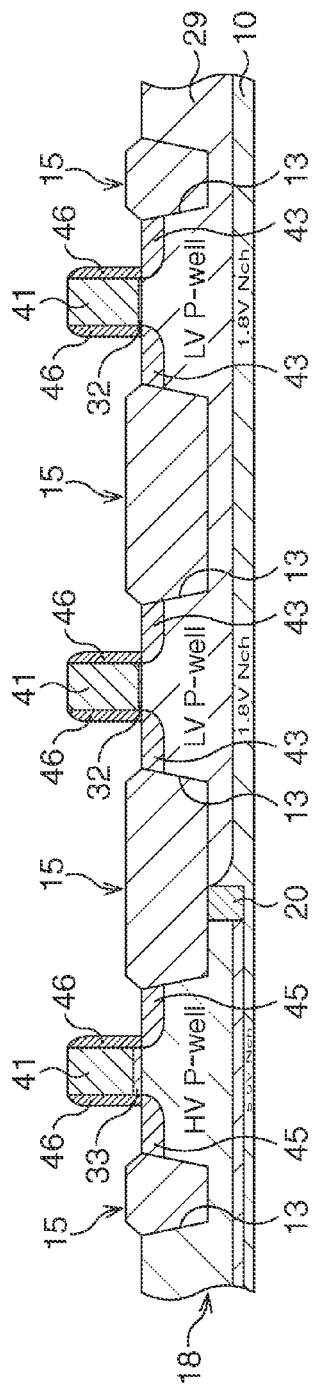
FIG. 24A STORAGE ELEMENT PORTION
FIG. 24B BYPASS CAPACITOR PORTION
FIG. 24C PERIPHERAL TRANSISTOR PORTION

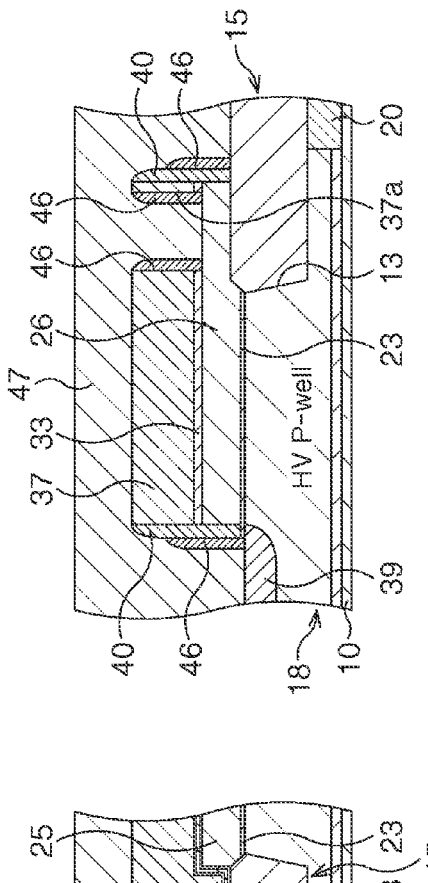
FIG. 25A STORAGE ELEMENT PORTION
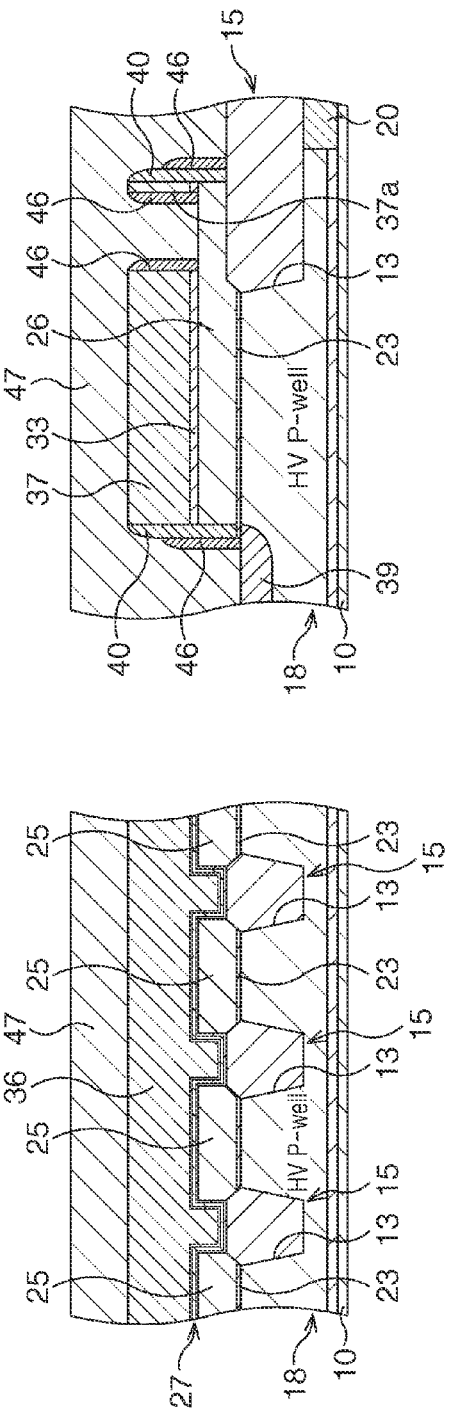
FIG. 25B BYPASS CAPACITOR PORTION
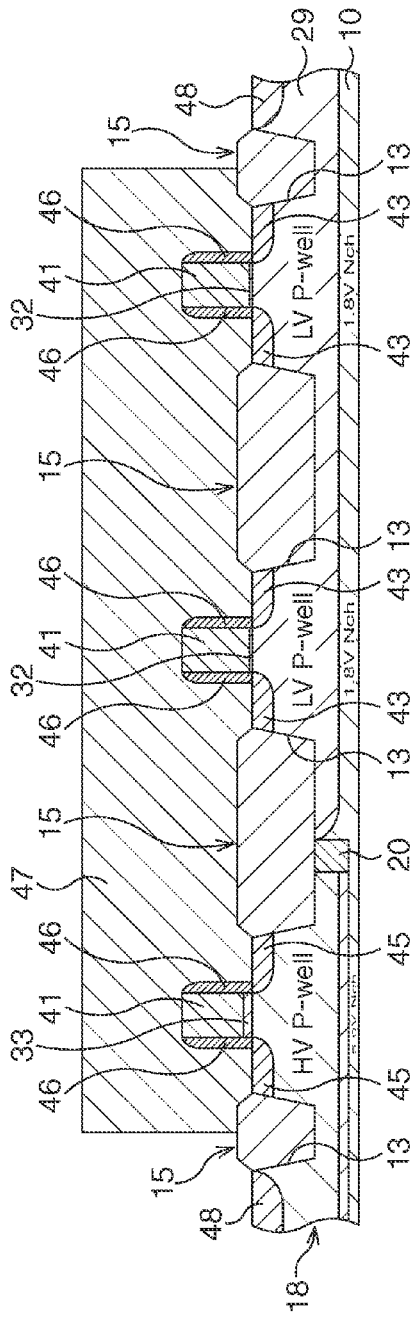
FIG. 25C PERIPHERAL TRANSISTOR PORTION

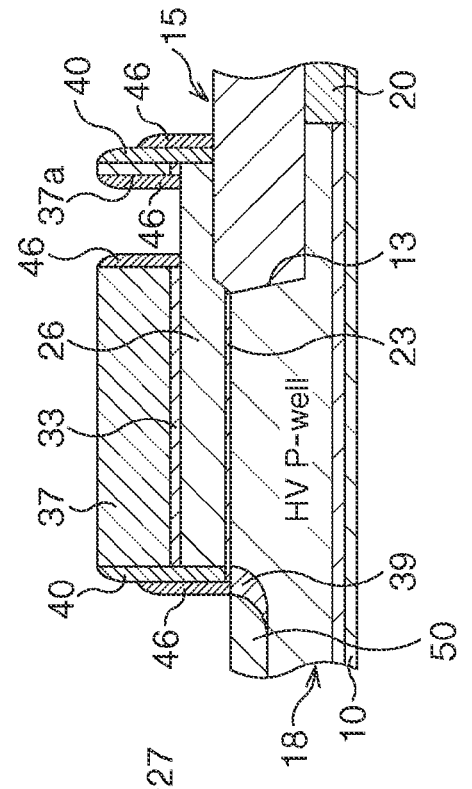
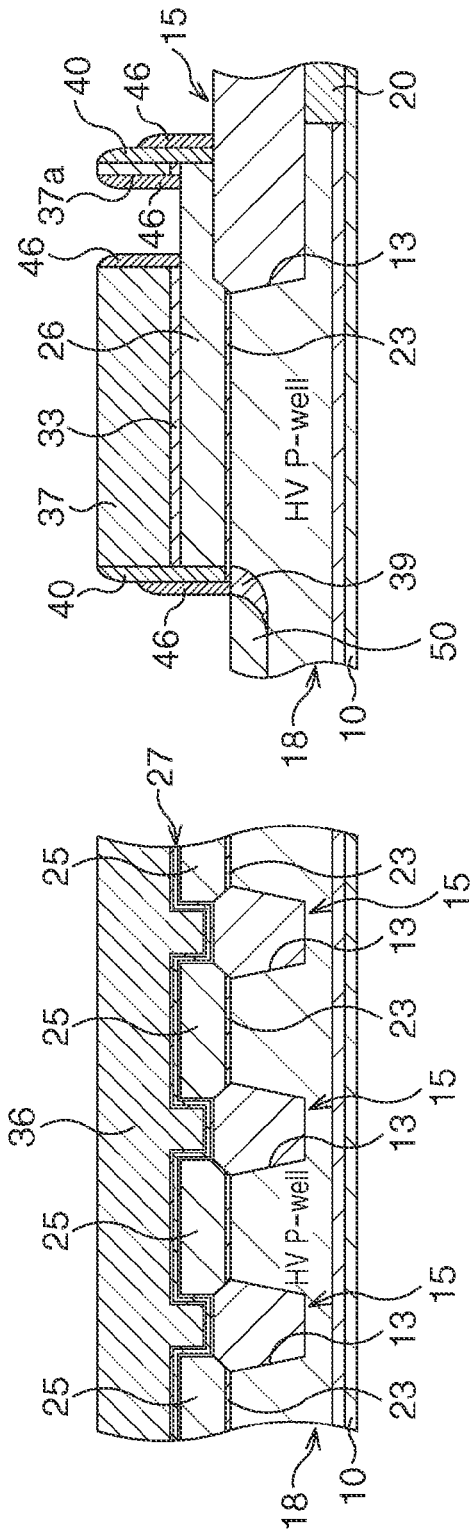
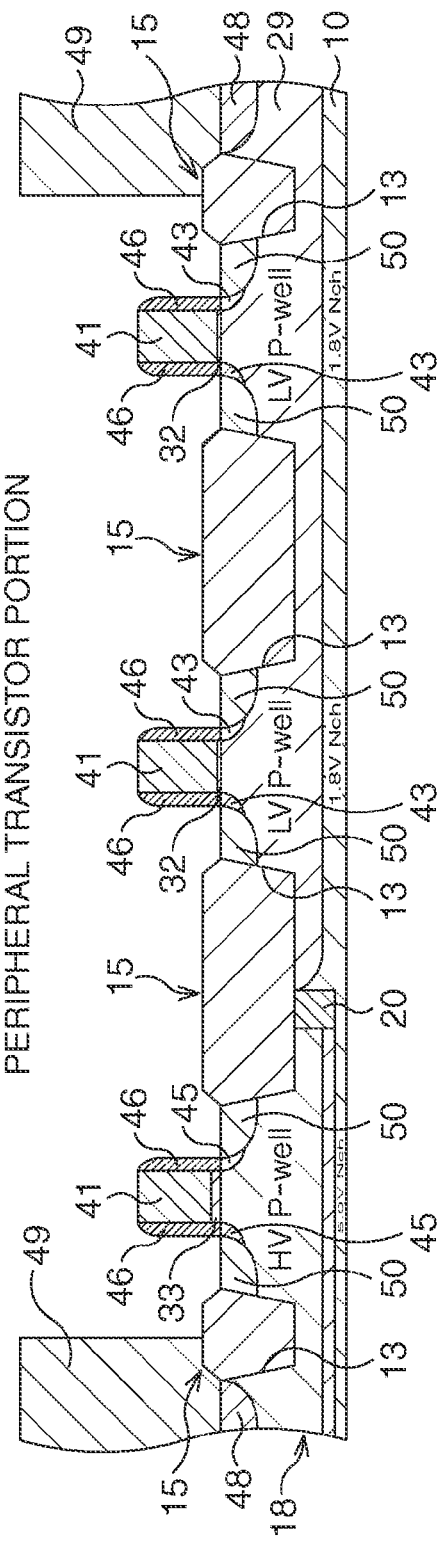

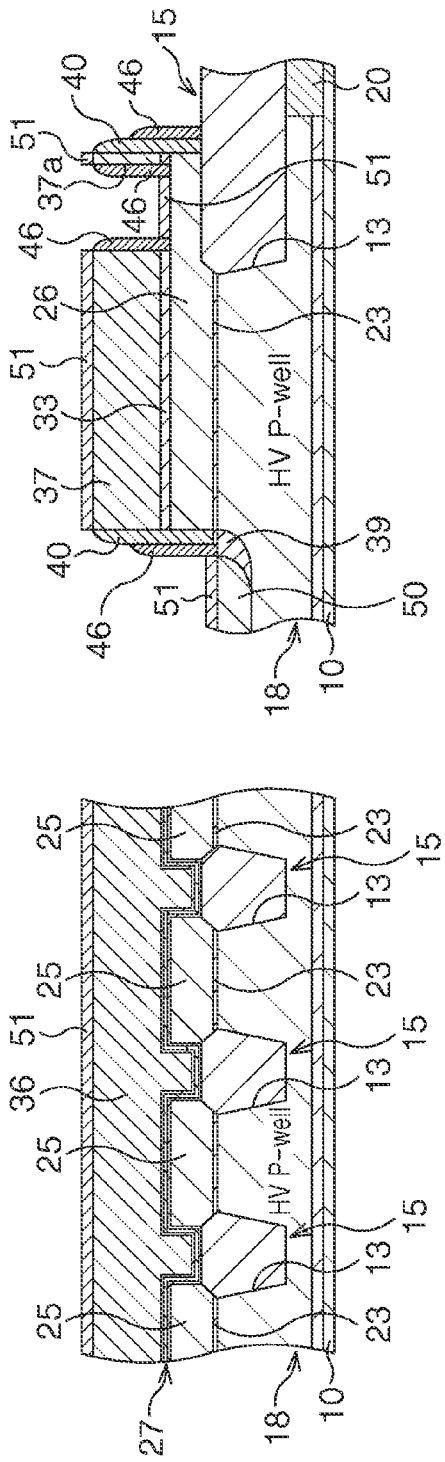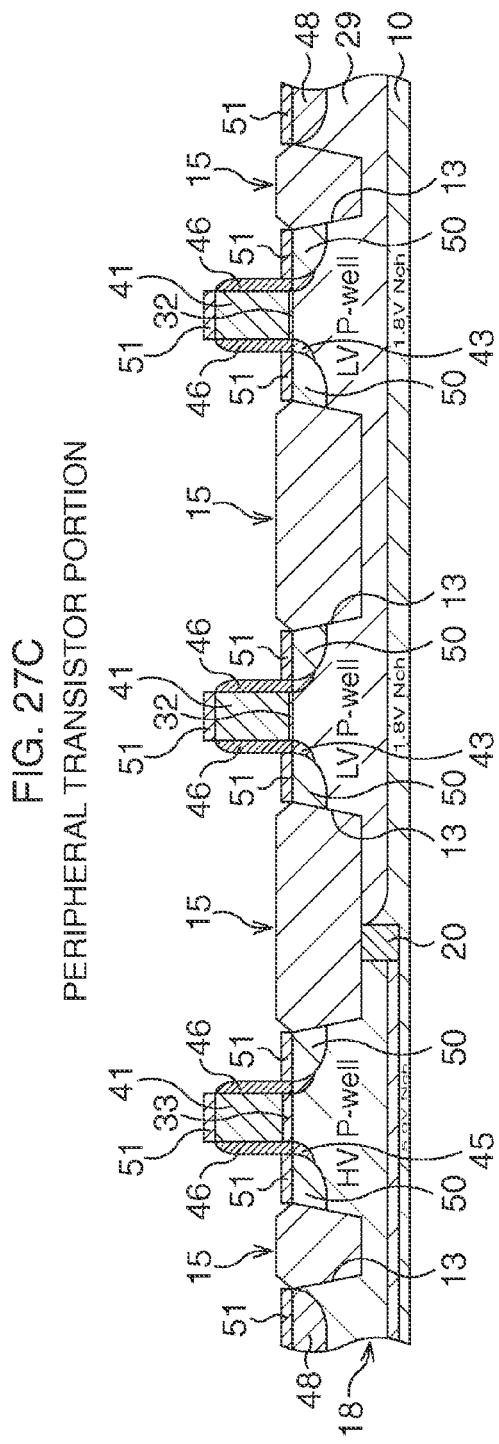

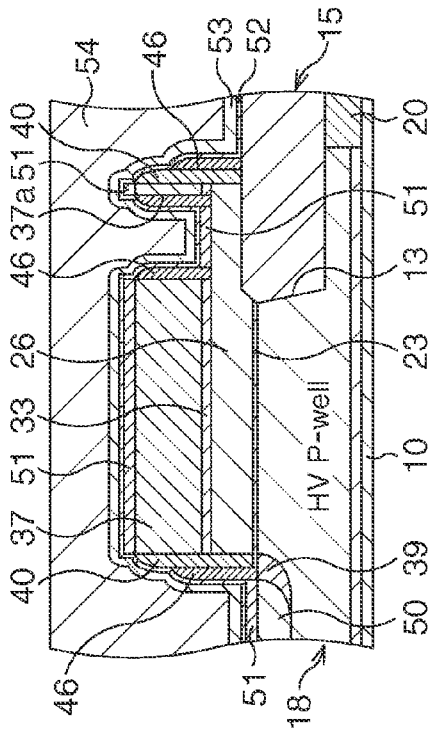
FIG. 28B  BYPASS CAPACITOR PORTION
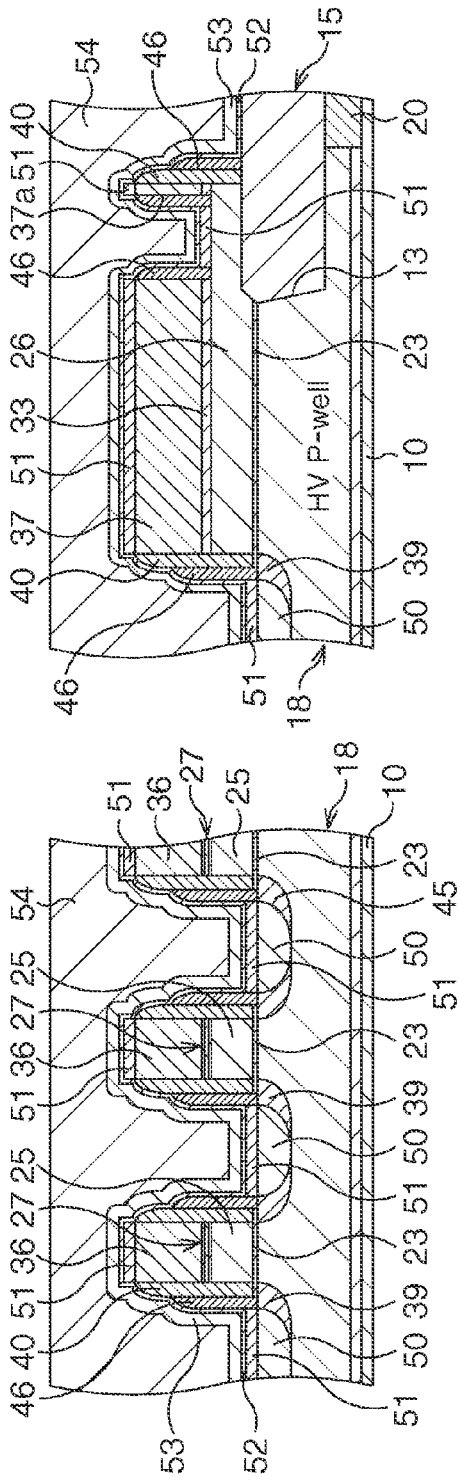
FIG. 28A  STORAGE ELEMENT PORTION
(GATE VERTICAL DIRECTION)
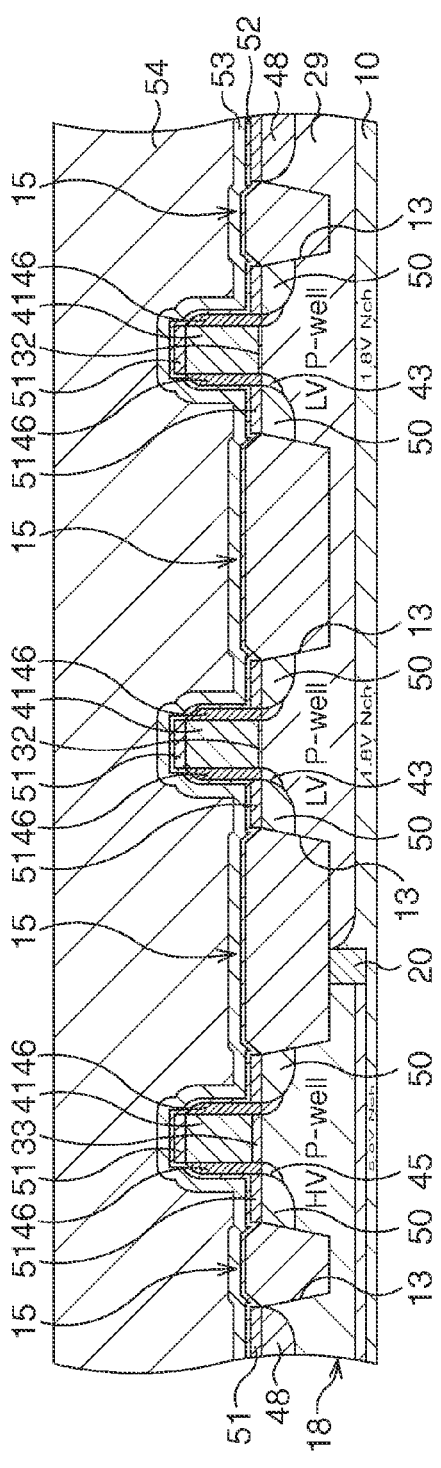
FIG. 28C  PERIPHERAL TRANSISTOR PORTION

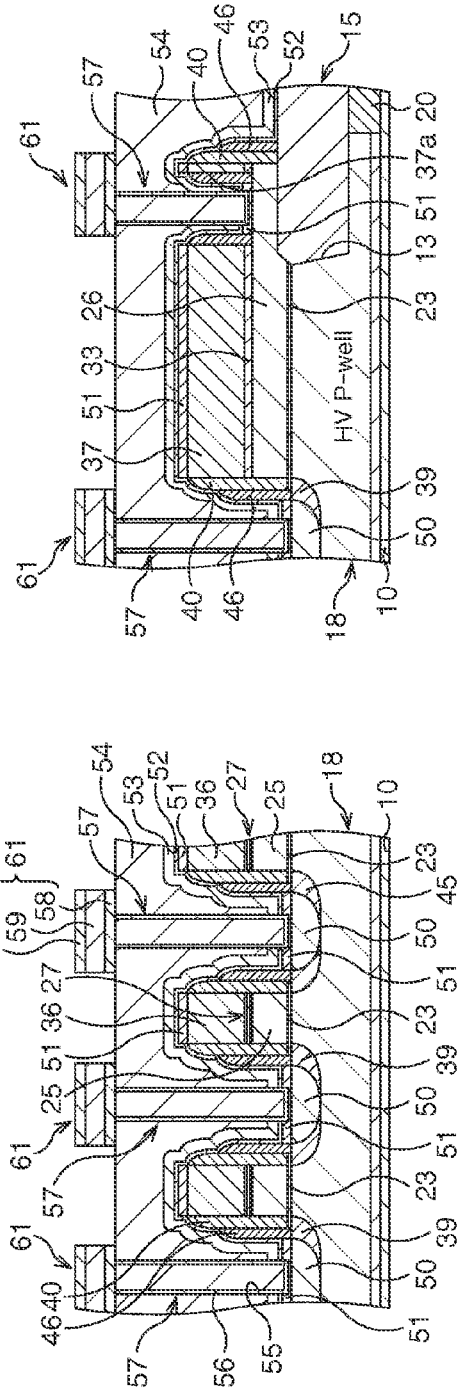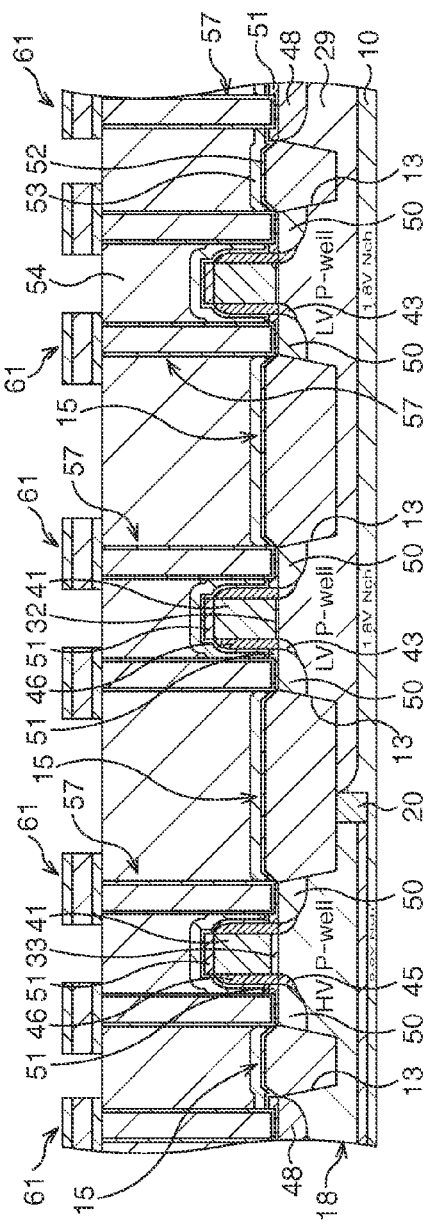

STORAGE ELEMENT PORTION

BYPASS CAPACITOR PORTION

PERIPHERAL TRANSISTOR PORTION

BYPASS CAPACITOR PORTION

STORAGE ELEMENT PORTION

PERIPHERAL TRANSISTOR PORTION

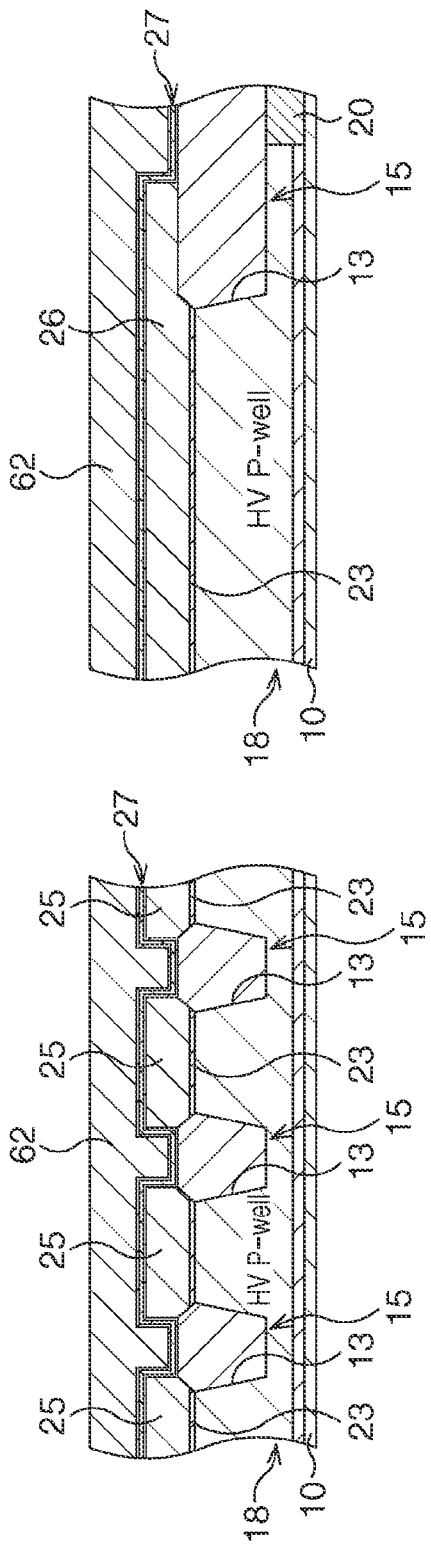
FIG. 32A
STORAGE ELEMENT PORTION
FIG. 32B
BYPASS CAPACITOR PORTION
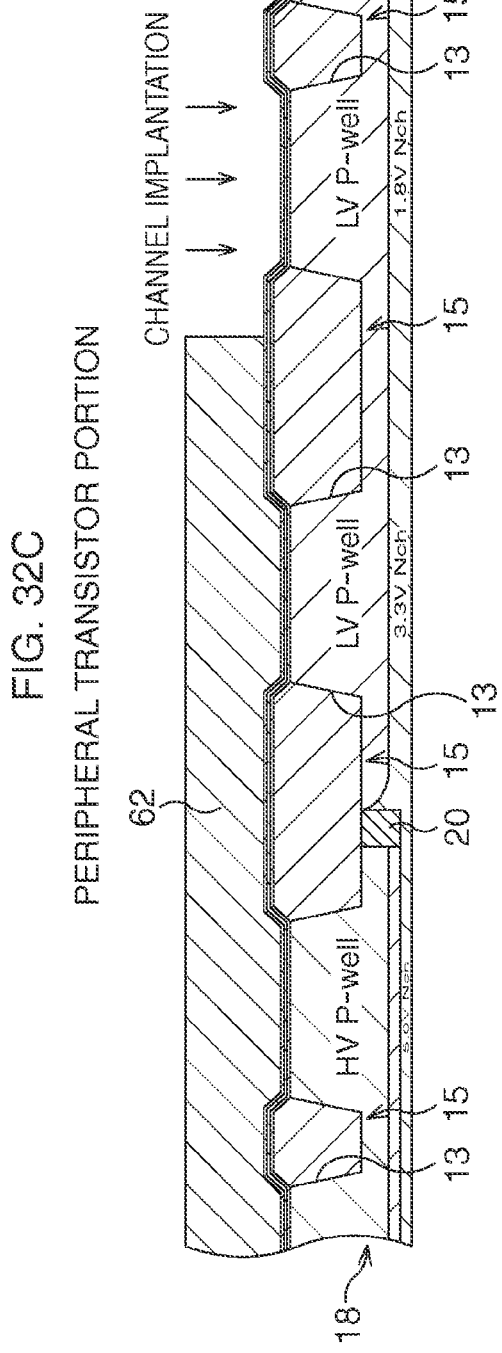
FIG. 32C
PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

BYPASS CAPACITOR PORTION

STORAGE ELEMENT PORTION

PERIPHERAL TRANSISTOR PORTION

STORAGE ELEMENT PORTION

BYPASS CAPACITOR PORTION

PERIPHERAL TRANSISTOR PORTION

BYPASS CAPACITOR PORTION

STORAGE ELEMENT PORTION

PERIPHERAL TRANSISTOR PORTION

STORAGE ELEMENT PORTION

BYPASS CAPACITOR PORTION

PERIPHERAL TRANSISTOR PORTION

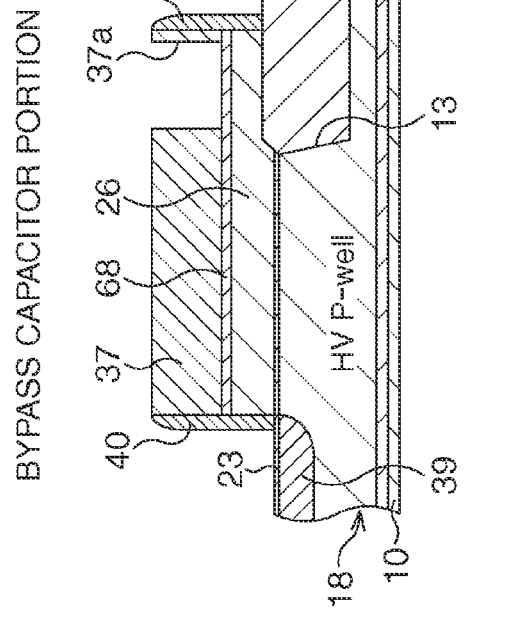
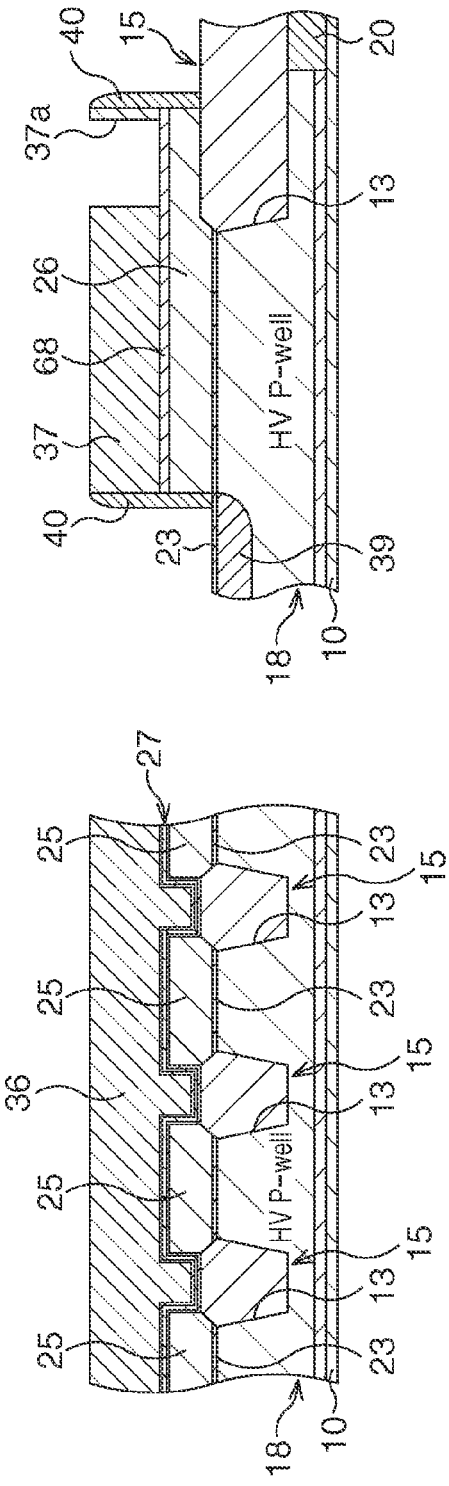
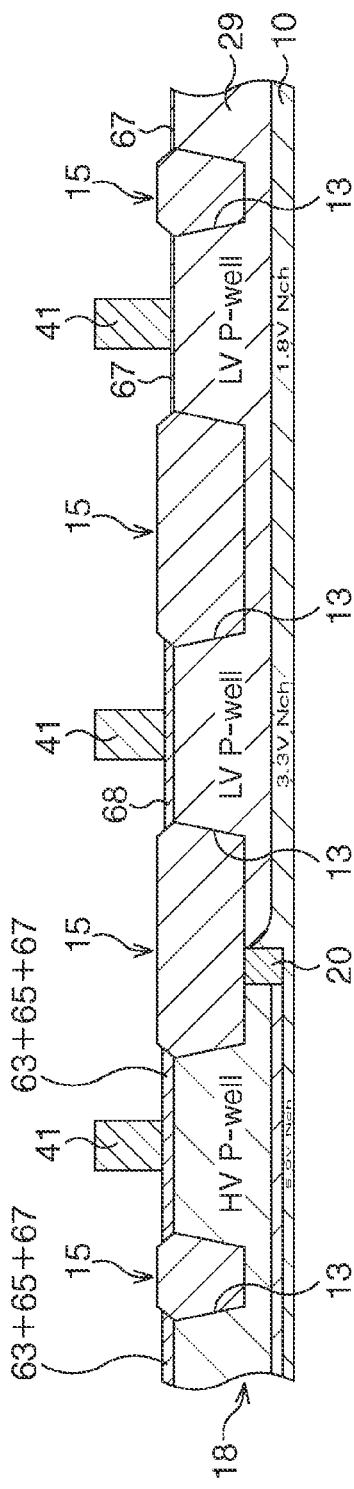

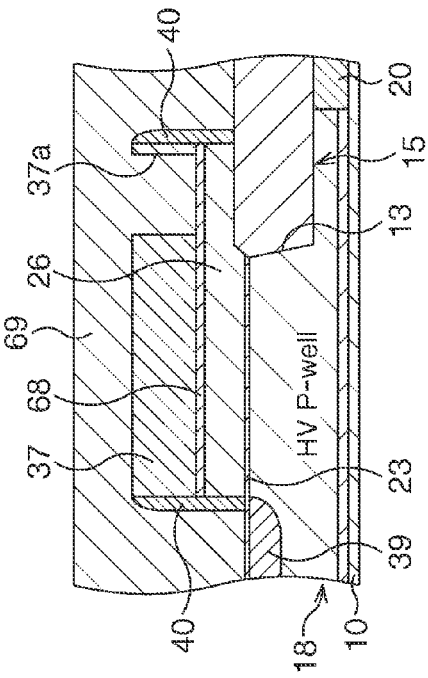
FIG. 40A  STORAGE ELEMENT PORTION
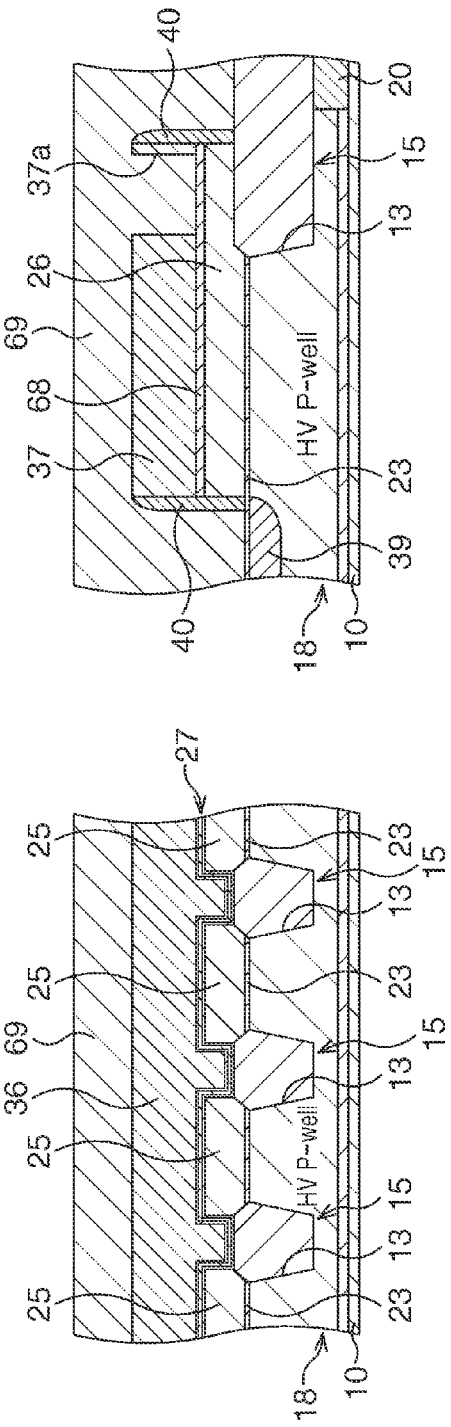
FIG. 40B  BYPASS CAPACITOR PORTION
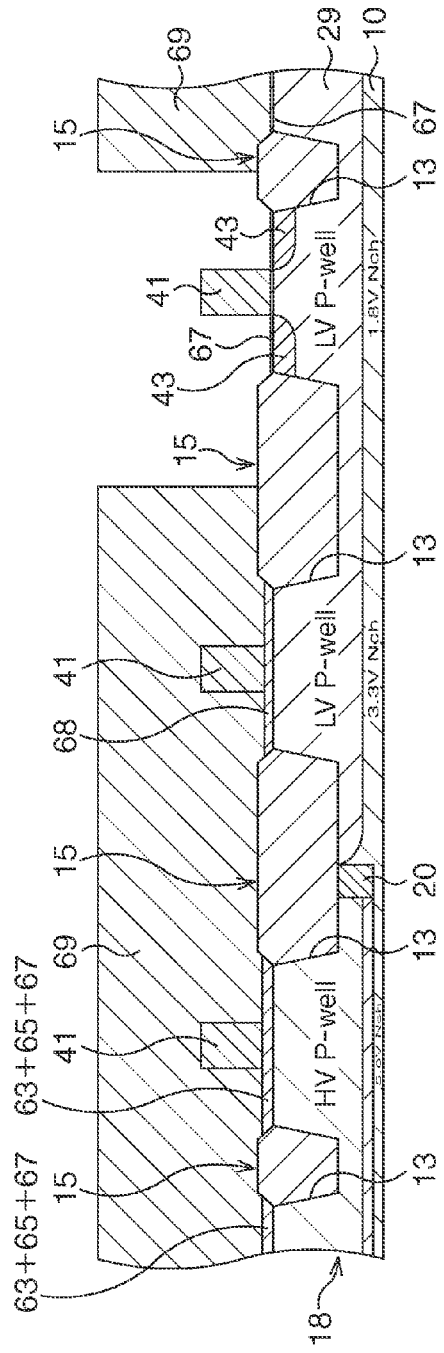
FIG. 40C  PERIPHERAL TRANSISTOR PORTION

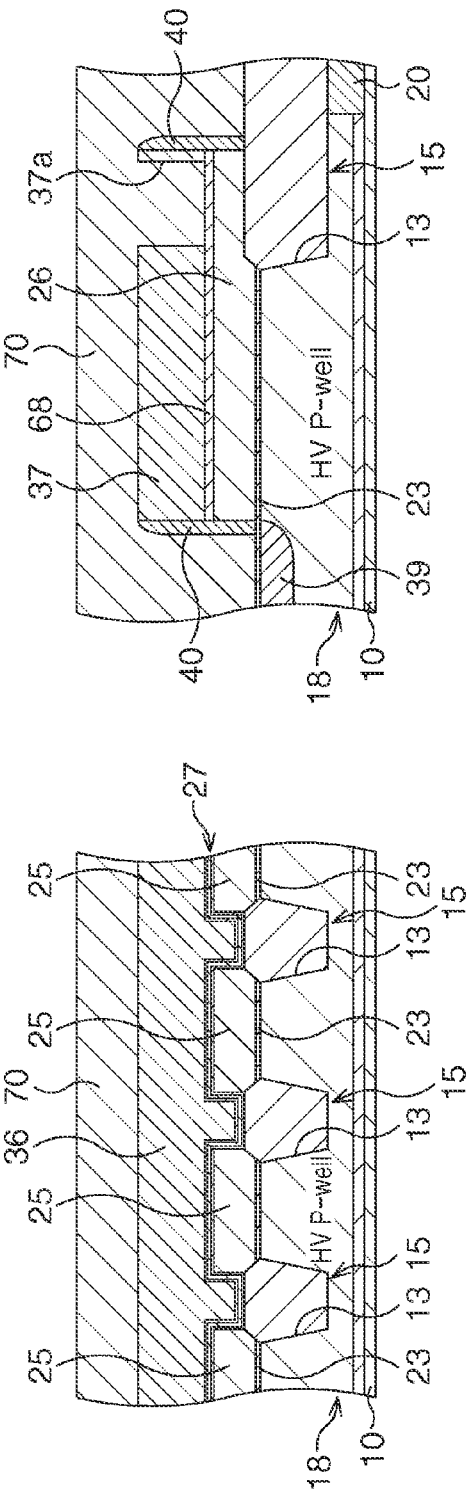
FIG. 41A STORAGE ELEMENT PORTION
FIG. 41B BYPASS CAPACITOR PORTION
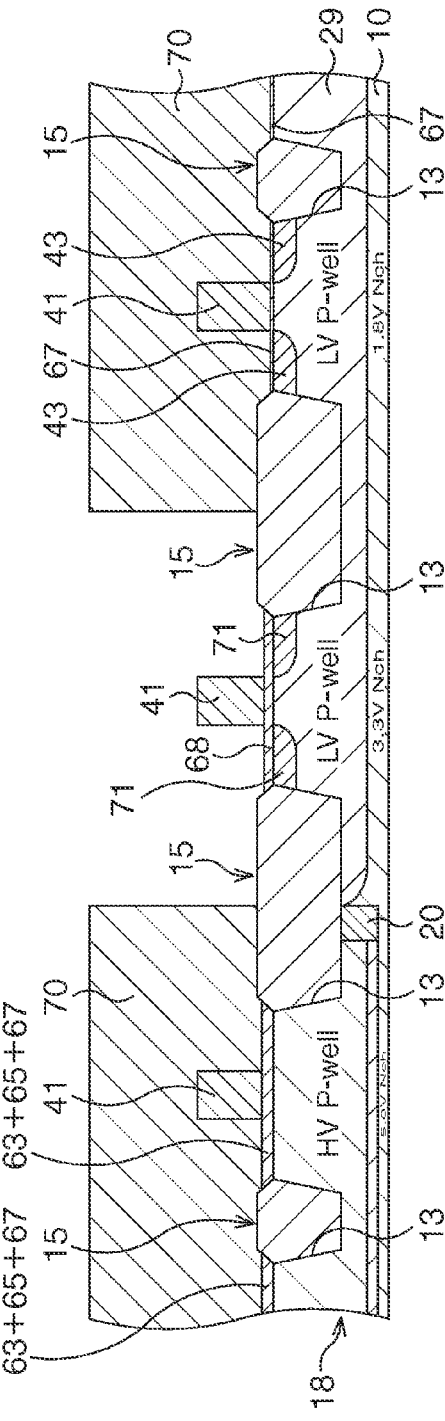
FIG. 41C PERIPHERAL TRANSISTOR PORTION

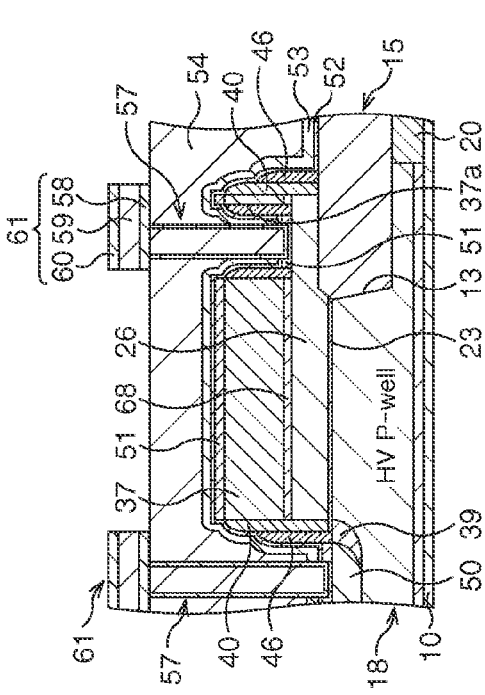
FIG. 42A STORAGE ELEMENT PORTION (GATE VERTICAL DIRECTION)
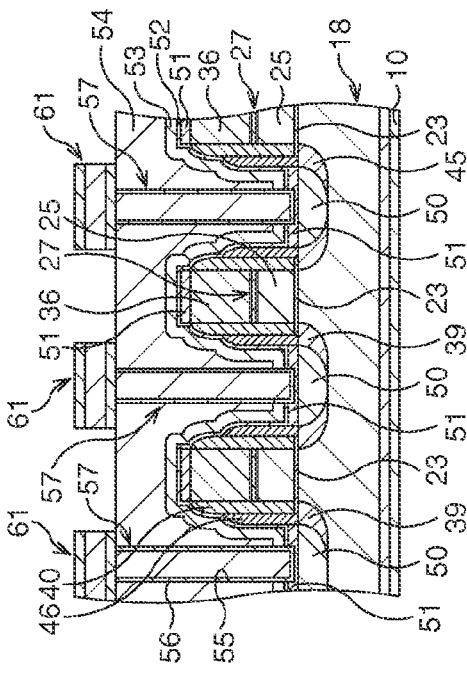
FIG. 42B BYPASS CAPACITOR PORTION
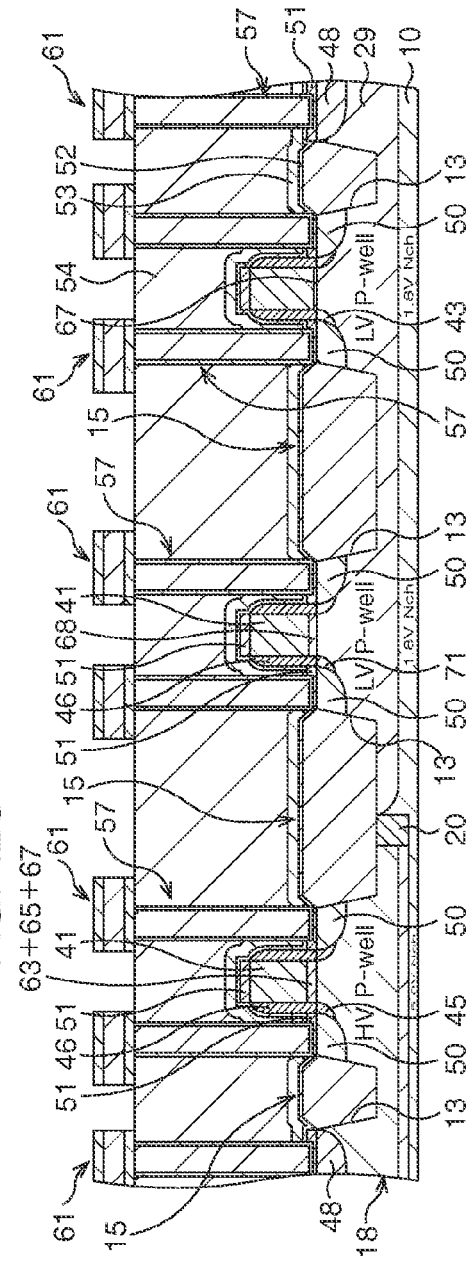
FIG. 42C PERIPHERAL TRANSISTOR PORTION

STORAGE ELEMENT PORTION

BYPASS CAPACITOR PORTION

PERIPHERAL TRANSISTOR PORTION

STORAGE ELEMENT PORTION

BYPASS CAPACITOR PORTION

PERIPHERAL TRANSISTOR PORTION

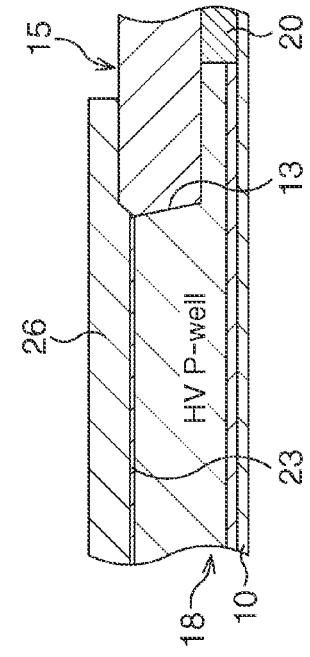
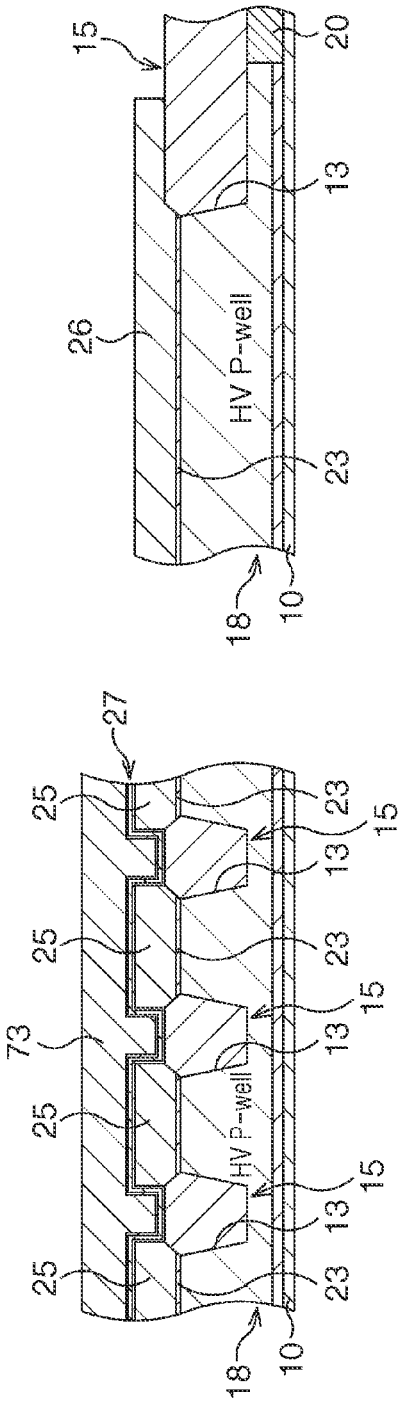
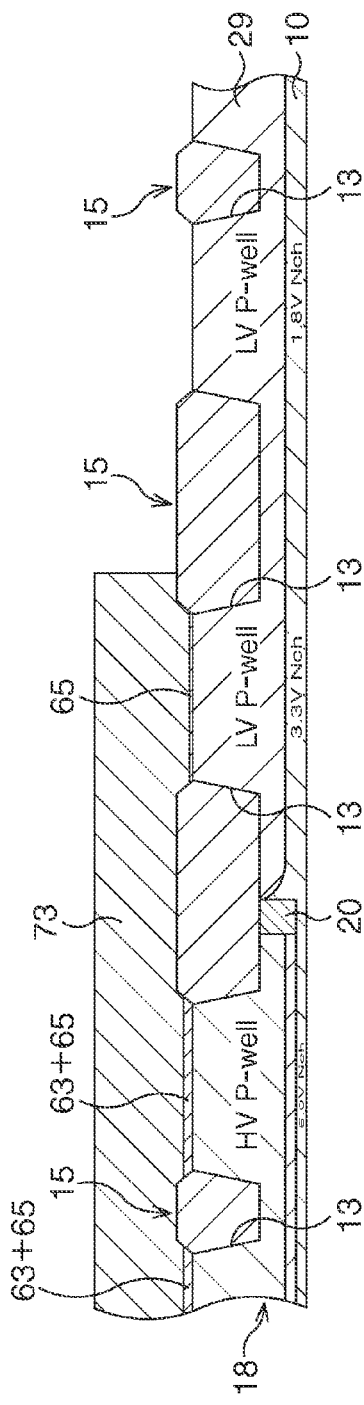

BYPASS CAPACITOR PORTION

STORAGE ELEMENT PORTION

PERIPHERAL TRANSISTOR PORTION

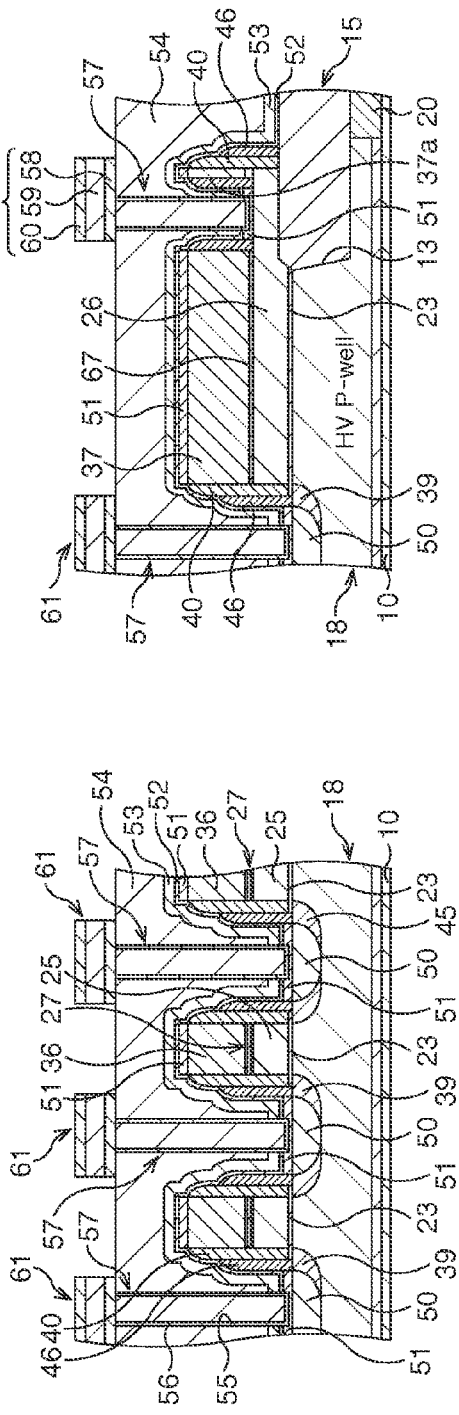
FIG. 47A STORAGE ELEMENT PORTION (GATE VERTICAL DIRECTION)
FIG. 47B BYPASS CAPACITOR PORTION
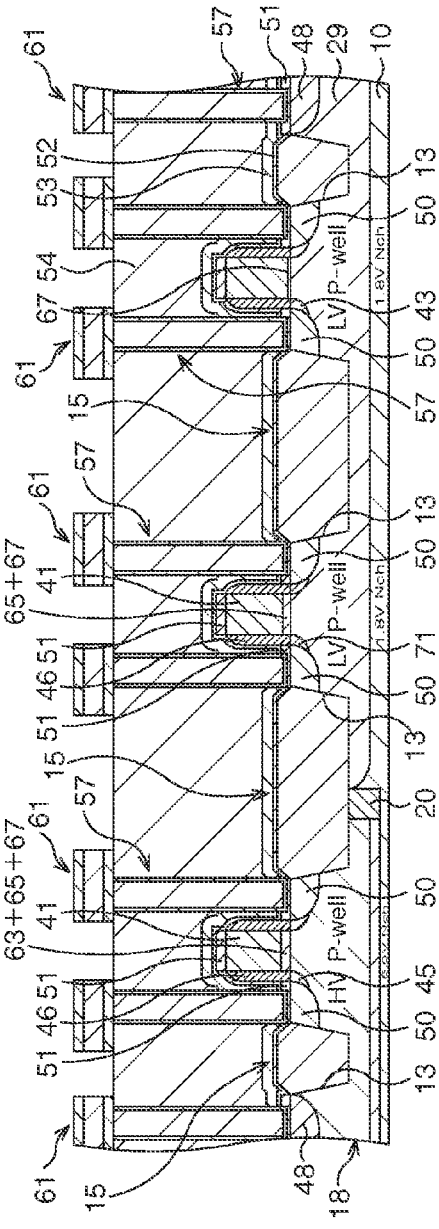
FIG. 47C PERIPHERAL TRANSISTOR PORTION

SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2010-217026, filed on Sep. 28, 2010, the entire contents of which are incorporated herein by reference.

FIELD

The present embodiment relates to a semiconductor device formed in a manner that a nonvolatile storage element and transistors are mounted thereon, and a manufacturing method thereof.

BACKGROUND

In a semiconductor device represented as an LSI, a bypass capacitor is provided in many cases as a noise suppression measure. The bypass capacitor is a capacitor to be interposed between a power supply line ($V_{cc}$ line) and a ground (GND) in order to prevent a direct-current power supply voltage from changing when the semiconductor device operates. Providing the bypass capacitor makes it possible to reduce an alternating impedance of the power supply line to the ground and to filter a noise component so that it is not carried to a succeeding electronic circuit.

[Patent Document 1] Japanese Laid-open Patent Publication No. 5-21808

[Patent Document 2] Japanese Laid-open Patent Publication No. 2000-150789

[Patent Document 3] Japanese Laid-open Patent Publication No. 2002-16230

With a recent request for further miniaturization of a semiconductor device, miniaturization of a bypass capacitor, namely reduction in occupied area of the bypass capacitor is also requested. In order to obtain a desired capacitance with a small occupied area in a bypass capacitor, it is necessary to increase its capacitance density.

In the case when a bypass capacitor is provided in a semiconductor device, in order to reduce the number of manufacturing processes, it is preferable to use manufacturing processes of a functional element and the like of the semiconductor device and to form the bypass capacitor in the same processes with components of the functional element. For example, in a nonvolatile semiconductor memory such as a flash memory, in which stored information is not lost even if power is cut off, it is thought to use a stacked-type storage element having a capacitor insulating film sandwiched by upper and lower gates to thereby form a stacked-type bypass capacitor having the capacitor insulating film sandwiched by upper and lower electrodes. However, the capacitor insulating film of the storage element easily captures charge due to its property, and is inferior to dielectric breakdown resistance as the capacitor insulating film of the bypass capacitor, and causes a concern in terms of reliability, so that it is unsuitable.

SUMMARY

One aspect of a semiconductor device includes: a storage element including: a first gate formed in an island shape above a semiconductor substrate via a first insulating film; and a second gate formed above the first gate via a second insulating film; a transistor including: a third gate formed above the semiconductor substrate via a third insulating film; and a capacitor element including: a first electrode formed above the semiconductor substrate via a fourth insulating film; and a second electrode formed above the first electrode via a fifth insulating film, in which in the capacitor element, the fourth insulating film is formed of a film the same as the first insulating film of the storage element, the first electrode is formed of a film the same as the first gate of the storage element, the fifth insulating film is formed of a film the same as the third insulating film of the transistor, and the second electrode is formed of a film the same as the second gate of the storage element respectively.

One aspect of a manufacturing method of a semiconductor device being a manufacturing method of a semiconductor device including: a storage element including: a first gate formed in an island shape in a first region of a semiconductor substrate via a first insulating film; and a second gate formed above the first gate via a second insulating film; a transistor including: a third gate formed in a second region of the semiconductor substrate via a third insulating film; and a capacitor element including: a first electrode formed in a third region of the semiconductor substrate via a fourth insulating film; and a second electrode formed above the first electrode via a fifth insulating film, the method includes:

forming a first film and forming the first insulating film made of the first film in the first region and forming the fourth insulating film made of the first film in the third region; forming a second film and forming the first gate made of the second film in the first region and forming the first electrode made of the second film in the third region; forming a third film and forming the second insulating film made of the third film in the first region; forming a fourth film and forming the third insulating film made of the fourth film in the second region and forming the fifth insulating film made of the fourth film on the first electrode in the third region; and forming a fifth film and forming the second gate made of the fifth film in the first region and forming the third gate made of the fifth film in the second region and forming the second electrode made of the fifth film in the third region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A to FIG. 2C are schematic cross-sectional views illustrating the manufacturing method of the nonvolatile semiconductor memory according to the first embodiment, subsequently to FIG. 1A to FIG. 1C;

FIG. 5A to FIG. 5C are schematic cross-sectional views illustrating the manufacturing method of the nonvolatile semiconductor memory according to the first embodiment, subsequently to FIG. 4A to FIG. 4C;

FIG. 22A to FIG. 22C are schematic cross-sectional views illustrating the manufacturing method of the nonvolatile semiconductor memory according to the first embodiment, subsequently to FIG. 21A to FIG. 21C;

FIG. 23A to FIG. 23C are schematic cross-sectional views illustrating the manufacturing method of the nonvolatile semiconductor memory according to the first embodiment, subsequently to FIG. 22A to FIG. 22C;

FIG. 24A to FIG. 24C are schematic cross-sectional views illustrating the manufacturing method of the nonvolatile semiconductor memory according to the first embodiment, subsequently to FIG. 23A to FIG. 23C;

FIG. 25A to FIG. 25C are schematic cross-sectional views illustrating the manufacturing method of the nonvolatile semiconductor memory according to the first embodiment, subsequently to FIG. 24A to FIG. 24C;

FIG. 26A to FIG. 26C are schematic cross-sectional views illustrating the manufacturing method of the nonvolatile semiconductor memory according to the first embodiment, subsequently to FIG. 25A to FIG. 25C;

FIG. 27A to FIG. 27C are schematic cross-sectional views illustrating the manufacturing method of the nonvolatile semiconductor memory according to the first embodiment, subsequently to FIG. 26A to FIG. 26C;

FIG. 28A to FIG. 28C are schematic cross-sectional views illustrating the manufacturing method of the nonvolatile semiconductor memory according to the first embodiment, subsequently to FIG. 27A to FIG. 27C;

FIG. 29A to FIG. 29C are schematic cross-sectional views illustrating the manufacturing method of the nonvolatile semiconductor memory according to the first embodiment, subsequently to FIG. 28A to FIG. 28C;

FIG. 32A to FIG. 32C are schematic cross-sectional views illustrating the manufacturing method of the nonvolatile semiconductor memory according to the second embodiment, subsequently to FIG. 31A to FIG. 31C;

FIG. 39A to FIG. 39C are schematic cross-sectional views illustrating the manufacturing method of the nonvolatile semiconductor memory according to the second embodiment, subsequently to FIG. 38A to FIG. 38C;

FIG. 40A to FIG. 40C are schematic cross-sectional views illustrating the manufacturing method of the nonvolatile semiconductor memory according to the second embodiment, subsequently to FIG. 39A to FIG. 39C;

FIG. 41A to FIG. 41C are schematic cross-sectional views illustrating the manufacturing method of the nonvolatile semiconductor memory according to the second embodiment, subsequently to FIG. 40A to FIG. 40C;

FIG. 42A to FIG. 42C are schematic cross-sectional views illustrating the manufacturing method of the nonvolatile semiconductor memory according to the second embodiment, subsequently to FIG. 41A to FIG. 41C;

FIG. 45A to FIG. 45C are schematic cross-sectional views illustrating the manufacturing method of the nonvolatile semiconductor memory according to the third embodiment, subsequently to FIG. 44A to FIG. 44C;

FIG. 47A to FIG. 47C are schematic cross-sectional views illustrating the manufacturing method of the nonvolatile semiconductor memory according to the third embodiment, subsequently to FIG. 46A to FIG. 46C.

DESCRIPTION OF EMBODIMENTS

Hereinafter, embodiments of a semiconductor device and a manufacturing method thereof are explained in detail with reference to the drawings. As the semiconductor device, a nonvolatile semiconductor memory provided with a peripheral circuit is indicated as an example, and its structure is described together with a manufacturing method thereof.

(First Embodiment)

FIG. 1A to FIG. 1C to FIG. 29A to FIG. 29C are schematic cross-sectional views illustrating a manufacturing method of a nonvolatile semiconductor memory according to a first embodiment in order of processes. In each of the drawings, A illustrates a formation region of a storage element, B illustrates a formation region of a bypass capacitor, and C illustrates a peripheral circuit region respectively. As for the formation region of the storage element, in FIG. 1A to FIG. 17A and FIG. 21A to FIG. 27A, the cross section of control gate electrodes taken along the longitudinal direction is illustrated, and in FIG. 18A to FIG. 20A, FIG. 28A, and FIG. 29A, the cross section of the control gate electrodes taken along the short-side direction is illustrated respectively.

In this embodiment, the case where in the peripheral circuit region, N-type and P-type transistors each having its gate voltage (power supply voltage: $V_{cc}$) of 1.8 V and N-type and P-type transistors each having its gate voltage of 5.0 V are formed is indicated as an example. For the convenience of illustration, the N-type transistors of 1.8 V and the N-type transistor of 5.0 V are only illustrated in each of the drawings, and "1.8 V Nch" and "5.0 V Nch" are added to active regions of the peripheral circuit region.

Figure 1A:
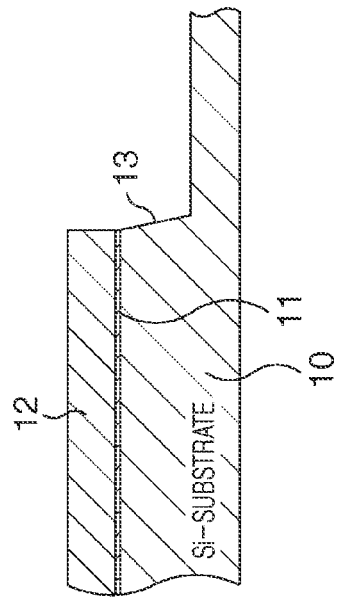
FIG. 1A to FIG. 1C are schematic cross-sectional views illustrating a manufacturing method of a nonvolatile semiconductor memory according to a first embodiment.
Figure 1B:
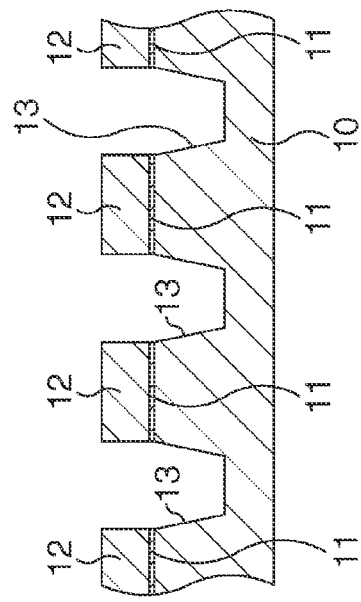
Figure 1C:
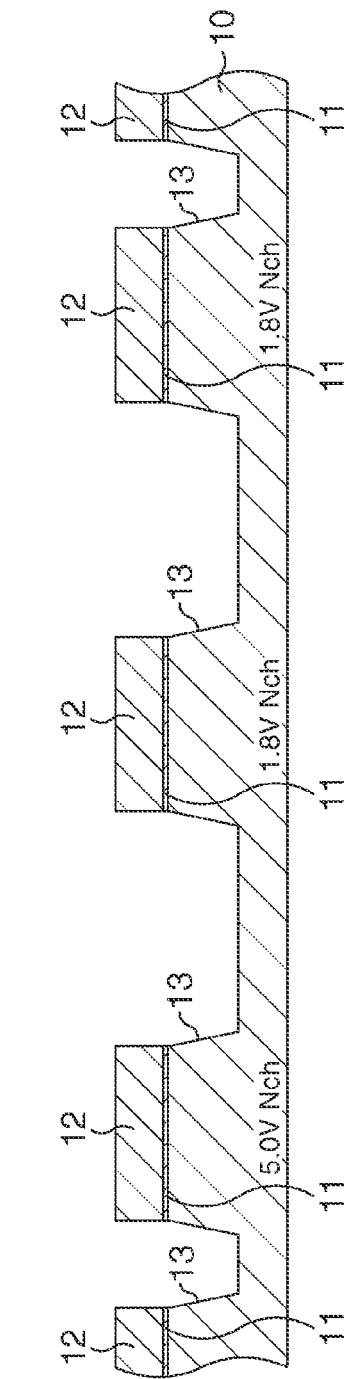

In this embodiment, as an element isolation method, an STI (Shallow Trench Isolation) method is used. First, as illustrated in FIG. 1A to FIG. 1C, element isolation trenches 13 for forming element isolation structures therein are formed in the respective formation regions on a semiconductor substrate 10.

Specifically, an entire surface of, for example, the P-type (P⁻) silicon semiconductor substrate 10 is thermally oxidized to form a silicon oxide film 11 thereon, and then a silicon nitride film 12 is formed on the entire surface by a CVD method or the like to have a film thickness of 148 nm or so. By lithography and dry etching, the silicon nitride film 12, the silicon oxide film 11, and the semiconductor substrate 10 are processed. Thereby, in the formation region of the storage element, the formation region of the bypass capacitor, and the peripheral circuit region, the element isolation trenches 13 each having a depth of 350 nm or so are formed in element isolation regions of the semiconductor substrate 10 respectively.

Subsequently, as illustrated in FIG. 2A to FIG. 2C, an insulating film 14 is deposited.

Specifically, the insulating film 14 is formed on the silicon nitride film 12 so as to be filled in the element isolation trenches 13. As the insulating film 14, a silicon oxide film is deposited by, for example, a high density plasma (High Density Plasma: HDP) CVD method.

Figure 3A:
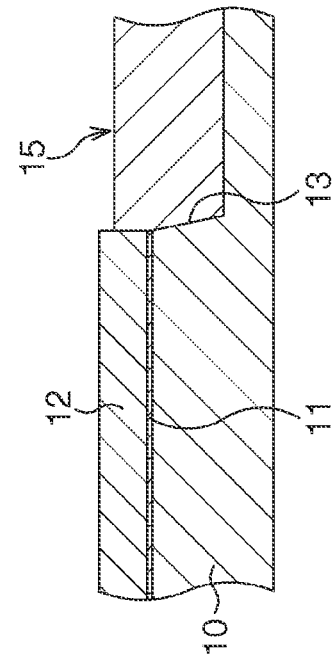
FIG. 3A to FIG. 3C are schematic cross-sectional views illustrating the manufacturing method of the nonvolatile semiconductor memory according to the first embodiment, subsequently to FIG. 2A to FIG. 2C.
Figure 3B:
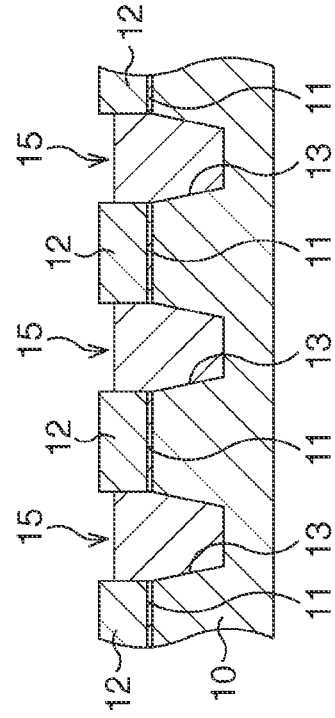
Figure 3C:
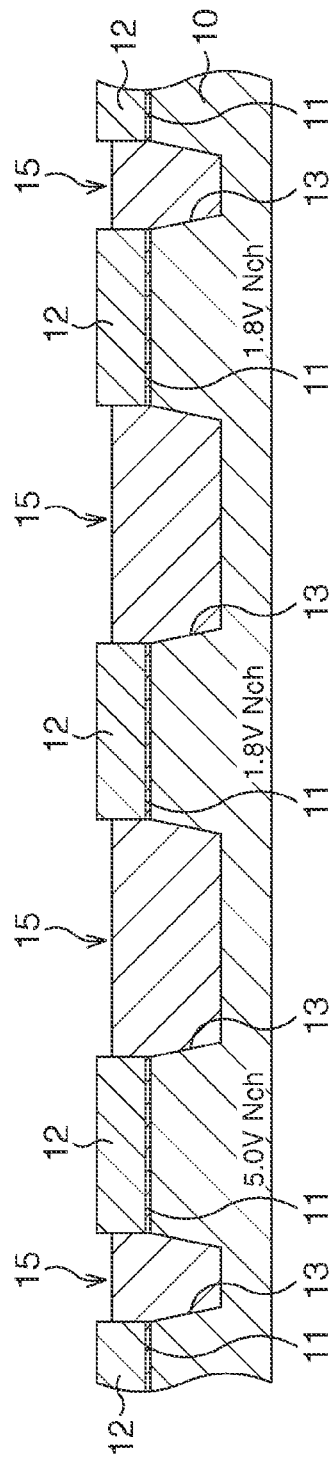

Subsequently, as illustrated in FIG. 3A to FIG. 3C, element isolation structures 15 are formed.

Specifically, by using the silicon nitride film 12 as a polishing stopper, the insulating film 14 is polished to have a surface thereof smoothed by a chemical mechanical polishing (Chemical Mechanical Polishing: CMP) method. Thereby, the element isolation structures 15 formed in a manner that the element isolation trenches 13 are filled with an insulator of the insulating film 14 are formed. By the element isolation structures 15, the active regions are demarcated on the semiconductor substrate 10 in the formation region of the storage element, the formation region of the bypass capacitor, and the peripheral circuit region respectively.

Figure 4A:
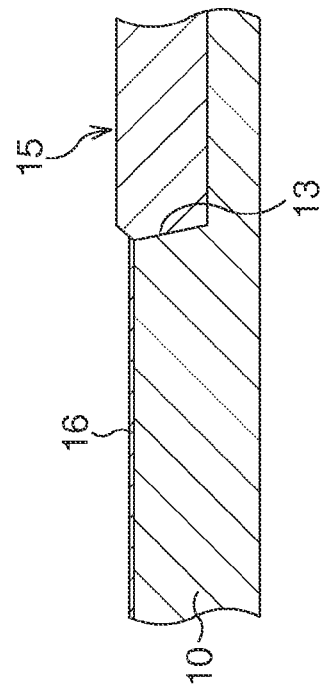
FIG. 4A to FIG. 4C are schematic cross-sectional views illustrating the manufacturing method of the nonvolatile semiconductor memory according to the first embodiment, subsequently to FIG. 3A to FIG. 3C.
Figure 4B:
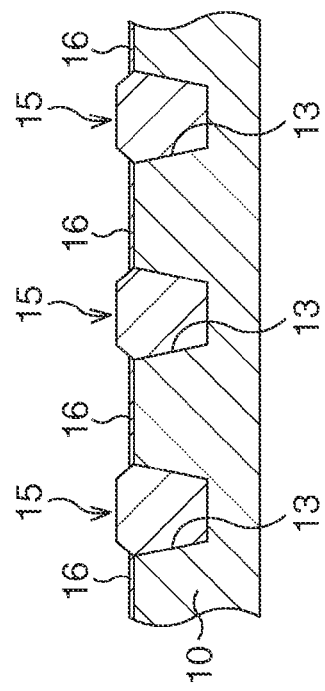
Figure 4C:
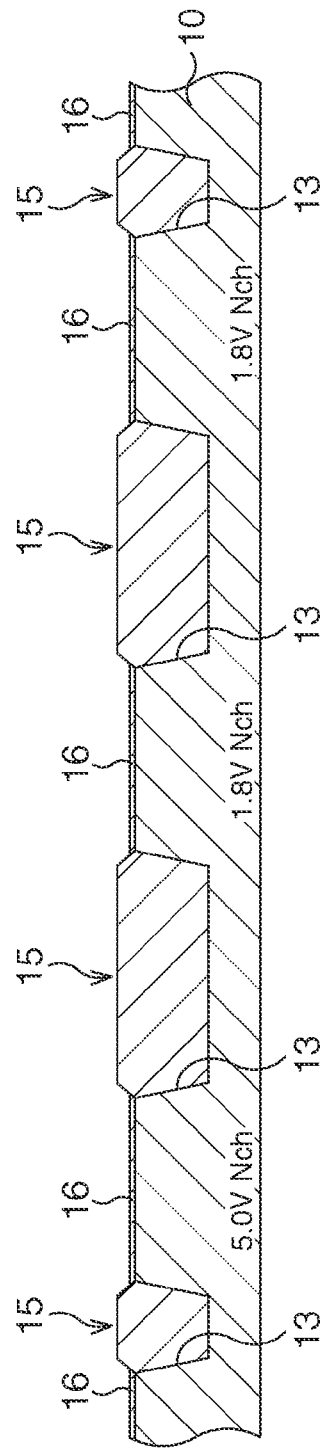

Subsequently, as illustrated in FIG. 4A to FIG. 4C, sacrificial oxide films 16 are formed.

Specifically, the silicon nitride film 12 is removed by wet etching, and then the respective active regions of the semiconductor substrate 10 are thermally oxidized. Thereby, the sacrificial oxide film 16 is formed on the respective active regions of the semiconductor substrate 10 to have a film thickness of 10 nm or so.

Subsequently, as illustrated in FIG. 5A to FIG. 5C, triple-wells 18 are formed.

Specifically, a resist is coated on the entire surface of the semiconductor substrate 10, and then the resist is processed by lithography. Thereby, a resist mask 17 having openings that expose the respective active regions of the formation region of the storage element, the formation region of the bypass capacitor, and the N-type transistor of 5 V in the peripheral circuit region is formed.

With the resist mask 17, a P-type impurity, which is, for example, boron (B⁺), is ion implanted into the respective exposed active regions under conditions of a dose amount of $2.0 \times 10^{13}/cm^2$ and acceleration energy of 420 keV. Thereby, a P-type well 18a is formed in the respective active regions exposed from the resist mask 17.

With the resist mask 17, an N-type impurity, which is, for example, phosphorus (P⁺), is ion implanted into the respective exposed active regions under conditions of a dose amount of $2.0 \times 10^{13}/cm^2$ and acceleration energy of 2 MeV. Thereby, N-type wells 18b are formed at a position under the P-type wells 18a. As above, the triple-wells 18 each having the P-type well 18a and the N-type well 18b are formed in a surface layer of the P-type semiconductor substrate 10.

Figure 6B:
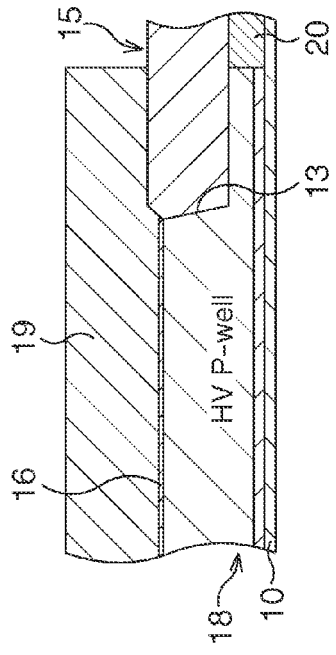
FIG. 6A to FIG. 6C are schematic cross-sectional views illustrating the manufacturing method of the nonvolatile semiconductor memory according to the first embodiment, subsequently to FIG. 5A to FIG. 5C.
Figure 6A:
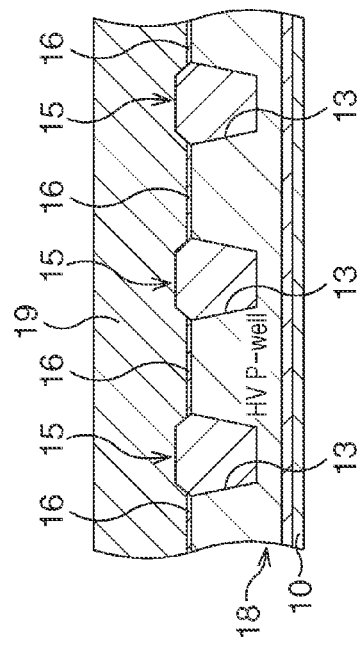
Figure 6C:
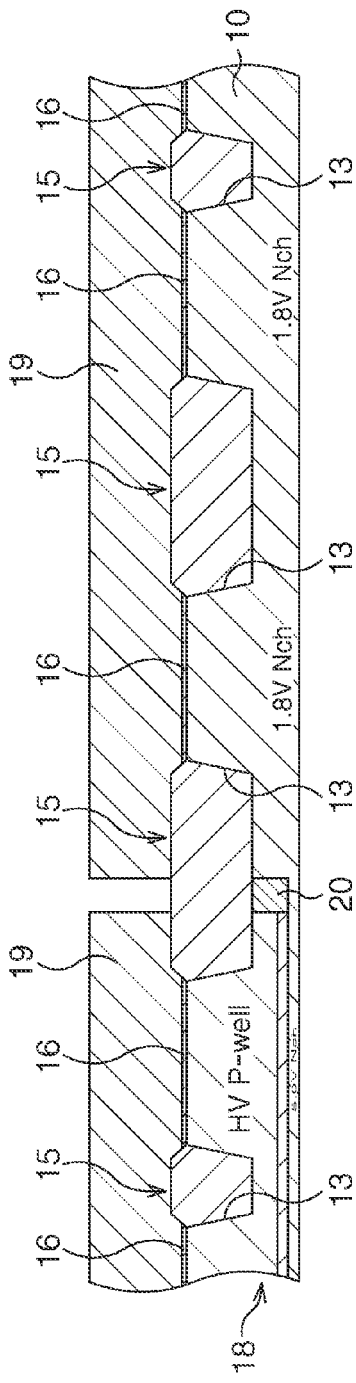

Subsequently, as illustrated in FIG. 6A to FIG. 6C, N-type wells 20 are formed.

Specifically, the resist mask 17 is first removed by an ashing process or a wet process.

A resist is coated on the entire surface of the semiconductor substrate 10, and then the resist is processed by lithography. Thereby, a resist mask 19 having openings that expose a peripheral edge portion of the triple-well 18 under the element isolation structure 15 and the active region of the P-type transistor of 5 V in the peripheral circuit region is formed.

With the resist mask 19, an N-type impurity, which is, for example, phosphorus ($P^+$), is ion implanted into the respective exposed active regions under conditions of a dose amount of $4.2 \times 10^{12}/cm^2$ and acceleration energy of 600 keV. Thereby, the N-type well 20 is formed in the peripheral edge portion of the triple-well 18 under the element isolation structure 15. Simultaneously, the N-type well 20 is also formed in the active region of the P-type transistor of 5 in the peripheral circuit region.

Figure 7A:
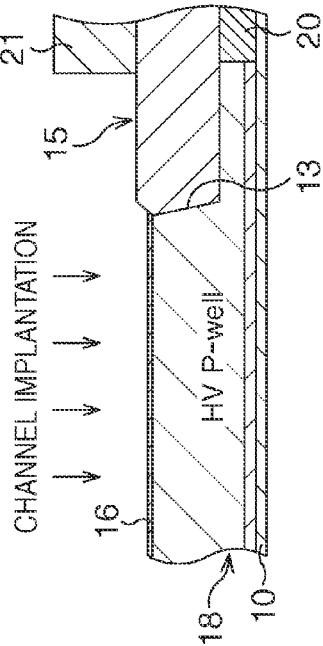
FIG. 7A to FIG. 7C are schematic cross-sectional views illustrating the manufacturing method of the nonvolatile semiconductor memory according to the first embodiment, subsequently to FIG. 6A to FIG. 6C.
Figure 7B:
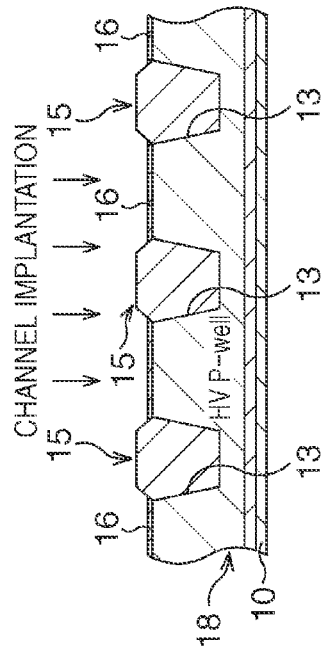
Figure 7C:
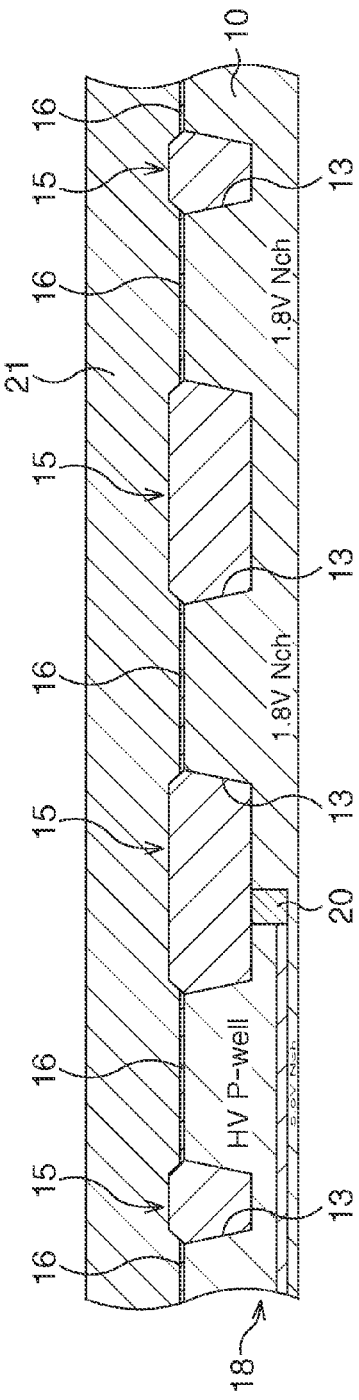

Subsequently, as illustrated in FIG. 7A to FIG. 7C, channel implantation is performed in the respective active regions of the formation region of the storage element and the formation region of the bypass capacitor.

Specifically, the resist mask 19 is first removed by an ashing process or a wet process.

A resist is coated on the entire surface of the semiconductor substrate 10, and then the resist is processed by lithography. Thereby, a resist mask 21 having an opening that exposes the formation region of the storage element and the formation region of the bypass capacitor is formed. The resist mask 21 is also formed on the element isolation structure 15 positioned above the N-type well 20 in the formation region of the bypass capacitor.

With the resist mask 21, channel implantation is performed in the respective exposed active regions. Here, a P-type impurity, which is, for example, boron ($B^+$), is ion implanted into the respective exposed active regions under conditions of a dose amount of $5.0 \times 10^{13}/cm^2$ and acceleration energy of 40 keV.

Figure 8A:
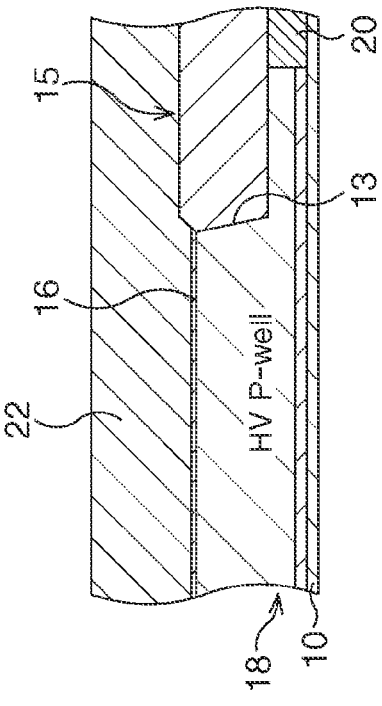
FIG. 8A to FIG. 8C are schematic cross-sectional views illustrating the manufacturing method of the nonvolatile semiconductor memory according to the first embodiment, subsequently to FIG. 7A to FIG. 7C.
Figure 8B:
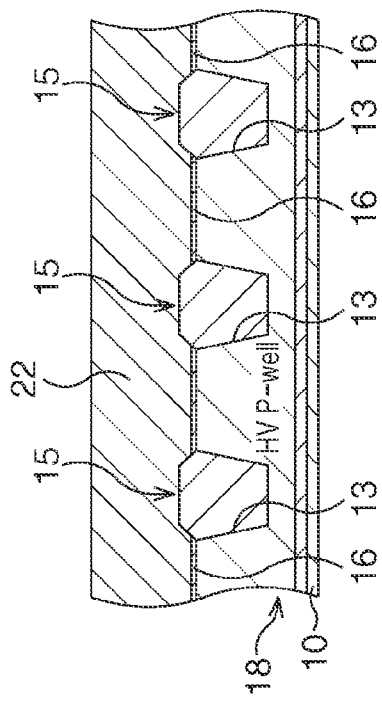
Figure 8C:
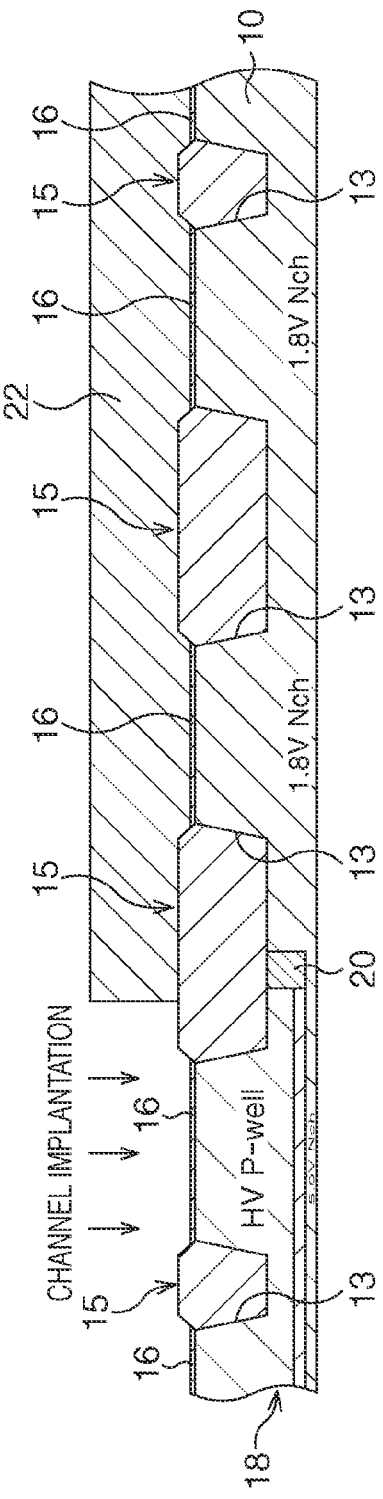

Subsequently, as illustrated in FIG. 8A to FIG. 8C, channel implantation is performed in the active region of the N-type transistor of 5 in the peripheral circuit region.

Specifically, the resist mask 21 is first removed by an ashing process or a wet process.

A resist is coated on the entire surface of the semiconductor substrate 10, and then the resist is processed by lithography. Thereby, a resist mask 22 having an opening that exposes the active region of the N-type transistor of 5 in the peripheral circuit region is formed.

With the resist mask 22, channel implantation is performed in the exposed active region. Here, a P-type impurity, which is, for example, boron ($B^+$), is ion implanted into the exposed active region under conditions of a dose amount of $6.6 \times 10^{12}/cm^2$ and acceleration energy of 15 keV.

Figure 9A:
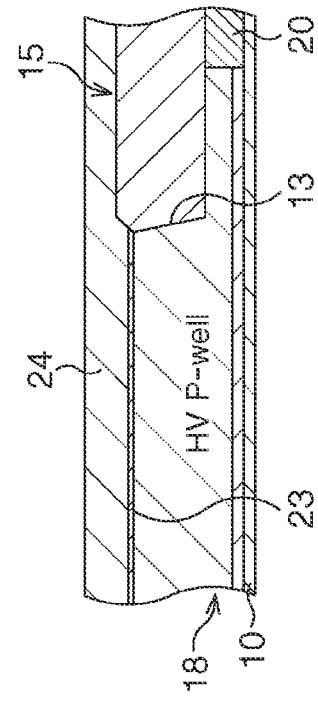
FIG. 9A to FIG. 9C are schematic cross-sectional views illustrating the manufacturing method of the nonvolatile semiconductor memory according to the first embodiment, subsequently to FIG. 8A to FIG. 8C.
Figure 9B:
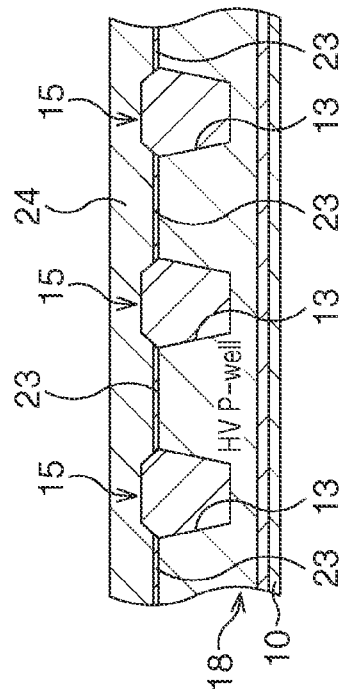
Figure 9C:
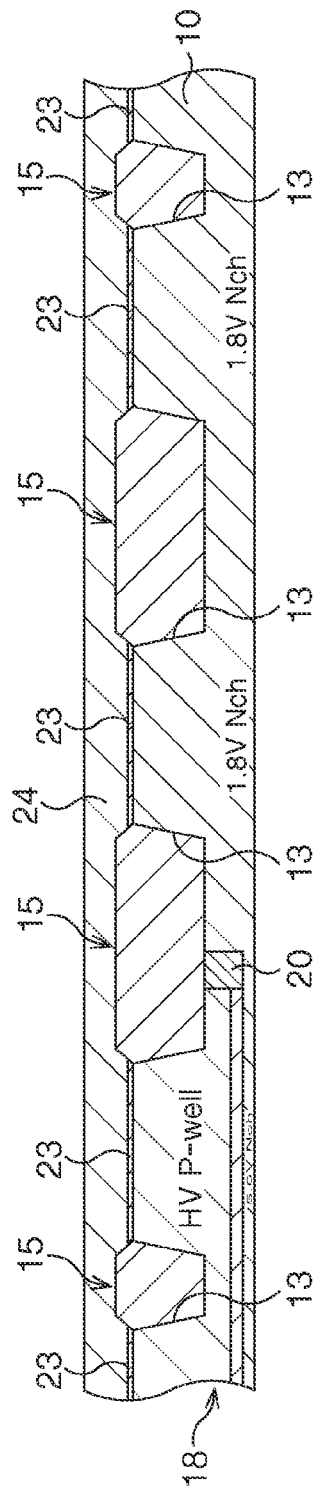

Subsequently, as illustrated in FIG. 9A to FIG. 9C, first insulating films 23 and a doped-amorphous silicon film 24 are formed.

Specifically, the resist mask 22 is first removed by an ashing process or a wet process.

The sacrificial oxide films 16 are removed by wet etching, and then the respective active regions of the formation region of the storage element, the formation region of the bypass capacitor, and the peripheral circuit region are thermally oxidized. Thereby, the first insulating film 23 is formed on the respective active regions to have a film thickness of 10.8 nm or so.

By a CVD method or the like, amorphous silicon in which an N-type impurity, which is, for example, phosphorus ($P^+$), is doped so as to have a concentration of the order of $10^{19}/cm^3$ is deposited on the entire surface of the semiconductor substrate 10 including the tops of the first insulating films 23. Thereby, the doped-amorphous silicon film 24 is formed on the first insulating films 23. The doped-amorphous silicon film 24 is crystallized by one of some heat treatment processes, (in which some of the descriptions are omitted), performed after a second insulating film being a second capacitor insulating film is formed.

Figure 10A:
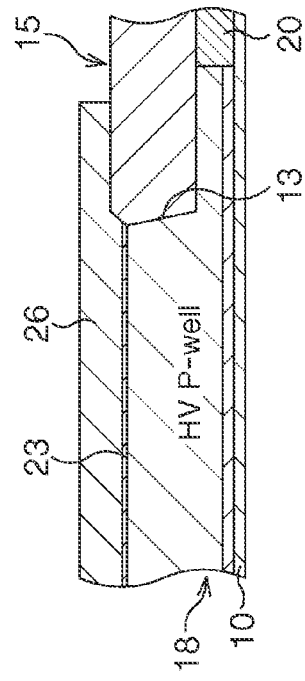
FIG. 10A to FIG. 10C are schematic cross-sectional views illustrating the manufacturing method of the nonvolatile semiconductor memory according to the first embodiment, subsequently to FIG. 9A to FIG. 9C.
Figure 10B:
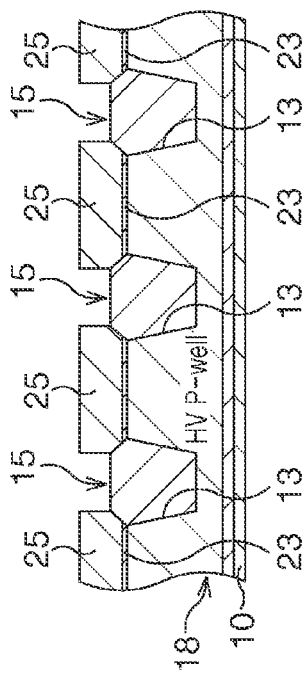
Figure 10C:
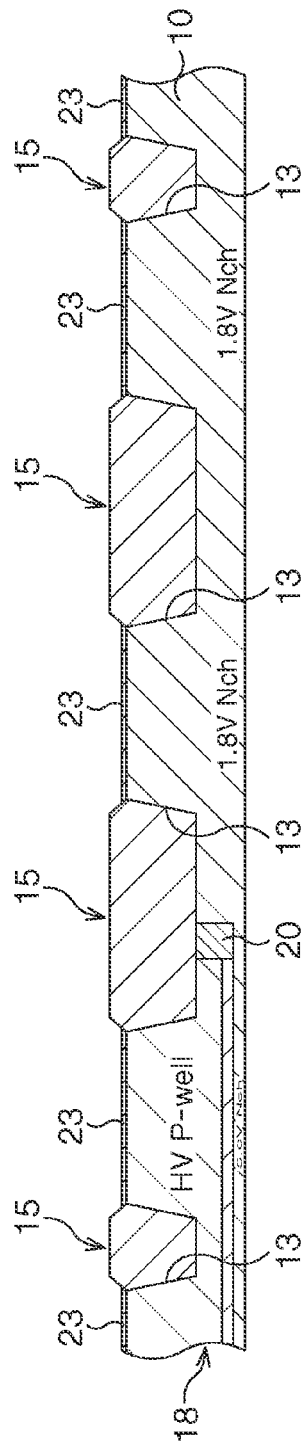

Subsequently, as illustrated in FIG. 10A to FIG. 10C, the doped-amorphous silicon film 24 is processed to form floating gate electrodes 25 of the storage element and a first electrode 26 of the bypass capacitor.

Specifically, the doped-amorphous silicon film 24 is processed by lithography and dry etching. That is, the doped-amorphous silicon film 24 is removed from the peripheral circuit region, and the amorphous silicon film 24 is left only in the formation region of the storage element and the formation region of the bypass capacitor to be predetermined island-shapes. Thereby, in the formation region of the storage element, the floating gate electrodes 25 via the first insulating film 23 to be a tunnel insulating film are formed over the semiconductor substrate 10. In the formation region of the bypass capacitor, the first electrode 26 of the bypass capacitor via the first insulating film 23 to be a first capacitor insulating film is formed over the semiconductor substrate 10.

In this embodiment, the first insulating film 23 becomes the tunnel insulating film of the storage element, and becomes the first capacitor insulating film of the bypass capacitor. Further, the doped-amorphous silicon film 24 turns to the floating gate electrodes 25 of the storage element, and turns to the first electrode (lower electrode) 26 of the bypass capacitor.

Figure 11A:
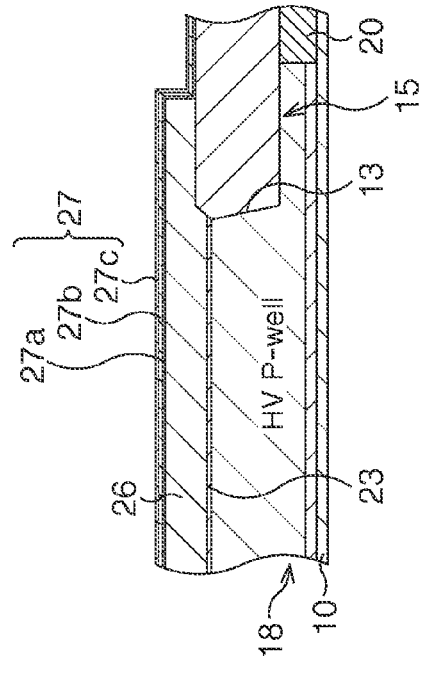
FIG. 11A to FIG. 11C are schematic cross-sectional views illustrating the manufacturing method of the nonvolatile semiconductor memory according to the first embodiment, subsequently to FIG. 10A to FIG. 10C.
Figure 11B:
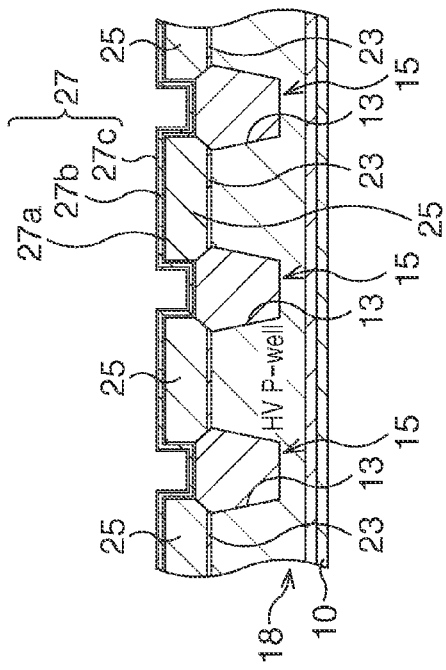
Figure 11C:
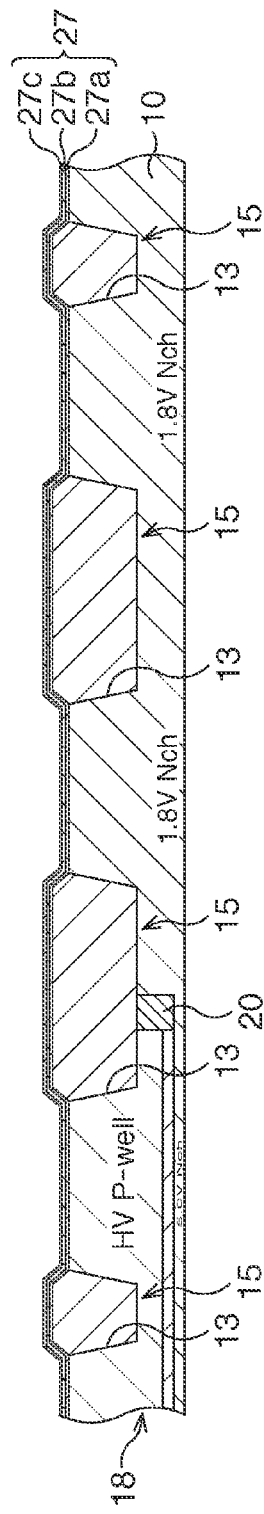

Subsequently, as illustrated in FIG. 11A to FIG. 11C, an ONO film 27 is formed.

Specifically, by a CVD method or the like, a silicon oxide film 27a and a silicon nitride film 27b are sequentially deposited on the entire surface of the semiconductor substrate 10 to have a film thickness of 6 nm or so and a film thickness of 8.5 nm or so. Then, a surface layer of the silicon nitride film 27b is thermally oxidized to form a silicon oxide film 27c. As above, the ONO film 27 formed in a manner that the silicon oxide film 27a, the silicon nitride film 27b, and the silicon oxide film 27c are stacked is formed.

Figure 12A:
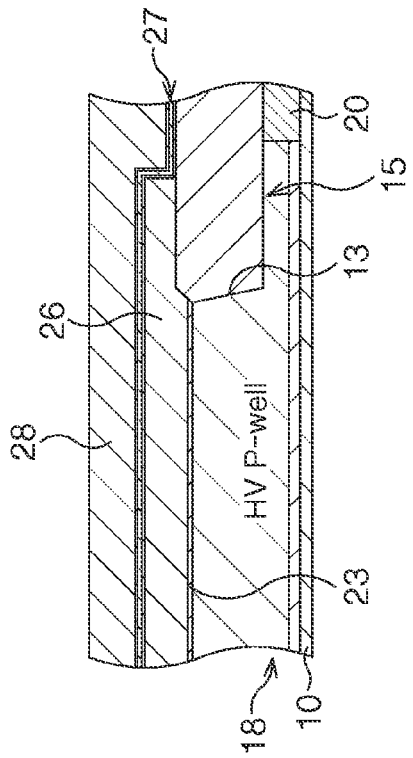
FIG. 12A to FIG. 12C are schematic cross-sectional views illustrating the manufacturing method of the nonvolatile semiconductor memory according to the first embodiment, subsequently to FIG. 11A to FIG. 11C.
Figure 12B:
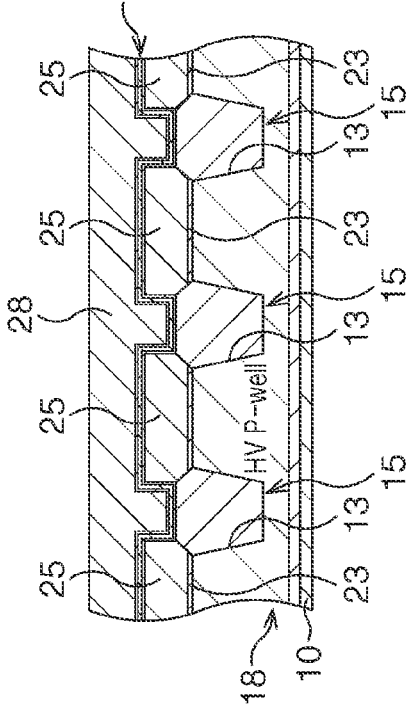
Figure 12C:
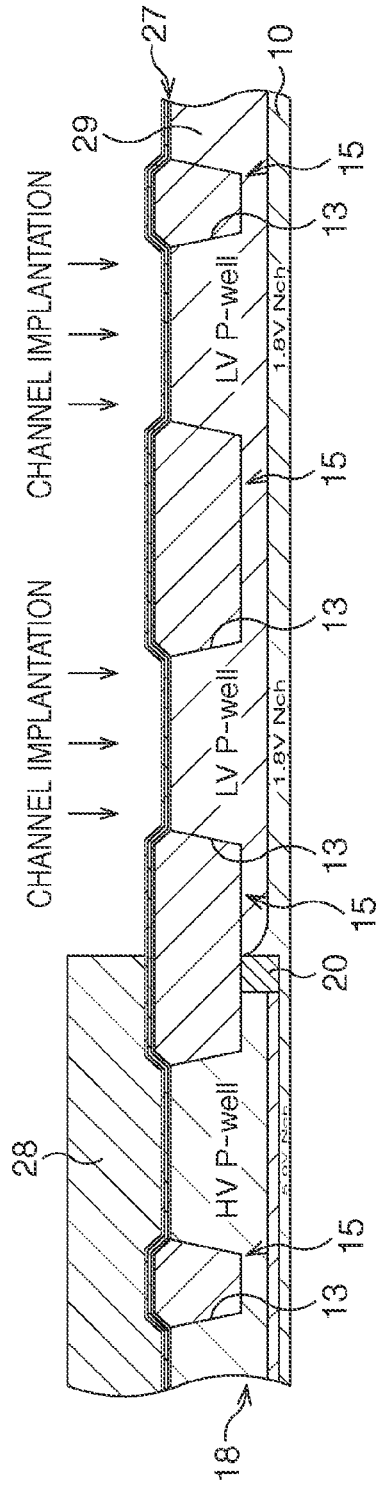

Subsequently, as illustrated in FIG. 12A to FIG. 12C, a P-type well 29 is formed in the active regions of the N-type transistors of 1.8 V in the peripheral circuit region and channel implantation is performed.

Specifically, a resist is first coated on the entire surface of the semiconductor substrate 10, and then the resist is processed by lithography. Thereby, a resist mask 28 having an opening that exposes the active regions of the N-type transistors of 1.8 V in the peripheral circuit region is formed.

With the resist mask 28, a P-type impurity, which is, for example, boron ($B^+$), is ion implanted into the exposed active regions under conditions of a dose amount of $3.0 \times 10^{13}/cm^2$ and acceleration energy of 230 keV. Thereby, the P-type well 29 is formed in the active regions exposed from the resist mask 28.

With the resist mask 28, channel implantation is performed in the exposed active regions. Here, a P-type impurity, which is, for example, boron ($B^+$), is ion implanted into the exposed active regions under conditions of a dose amount of $1.3×10^{13}/cm^2$ and acceleration energy of 32 keV.

The resist mask 28 is removed by an asking process or a wet process.

Subsequently, an N-type well is similarly formed in the active region of the P-type transistor of 1.8 V in the peripheral circuit region, and channel implantation is performed.

Figure 13A:
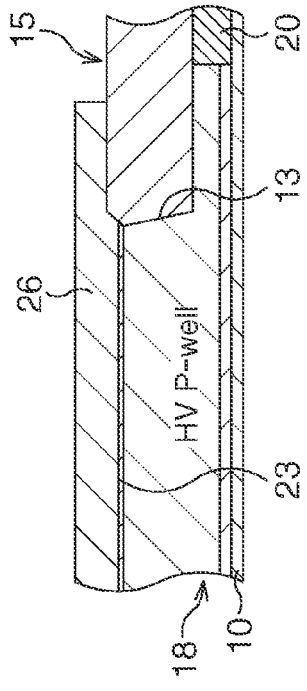
FIG. 13A to FIG. 13C are schematic cross-sectional views illustrating the manufacturing method of the nonvolatile semiconductor memory according to the first embodiment, subsequently to FIG. 12A to FIG. 12C.
Figure 13B:
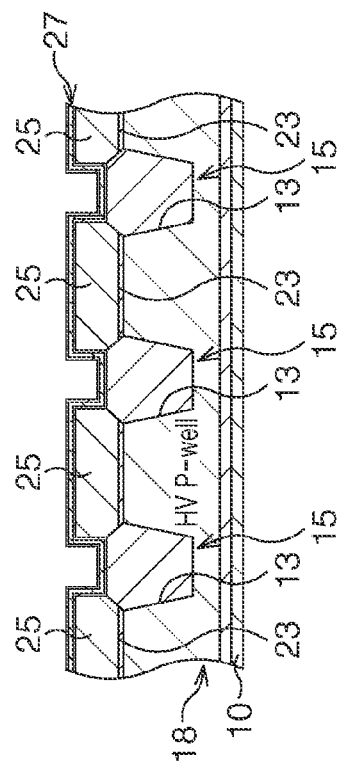
Figure 13C:
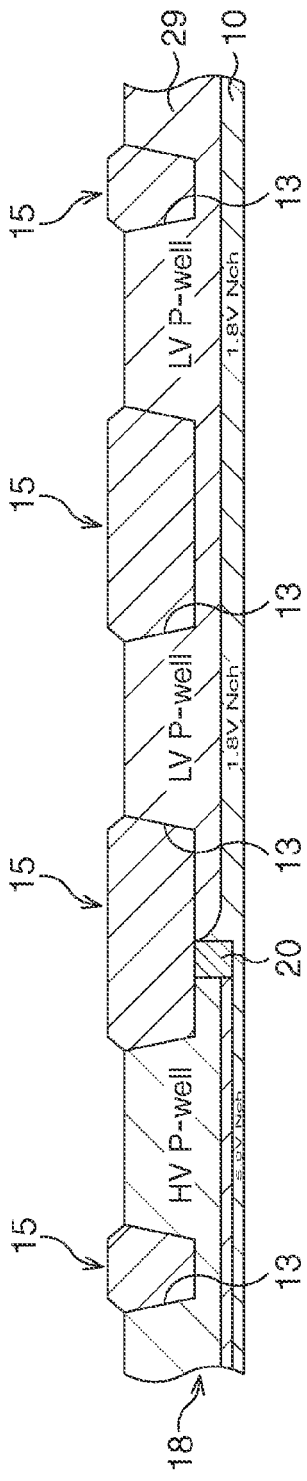

Subsequently, as illustrated in FIG. 13A to FIG. 13C, the ONO film 27 is left only in the formation region of the storage element.

Specifically, lithography, dry etching, and wet etching are performed on the ONO film 27 to remove the ONO film 27 in the formation region of the bypass capacitor and the peripheral circuit region, and the ONO film 27 is selectively left only in the formation region of the storage element.

Figure 14A:
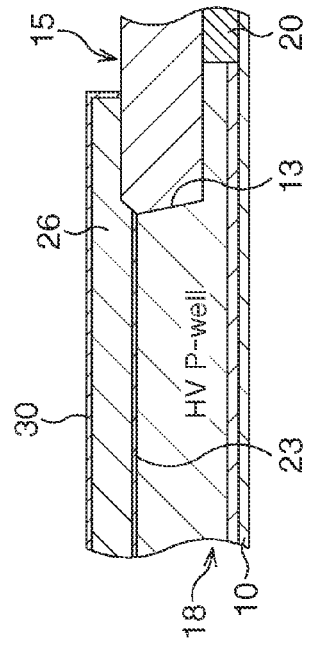
FIG. 14A to FIG. 14C are schematic cross-sectional views illustrating the manufacturing method of the nonvolatile semiconductor memory according to the first embodiment, subsequently to FIG. 13A to FIG. 13C.
Figure 14B:
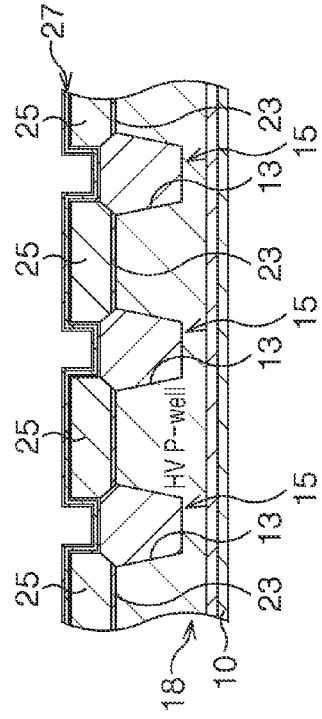
Figure 14C:
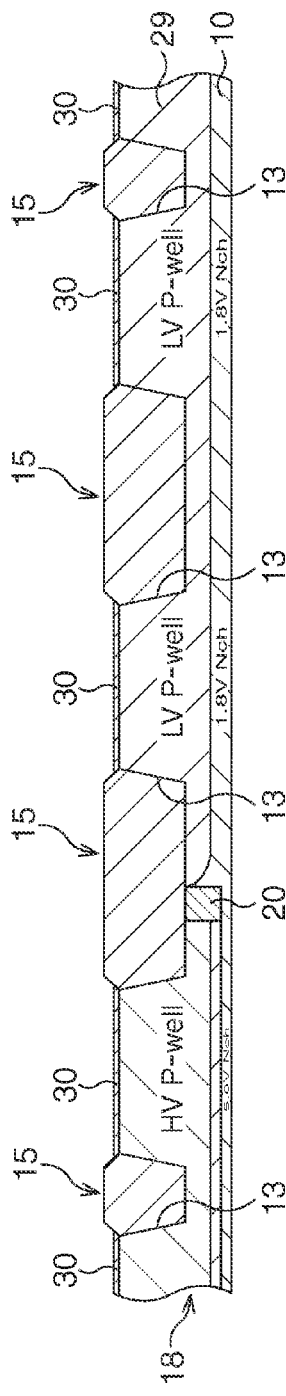

Subsequently, as illustrated in FIG. 14A to FIG. 14C, silicon oxide films 30 are formed.

Specifically, the surface of the semiconductor substrate 10 is thermally oxidized. Thereby, the silicon oxide films 30 are each formed on a surface of the first electrode 26 in the formation region of the bypass capacitor and on the surface, in the respective active regions, of the semiconductor substrate 10 in the peripheral circuit region. Here, in the peripheral circuit region, the silicon oxide films 30 are each formed to have a film thickness of 15 nm or so. In contrast to this, in the formation region of the bypass capacitor, the first electrode 26 is the doped amorphous silicon film 24, so that the silicon oxide film 30 is formed thicker than those in the peripheral circuit region due to the enhanced oxidation. The ONO film 27 is formed on the entire surface in the formation region of the storage element, and the ONO film 27 is not easily oxidized as compared with the amorphous silicon, so that it is hardly oxidized.

Here, the silicon oxide films may also be formed by a radical oxidation method in place of the thermal oxidation method. Concretely, in the states of FIG. 13A to FIG. 13C, silicon oxide films are formed by radical oxidation at 900° C., for example. Also in the above case, the ONO film 27 is not easily oxidized as compared with the amorphous silicon, so that it is hardly oxidized. According to the above radical oxidation method, an interference roughness of the first electrode 26 is not impaired but is well maintained, and the thin and high-quality silicon oxide films are obtained.

Figure 15A:
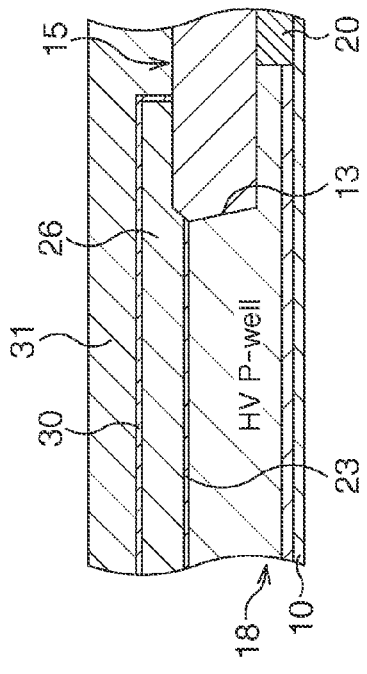
FIG. 15A to FIG. 15C are schematic cross-sectional views illustrating the manufacturing method of the nonvolatile semiconductor memory according to the first embodiment, subsequently to FIG. 14A to FIG. 14C.
Figure 15B:
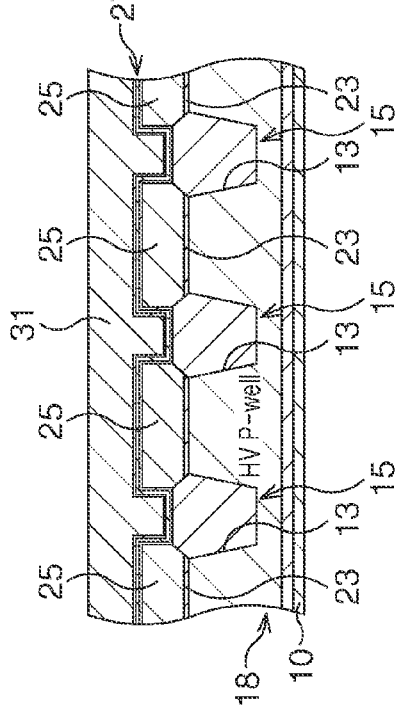
Figure 15C:
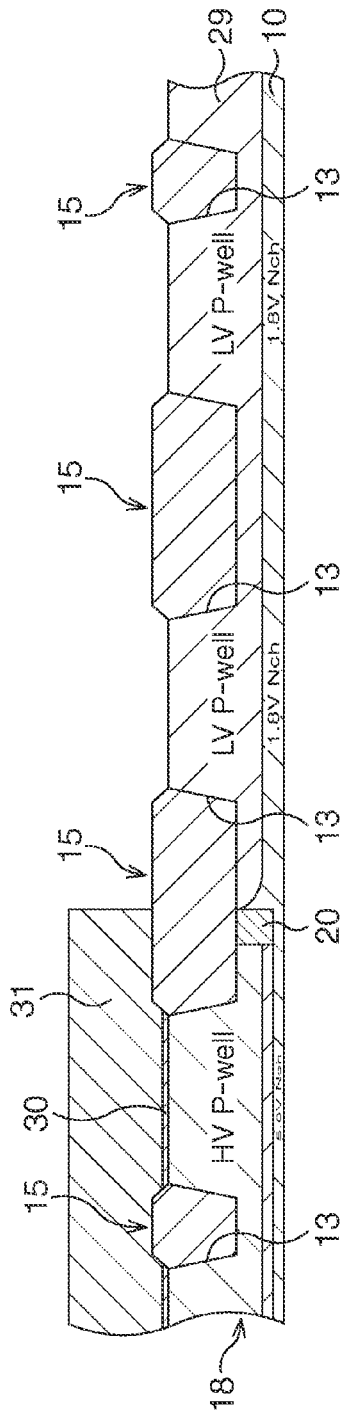

Subsequently, as illustrated in FIG. 15A to FIG. 15C, the silicon oxide films 30 formed in the respective active regions of the transistors of 1.8 V in the peripheral circuit region are removed.

Specifically, a resist is coated on the entire surface of the semiconductor substrate 10, and then the resist is processed by lithography. Thereby, a resist mask 31 having an opening that exposes the respective active regions of the transistors of 1.8 V in the peripheral circuit region is formed.

With the resist mask 31, the silicon oxide films 30 formed on the transistors of 1.8 V in the peripheral circuit region are removed by wet etching.

Figure 16A:
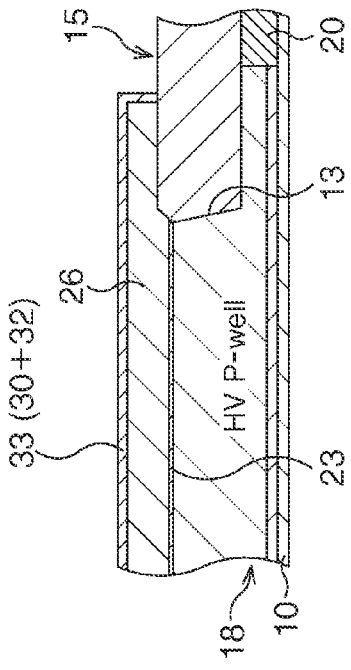
FIG. 16A to FIG. 16C are schematic cross-sectional views illustrating the manufacturing method of the nonvolatile semiconductor memory according to the first embodiment, subsequently to FIG. 15A to FIG. 15C.
Figure 16B:
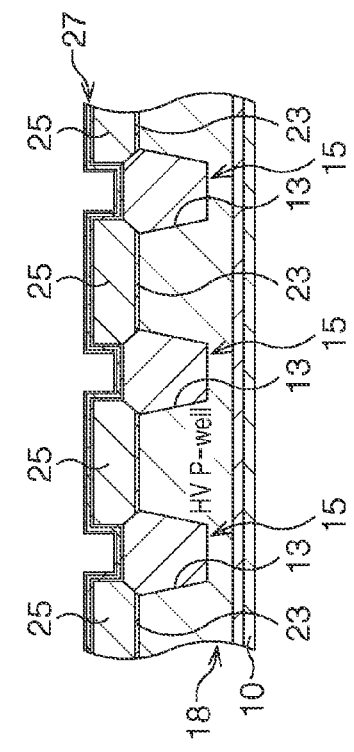
Figure 16C:
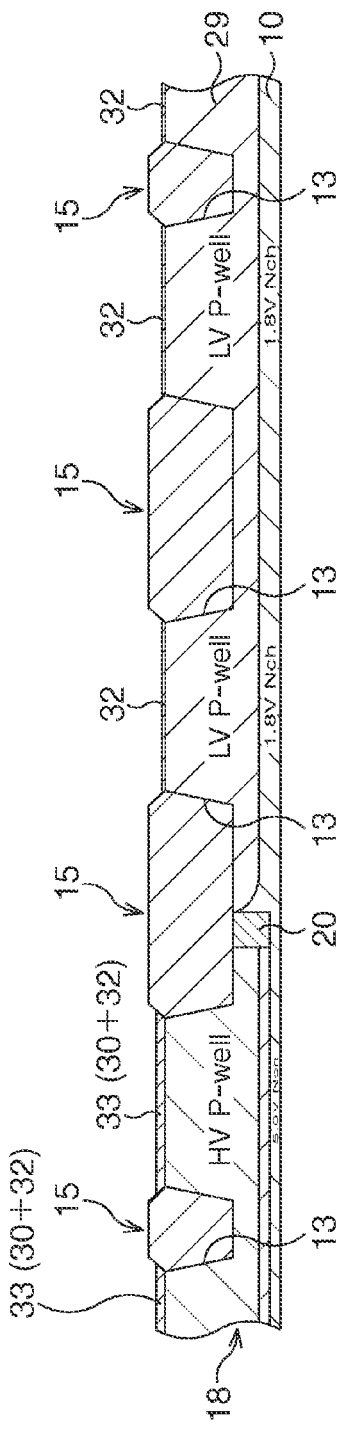

Subsequently, as illustrated in FIG. 16A to FIG. 16C, silicon oxide films 32 are formed.

Specifically, the resist mask 31 is first removed by an asking process or a wet process.

The surface of the semiconductor substrate 10 is thermally oxidized. By the thermal oxidization, the silicon oxide film 32 with a film thickness of 3 nm or so is formed on the surface of the semiconductor substrate 10 in the respective active regions of the transistors of 5.0 V in the peripheral circuit region in addition to the silicon oxide film 30. Thereby, a second insulating film 33 that is composed of the silicon oxide films 30, 32 and becomes a gate insulating film of the transistors of 5.0 V is formed.

In the formation region of the bypass capacitor, the silicon oxide film 32 is formed on the surface of the first electrode 26 in addition to the silicon oxide film 30. Also in the above case, the silicon oxide film 32 is formed thicker than those in the peripheral circuit region due to the enhanced oxidation of the first electrode 26. Thereby, the second insulating film 33 that is composed of the silicon oxide films 30, 32 and becomes the second capacitor insulating film of the bypass capacitor is formed on the first electrode 26. The second insulating film 33 in the formation region of the bypass capacitor is formed thicker than that in the peripheral circuit region to have a film thickness of 25 nm or so, for example.

In the respective active regions of the transistors of 1.8 V in the peripheral circuit region, the silicon oxide film 32 to be a gate insulating film of the N-type transistors of 1.8 V is formed on the surface of the semiconductor substrate 10 to have a film thickness of 3 nm or so.

The ONO film 27 is formed on the entire surface in the formation region of the storage element, and the ONO film 27 is not easily oxidized as compared with the amorphous silicon, so that it is hardly oxidized.

Also in the case when the silicon oxide films 32 are formed, the silicon oxide films may also be formed by a radical oxidation method in place of the thermal oxidation method.

In this embodiment, the second insulating film 33 becomes the gate insulating film of one of the two types of transistors in the peripheral circuit, which is the transistors of 5 here, and becomes the second capacitor insulating film of the bypass capacitor.

Figure 17A:
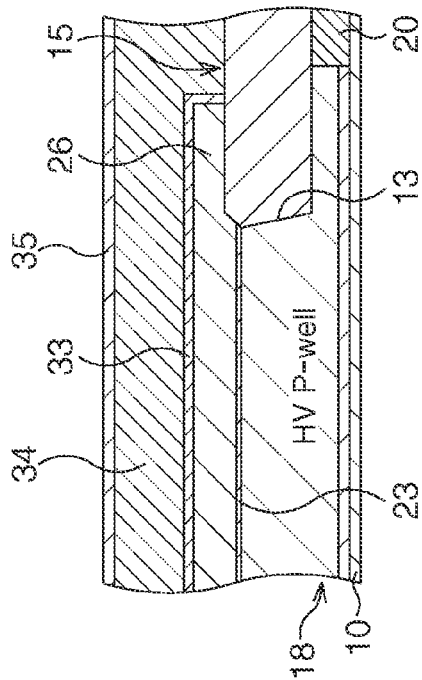
FIG. 17A to FIG. 17C are schematic cross-sectional views illustrating the manufacturing method of the nonvolatile semiconductor memory according to the first embodiment, subsequently to FIG. 16A to FIG. 16C.
Figure 17B:
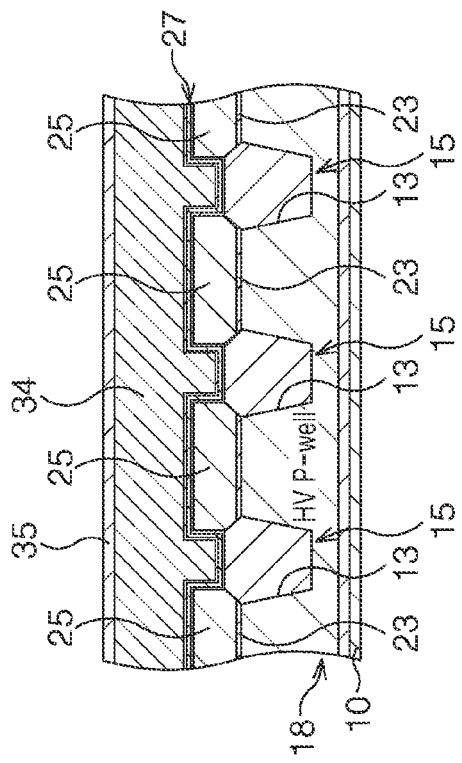
Figure 17C:
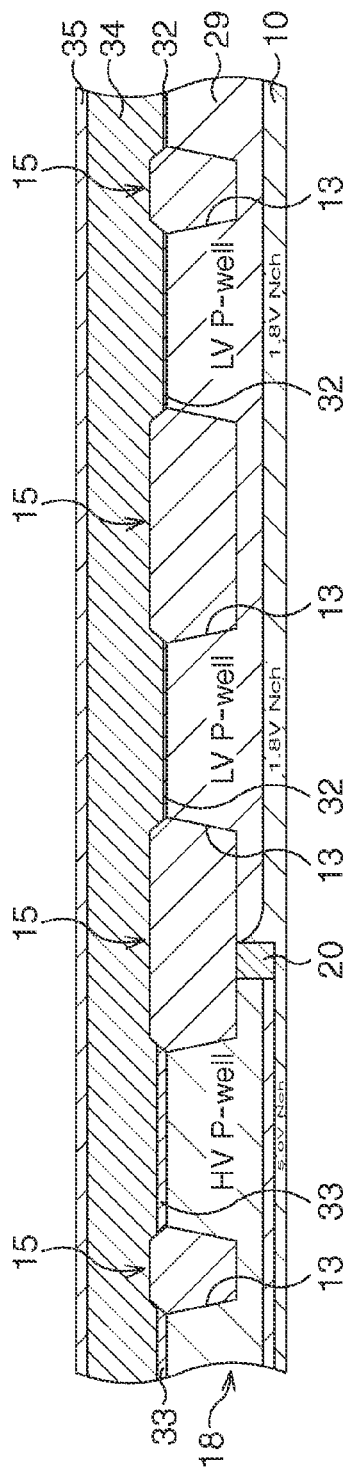

Subsequently, as illustrated in FIG. 17A to FIG. 17C, a polycrystalline silicon film 34 and an antireflection film 35 are sequentially formed.

Specifically, by a CVD method or the like, the polycrystalline silicon film 34 is deposited on the entire surface of the semiconductor substrate 10 to have a film thickness of 180 nm or so. By a plasma CVD method or the like, a nitride film, which is, for example, a silicon nitride film, is deposited on the polycrystalline silicon film 34 to form the antireflection film 35 to have a film thickness of 29 nm or so.

Figure 18A:
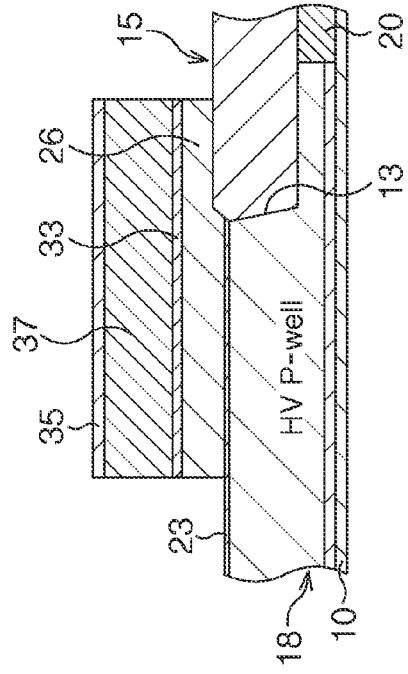
FIG. 18A to FIG. 18C are schematic cross-sectional views illustrating the manufacturing method of the nonvolatile semiconductor memory according to the first embodiment, subsequently to FIG. 17A to FIG. 17C.
Figure 18B:
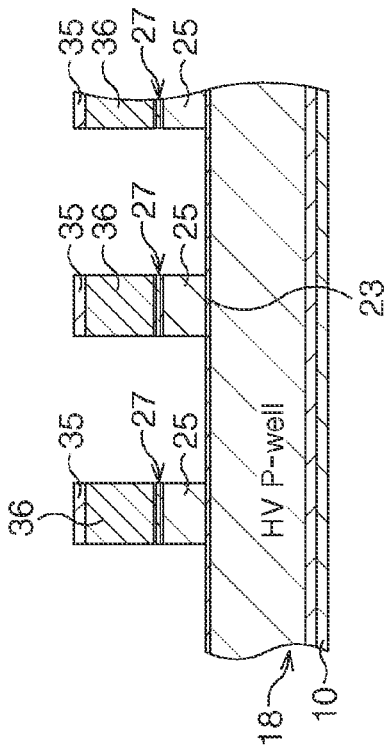
Figure 18C:
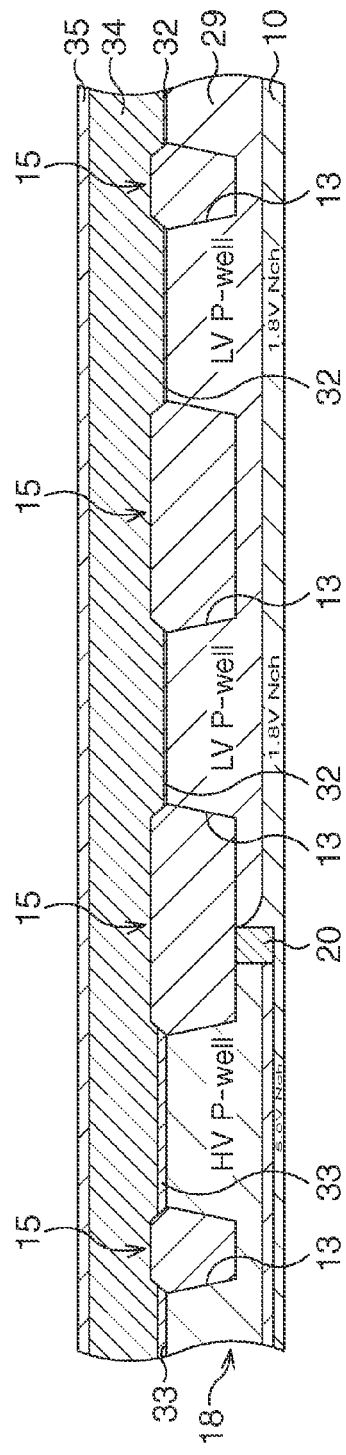

Subsequently, as illustrated in FIG. 18A to FIG. 18C, control gate electrodes 36 of the storage element and a second electrode 37 of the bypass capacitor are formed.

Specifically, the formation region of the storage element and the formation region of the bypass capacitor are processed by lithography and dry etching.

In the formation region of the storage element, the antireflection film 35, the polycrystalline silicon film 34, the ONO film 27, and the floating gate electrodes 25 are processed. Thereby, the control gate electrodes 36 of the storage element are formed on the ONO film 27, and the storage element is structured. In the storage element, the island-shaped floating gate electrode 25 and the control gate electrode 36 structure a capacitor with the ONO film 27 intervening therebetween, which plays a role of storing information therein.

In the formation region of the bypass capacitor, the antireflection film 35, the polycrystalline silicon film 34, the second insulating film 33, and the first electrode 26 are processed. Thereby, the second electrode 37 of the bypass capacitor is formed on the second insulating film 33, and the bypass capacitor is structured. In the bypass capacitor, the semiconductor substrate 10 and the first electrode 26 structure a first capacitor with the first insulating film 23 intervening therebetween, and the first electrode 26 and the second electrode 37 structure a second capacitor with the second insulating film 33 intervening therebetween.

Figure 19A:
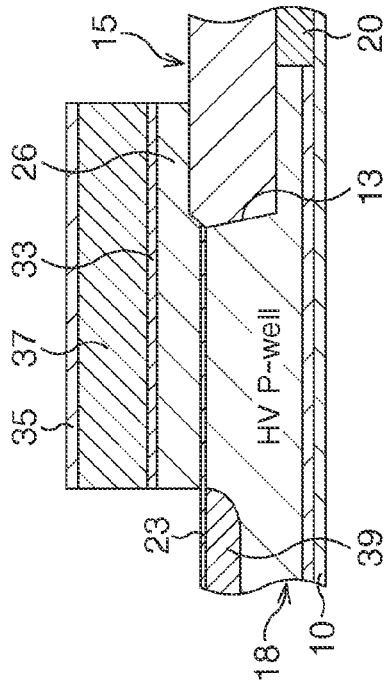
FIG. 19A to FIG. 19C are schematic cross-sectional views illustrating the manufacturing method of the nonvolatile semiconductor memory according to the first embodiment, subsequently to FIG. 18A to FIG. 18C.
Figure 19B:
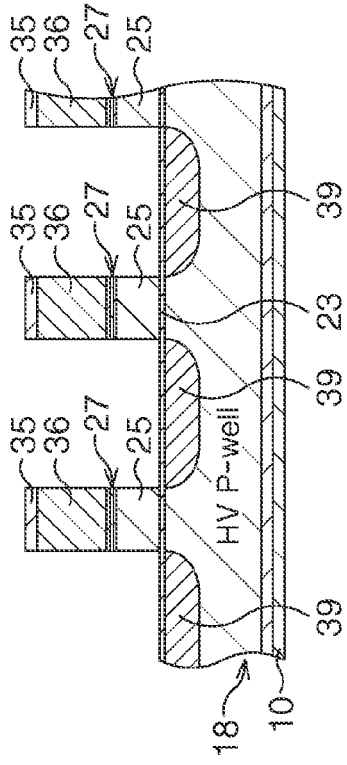
Figure 19C:
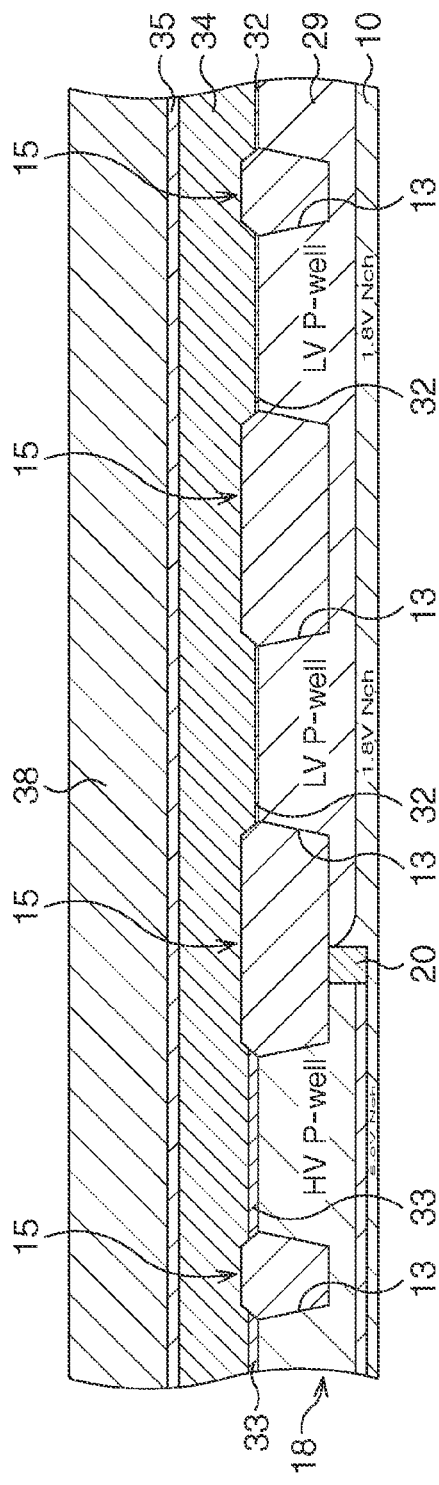

Subsequently, as illustrated in FIG. 19A to FIG. 19C, shallow N-type impurity regions 39 are formed in the formation region of the storage element and the formation region of the bypass capacitor respectively.

Specifically, a resist is first coated on the entire surface of the semiconductor substrate 10, and then the resist is processed by lithography. Thereby, a resist mask 38 covering only the peripheral circuit region is formed.

With the resist mask 38, an N-type impurity, which is, for example, arsenic ($As^+$), is ion implanted into the exposed formation region of the storage element and the exposed formation region of the bypass capacitor under conditions of a dose amount of $6.0 \times 10^{14}/cm^2$ and acceleration energy of 50 keV. Thereby, $As^+$ is introduced into the surface, of both sides of the floating gate electrodes 25, of the semiconductor substrate 10 to form the shallow N-type impurity regions 39. In the formation region of the bypass capacitor, $As^+$ is introduced into the surface of the semiconductor substrate 10 along one side of the first electrode 26 to form the shallow N-type impurity region 39.

Figure 20A:
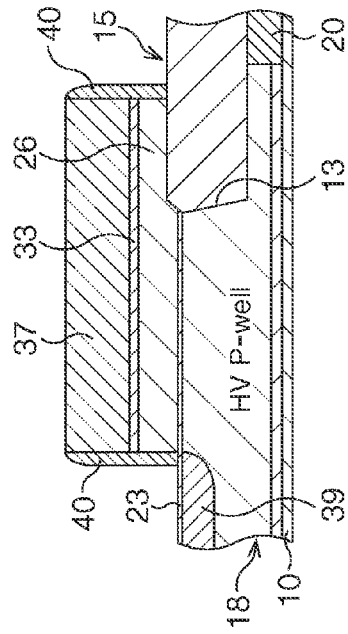
FIG. 20A to FIG. 20C are schematic cross-sectional views illustrating the manufacturing method of the nonvolatile semiconductor memory according to the first embodiment, subsequently to FIG. 19A to FIG. 19C.
Figure 20B:
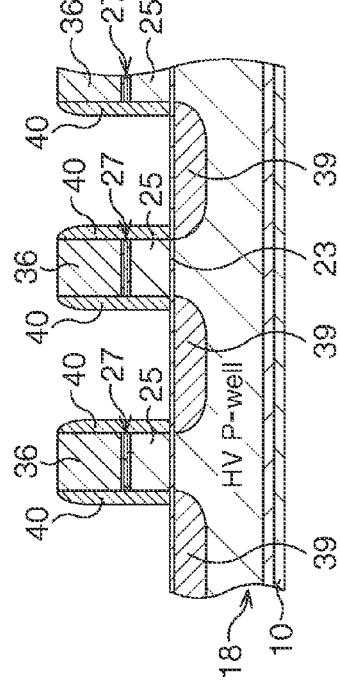
Figure 20C:
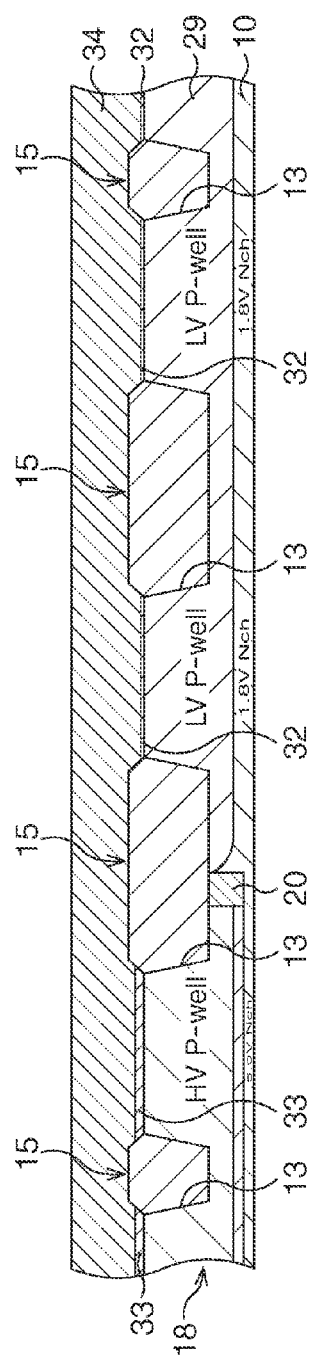

Subsequently, as illustrated in FIG. 20A to FIG. 20C, first sidewall insulating films 40 are formed in the formation region of the storage element and the formation region of the bypass capacitor.

Specifically, the resist mask 38 is first removed by an asking process or a wet process. Thereafter, the antireflection film 35 is removed by wet etching, or the like.

An insulating film, which is, for example, a silicon nitride film here, is deposited on the entire surface of the semiconductor substrate 10 by a CVD method or the like. An entire surface of the silicon nitride film is anisotropically dry-etched (etched back). Thereby, in the formation region of the storage element, the first sidewall insulating films 40 covering side surfaces of the floating gate electrodes 25, the ONO film 27, and the control gate electrodes 36 with the silicon nitride film are formed. In the formation region of the bypass capacitor, the first sidewall insulating films 40 covering side surfaces of the first electrode 26, the second insulating film 33, and the second electrode 37 with the silicon nitride film are formed.

Figure 21B:
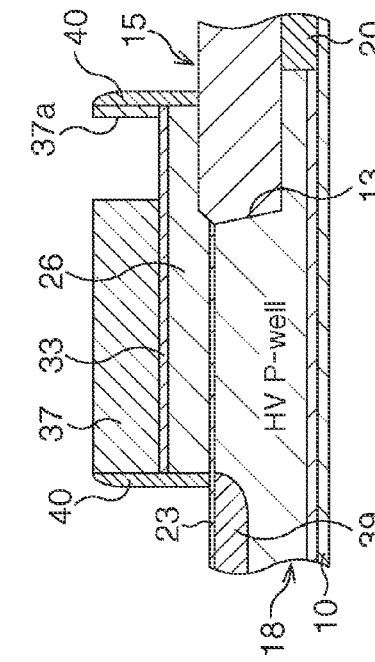
FIG. 21A to FIG. 21C are schematic cross-sectional views illustrating the manufacturing method of the nonvolatile semiconductor memory according to the first embodiment, subsequently to FIG. 20A to FIG. 20C.
Figure 21A:
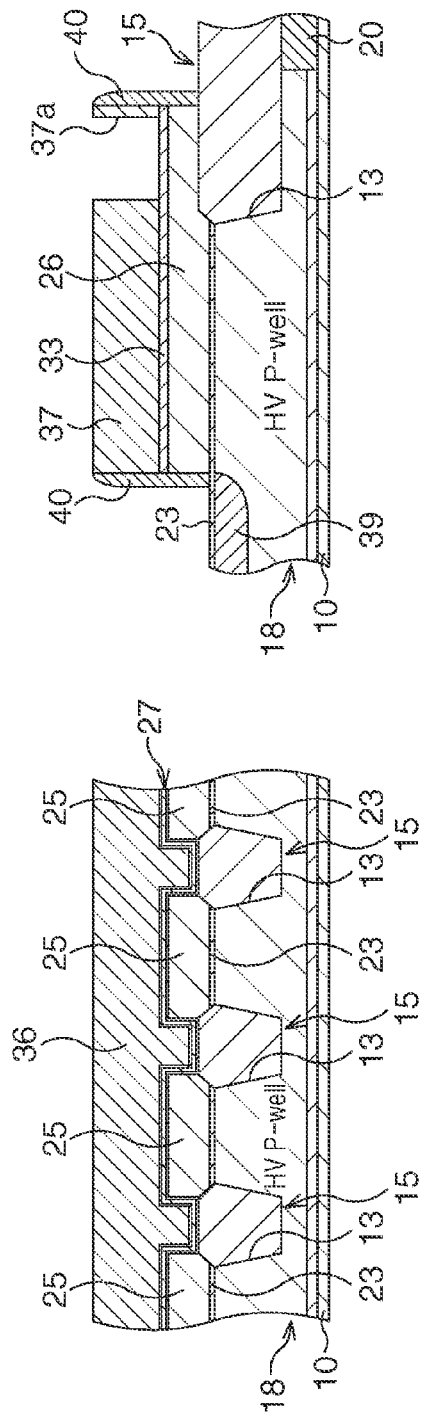
Figure 21C:
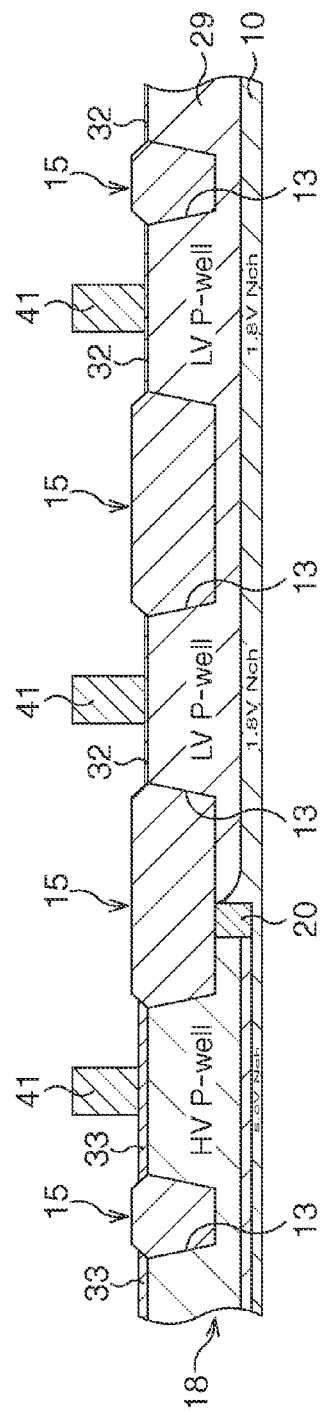

Subsequently, as illustrated in FIG. 21A to FIG. 21C, an opening 37a is formed in the second electrode 37 in the formation region of the bypass capacitor, and gate electrodes 41 are formed in the respective active regions of the peripheral circuit region respectively.

Specifically, lithography and dry etching are performed. In the formation region of the bypass capacitor, the second electrode 37 is processed. In the respective active regions of the transistors in the peripheral circuit region, the polycrystalline silicon film 34 is processed.

Thereby, the opening 37a that exposes one portion of a surface of the second insulating film 33 is formed in one end portion of the second electrode 37 in the formation region of the bypass capacitor. The gate electrodes 41 are formed on the second insulating film 33 in the respective active regions of the transistors of 5.0 V in the peripheral circuit region. The gate electrodes 41 are formed on the silicon oxide film 32 in the respective active regions of the transistors of 1.8 V in the peripheral circuit region.

In this embodiment, as described above, the polycrystalline silicon film 34 turns to the control gate electrodes 36 of the storage element, the gate electrodes 41 of the peripheral circuit region, and the second electrode (upper electrode) 37 of the bypass capacitor.

Subsequently, as illustrated in FIG. 22A to FIG. 22C, shallow N-type impurity regions 43 are formed in the respective active regions of the N-type transistors of 1.8 V in the peripheral circuit region respectively.

Specifically, a resist is first coated on the entire surface of the semiconductor substrate 10, and then the resist is processed by lithography. Thereby, a resist mask 42 having an opening that exposes only the respective active regions of the N-type transistors of 1.8 V in the peripheral circuit region is formed.

With the resist mask 42, an N-type impurity, which is, for example, arsenic ($As^+$), is ion implanted into the respective exposed active regions of the N-type transistors of 1.8 V in the peripheral circuit region under conditions of a dose amount of $5.0 \times 10^{14}/cm^2$ and acceleration energy of 15 keV. Thereby, in the respective active regions, $As^+$ is introduced into the surface, of both sides of the gate electrodes 41, of the semiconductor substrate 10 to form the shallow N-type impurity regions 43.

Subsequently, as illustrated in FIG. 23A to FIG. 23C, shallow N-type impurity regions 45 are each formed in the active region of the N-type transistor of 5.0 V in the peripheral circuit region.

Specifically, the resist mask 42 is first removed by an ashing process or a wet process.

A resist is coated on the entire surface of the semiconductor substrate 10, and then the resist is processed by lithography. Thereby, a resist mask 44 having an opening that exposes only the active region of the N-type transistor of 5.0 V in the peripheral circuit region is formed.

With the resist mask 44, an N-type impurity, which is, for example, phosphorus ($P^+$), is ion implanted into the exposed active region of the N-type transistor of 5.0 V in the peripheral circuit region under conditions of a dose amount of $4.0 \times 10^{13}/cm^2$ and acceleration energy of 35 keV. Thereby, in the active region, $P^-$ is introduced into the surface, of both sides of the gate electrode 41, of the semiconductor substrate 10 to form the shallow N-type impurity regions 45.

Subsequently, as illustrated in FIG. 24A to FIG. 24C, second sidewall insulating films 46 are formed in the formation region of the storage element, the formation region of the bypass capacitor, and the peripheral circuit region.

Specifically, the resist mask 44 is first removed by an ashing process or a wet process.

An insulating film, which is, for example, a silicon oxide film here, is deposited on the entire surface of the semiconductor substrate 10 by a CVD method or the like to have a film thickness of 100 nm or so. An entire surface of the above silicon oxide film is anisotropically dry-etched (etched back).

By the above etching back, in the formation region of the bypass capacitor, the second insulating film 33 exposed at a bottom surface of the opening 37a is removed to expose one portion of the surface of the first electrode 26. Then, the second sidewall insulating films 46 covering portions of side surfaces of the first sidewall insulating films 40 and side surfaces of the opening 37a with the silicon oxide film respectively are formed.

In the active regions of the transistors of 5.0 V in the peripheral circuit region, the second insulating films 33 exposed on both the sides of the gate electrodes 41 are removed to thereby expose portions of the surface of the semiconductor substrate 10. Then, the second sidewall insulating films 46 covering side surfaces of the gate electrodes 41 with the silicon oxide film are formed.

In the active regions of the transistors of 1.8 V in the peripheral circuit region, the silicon oxide films 32 exposed on both the sides of the gate electrodes 41 are removed to thereby expose portions of the surface of the semiconductor substrate 10. Then, the second sidewall insulating films 46 covering side surfaces of the gate electrodes 41 with the silicon oxide film are formed.

Similarly to the formation region of the storage element, the first insulating films 23 exposed on both the sides of the floating gate electrodes 25 are removed to thereby expose portions of the surface of the semiconductor substrate 10, which are not illustrated in FIG. 24A. Then, the second sidewall insulating films 46 covering portions of side surfaces of the first sidewall insulating films 40 with the silicon oxide film are formed.

Subsequently, as illustrated in FIG. 25A to FIG. 25C, deep P-type impurity regions 48 are each formed in the respective active regions of the P-type transistors in the peripheral circuit region.

Specifically, a resist is first coated on the entire surface of the semiconductor substrate 10, and then the resist is processed by lithography. Thereby, a resist mask 47 having openings that expose only the respective active regions of the P-type transistors in the peripheral circuit region is formed.

With the resist mask 47, a P-type impurity, which is, for example, boron (B$^+$), is ion implanted into the respective exposed active regions of the P-type transistors in the peripheral circuit region under conditions of a dose amount of $2.0 \times 10^{15}/cm^2$ and acceleration energy of 5 keV. Thereby, B$^+$ is introduced into the surface, of both sides of the gate electrodes 41, of the semiconductor substrate 10 in the respective active regions of the P-type transistors to form the deep P-type impurity regions 48. The P-type impurity regions 48 each function as a source/drain region in the P-type transistors in the peripheral circuit.

Subsequently, as illustrated in FIG. 26A to FIG. 26C, deep N-type impurity regions 50 are formed in the formation region of the storage element, the formation region of the bypass capacitor, and the respective active regions of the N-type transistors in the peripheral circuit region respectively.

Specifically, the resist mask 47 is first removed by an asking process or a wet process.

A resist is coated on the entire surface of the semiconductor substrate 10, and then the resist is processed by lithography. Thereby, a resist mask 49 having openings that expose only the formation region of the storage element, the formation region of the bypass capacitor, and the respective active regions of the N-type transistors in the peripheral circuit region is formed.

With the resist mask 49, an N-type impurity, which is, for example, arsenic (As$^+$), is ion implanted into the formation region of the storage element, the formation region of the bypass capacitor, and the respective active regions of the N-type transistors in the peripheral circuit region, which are exposed.

Conditions of the ion implantation are such that a dose amount is $2.0 \times 10^{15}/cm^2$ and acceleration energy is 15 keV.

By the ion implantation, in the formation region of the bypass capacitor, As$^+$ is introduced into the surface of the semiconductor substrate 10 along one side of the first electrode 26 to form the deep N-type impurity region 50 so as to overlap one portion of the shallow N-type impurity region 39.

In the active region of the N-type transistor of 5.0 V in the peripheral circuit region, As$^+$ is introduced into the surface, of both the sides of the gate electrode 41, of the semiconductor substrate 10 to form the deep N-type impurity regions 50 so as to overlap portions of the shallow N-type impurity regions 45.

In the active regions of the N-type transistors of 1.8 V in the peripheral circuit region, As$^+$ is introduced into the surface, of both the sides of the gate electrodes 41, of the semiconductor substrate 10 to form the deep N-type impurity regions 50 so as to overlap portions of the shallow N-type impurity regions 43.

Also in the formation region of the storage element, the deep N-type impurity regions 50 are formed so as to overlap portions of the shallow N-type impurity regions 39, which are not illustrated in FIG. 26A. The N-type impurity regions 50 each function as a source/drain region in the storage element and the N-type transistors in the peripheral circuit.

Thereafter, a predetermined annealing treatment is performed on the semiconductor substrate 10. Thereby, the respective impurities in the impurity regions 39, 43, 45, 48, and 50 are activated.

Subsequently, as illustrated in FIG. 27A to FIG. 27C, silicide layers 51 are formed.

Specifically, the resist mask 49 is first removed by an asking process or a wet process.

A silicide metal, which is, for example, Co, is deposited on the entire surface of the semiconductor substrate 10 by a sputtering method or the like to be heat treated. Thereby, the silicon and the silicide metal are reacted to form silicide (CoSi).

Concretely, in the formation region of the storage element, the silicide layer 51 is formed on the control gate electrodes 36 and the N-type impurity regions 50 (that are not illustrated in FIG. 27A).

In the formation region of the bypass capacitor, the silicide layer 51 is formed on the second electrode 37, the surface of the first electrode 26 exposed at the bottom surface of the opening 37a, and the N-type impurity region 50.

In the active regions of the N-type transistors in the peripheral circuit region, the silicide layer 51 is formed on the gate electrodes 41 and the N-type impurity regions 50.

In the active regions of the P-type transistors in the peripheral circuit region, the silicide layer 51 is formed on the gate electrodes 41 and the P-type impurity regions 48.

Thereafter, the unreacted silicide metal on the semiconductor substrate 10 is removed by wet etching.

Subsequently, as illustrated in FIG. 28A to FIG. 28C, a silicon oxide film 52 and a silicon nitride film 53 are sequentially formed, and then an interlayer insulating film 54 is formed.

Specifically, first, on the entire surface of the semiconductor substrate 10, the silicon oxide film 52 is deposited to have a film thickness of 20 nm or so and the silicon nitride film 53 is deposited to have a film thickness of 80 nm or so sequentially by a CVD method or the like. The silicon oxide film 52 and the silicon nitride film 53 function as an etching stopper when later-described contact holes are formed.

On the entire surface of the semiconductor substrate 10, for example, BPSG (Boron Phosphor Silicate Glass) is deposited to have a film thickness of 1300 nm or so, so as to cover the silicon nitride film 53. A surface of the deposited BPSG is polished by a CMP method to smooth the surface. Thereby, the interlayer insulating film 54 covering the silicon nitride film 53 and having the smoothed surface is formed.

Subsequently, as illustrated in FIG. 29A to FIG. 29C, connection plugs 57 and wirings 61 are formed.

Specifically, the connection plugs 57 are first formed in the formation region of the storage element, the formation region of the bypass capacitor, and the peripheral circuit region.

By lithography and dry etching, openings are made in the interlayer insulating film 54, the silicon oxide film 52, and the silicon nitride film 53 by using the silicon oxide film 52 and the silicon nitride film 53 as an etching stopper, to thereby form contact holes 55 each exposing a portion of a surface of the silicide layer 51.

Ti/TiN are sequentially deposited on the interlayer insulating film 54 to have film thicknesses of 30 nm or so/20 nm or so by a sputtering method or the like, so as to cover internal surfaces of the respective contact holes 55 to then form a base film 56.

A W film is deposited to have a film thickness of 300 nm or so by a CVD method or the like so as to fill the respective contact holes 55 with tungsten (W) via the base film 56.

The W film and the base film 56 are polished by a CMP method until a surface of the interlayer insulating film 54 is exposed. Thereby, the connection plugs 57 in which the respective contact holes 55 are filled with W via the base film 56 are formed.

Next, in the formation region of the storage element, the formation region of the bypass capacitor, and the peripheral circuit region, the wirings 61 to be connected to the connection plugs 57 are formed.

On the entire surface of the interlayer insulating film 54 including the tops of the respective connection plugs 57, by a sputtering method or the like, Ti/TiN are deposited to have film thicknesses of 60 nm or so/30 nm or so, Al is deposited to have a film thickness of 360 nm or so, and Ti/TiN are deposited to have film thicknesses of 5 nm or so/70 nm or so sequentially. By lithography and dry etching, Ti/TiN, Al, and Ti/TiN are processed. Thereby, the wirings 61 each having a structure in which adhesive layers 58, 60 sandwich a metal layer 59, which are connected to the connection plugs 57, are formed.

Thereafter, the semiconductor memory of this embodiment is formed through processes of forming the interlayer insulating film, the connection plugs, and the wirings in an upper layer, and the like.

Incidentally, in the above-described case, the case where the second capacitor insulating film, together with the gate insulating film of the transistors of 5 in the peripheral circuit, is formed of the second insulating film 33 is indicated as an example, but the second capacitor insulating film may also be formed of an insulating film the same as the gate insulating film of the transistors of 1.8 V in the peripheral circuit. That is, in this embodiment, it is possible to appropriately select the second capacitor insulating film from the two types of insulating films different in film thickness depending on the necessary bypass capacitor.

In this embodiment, as for the bypass capacitor, the first capacitor insulating film, together with the tunnel insulating film of the storage element, is formed of the first insulating film 23. The first electrode 26 being the lower electrode, together with the floating gate electrodes 25 of the storage element, is formed of the doped·amorphous silicon film 24 (that is crystallized). The second capacitor insulating film, together with the gate insulating film of the transistors of 5 in the peripheral circuit, is formed of the second insulating film 33. The second electrode 37 being the upper electrode, together with the control gate electrodes 36 of the storage element and the gate electrodes 41 of the transistors in the peripheral circuit, is formed of the polycrystalline silicon film 34. The above bypass capacitor is such that the first capacitor structured in a manner to sandwich the first insulating film 23 by the semiconductor substrate 10 and the first electrode 26 and the second capacitor structured in a manner to sandwich the second insulating film 33 by the first electrode 26 and the second electrode 37 are series-connected.

A capacitance density of the first capacitor is 3.5 fF/$\mu m^2$ or so, and a capacitance density of the second capacitor is 1.4 fF/$\mu m^2$ or so. Thus, the bypass capacitor in this embodiment has a large capacitance density of 4.9 fF/$\mu m^2$ or so obtained by adding both the capacitance densities.

Comparative Example 1 of this embodiment is described. In Comparative Example 1, a nonvolatile semiconductor memory provided with a peripheral circuit includes a bypass capacitor corresponding to a 5 power supply. The above bypass capacitor is structured by a semiconductor substrate, a capacitor insulating film the same as a gate insulating film of transistors of 5 in the peripheral circuit, and an electrode the same as gate electrodes of the transistors of 5. In the above case, when a film thickness of the gate insulating film is set to 16 nm or so, the bypass capacitor in Comparative Example 1 has a capacitance density of 2.2 fF/$\mu m^2$ or so. The bypass capacitor in this embodiment can obtain a capacitance density about 2.2 times larger than that of the bypass capacitor in Comparative Example 1.

Further, the bypass capacitor in Comparative Example 1 is structured by only one capacitor, and the capacitor insulating film is limited only to the gate insulating film of the transistors of 5 V. Thus, an occupied area of the bypass capacitor is determined by a requested capacitance value, resulting that it is difficult to respond to a request for a reduction in occupied area of the bypass capacitor.

In contrast to this, the bypass capacitor in this embodiment employs the structure in which the two types of capacitors each having the capacitance set independently are stacked. Further, in the above-described case, the case where the second capacitor insulating film, together with the gate insulating film of the transistors of 5 in the peripheral circuit, is formed of the second insulating film 33 is indicated as an example, but the second capacitor insulating film may also be formed of an insulating film the same as the gate insulating film of the transistors of 1.8 V in the peripheral circuit. In later-described second and third embodiments, there is disclosed the case where a second capacitor insulating film is formed of an insulating film the same as a gate insulating film of transistors of 3.3 V or 1.8 V. In this embodiment as above, it is possible to appropriately select the second capacitor insulating film from the two types of insulating films different in film thickness (different in withstand voltage). Thus, in this embodiment, it is possible to determine the occupied area of the bypass capacitor without depending on the capacitance value requested in the bypass capacitor and to respond to a request for a reduction in occupied area of the bypass capacitor.

Comparative Example 2 in this embodiment is described. In Comparative Example 2, a nonvolatile semiconductor memory provided with a peripheral circuit includes a bypass capacitor formed using manufacturing processes of a storage element. The above bypass capacitor is structured by a semiconductor substrate, a first capacitor insulating film the same as a tunnel insulating film, a first electrode the same as floating gate electrodes, a second capacitor insulating film the same as an ONO film, and a second electrode the same as control gate electrodes. The above bypass capacitor is such that a first capacitor structured in a manner to sandwich the first capacitor insulating film by the semiconductor substrate and the first electrode and a second capacitor structured in a manner to sandwich the second capacitor insulating film by the first electrode and the second electrode are series-connected.

In the above case, a capacitance density of the first capacitor is 3.5 fF/$\mu m^2$ or so, and a capacitance density of the second capacitor is 2.3 fF/$\mu m^2$ or so. Thus, the bypass capacitor in Comparative Example 2 has a large capacitance density of 5.8 fF/$\mu m^2$ or so obtained by adding both the capacitance densities. However, in the above bypass capacitor, the ONO film of the storage element is used for the second capacitor insulating film, and the ONO film, due to its property, easily captures charge and is inferior to dielectric breakdown resistance as the capacitor insulating film of the bypass capacitor, and has a large concern in terms of reliability. Thus, the bypass capacitor in Comparative Example 2 has a large capacitance density but has a large problem in terms of reliability as the semiconductor memory.

Further, in the bypass capacitor in Comparative Example 2, film thicknesses of both the tunnel insulating film and the ONO film that are used as the capacitor insulating films are determined due to a property of the nonvolatile memory, and if the capacitance is desired to change, there is no choice but to change an area of the electrode. As above, it is impossible to employ the structure in Comparative Example 2 for the bypass capacitor in the semiconductor memory.

In contrast to this, in the bypass capacitor in this embodiment, the manufacturing processes of the storage element and the transistors in the peripheral circuit are used without increasing the number of manufacturing processes as a whole. Here, the gate insulating film of the transistors in the peripheral circuit is used for the second capacitor insulating film. Thus, unlike the bypass capacitor in Comparative Example 2, the bypass capacitor in this embodiment excels in dielectric breakdown resistance and has no concern in terms of reliability, and furthermore can obtain a large capacitance density equivalent to that of the bypass capacitor in Comparative Example 2.

Further, it is possible to appropriately select the second capacitor insulating film from the two types of insulating films different in film thickness (different in withstand voltage) as described above. Thus, also in the case when the occupied area of the bypass capacitor and the requested capacitance value are achieved, the occupied area of the bypass capacitor can be determined without depending on the capacitance value, and a response to a request for a reduction in occupied area of the bypass capacitor is made possible.

As explained above, according to this embodiment, the semiconductor memory provided with the bypass capacitor that excels in dielectric breakdown resistance, has no concern in terms of reliability, obtains a desired capacitance with a small occupied area, and has a high capacitance density is achieved without increase in manufacturing processes of the semiconductor memory.

(Second Embodiment)

FIG. 30A to FIG. 30C to FIG. 42A to FIG. 42C are schematic cross-sectional views illustrating a manufacturing method of a nonvolatile semiconductor memory according to a second embodiment in order of processes. In the respective drawings, A illustrates a formation region of a storage element, B illustrates a formation region of a bypass capacitor, and C illustrates a peripheral circuit region respectively. As for the formation region of the storage element, in FIG. 30A to FIG. 41A, the cross section of control gate electrodes taken along the longitudinal direction is illustrated, and in FIG. 42A, the cross section of the control gate electrodes taken along the short-side direction is illustrated respectively.

In this embodiment, the case where in the peripheral circuit region, N-type and P-type transistors each having its gate voltage (power supply voltage) of 1.8 V, N-type and P-type transistors of 3.3 V, and N-type and P-type transistors of 5.0 V are formed is indicated as an example. For the convenience of illustration, the N-type transistor of 1.8 V, the N-type transistor of 3.3 V, and the N-type transistor of 5.0 V are only illustrated in each of the drawings, and "1.8 V Nch", "3.3 V Nch", and "5.0 V Nch" are added to active regions of the peripheral circuit region.

Figure 30A:
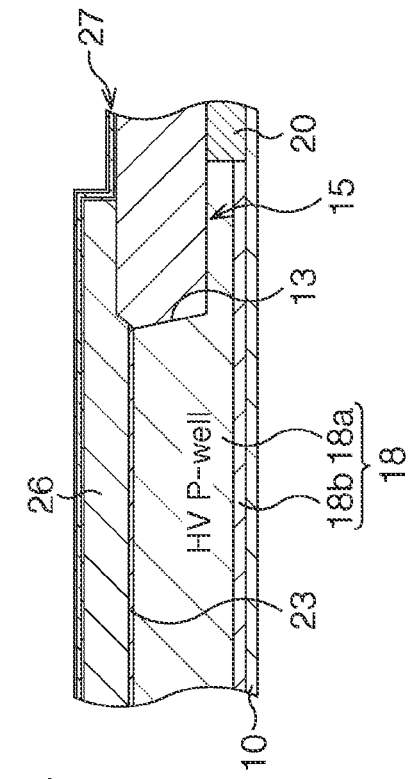
FIG. 30A to FIG. 30C are schematic cross-sectional views illustrating a manufacturing method of a nonvolatile semiconductor memory according to a second embodiment.
Figure 30B:
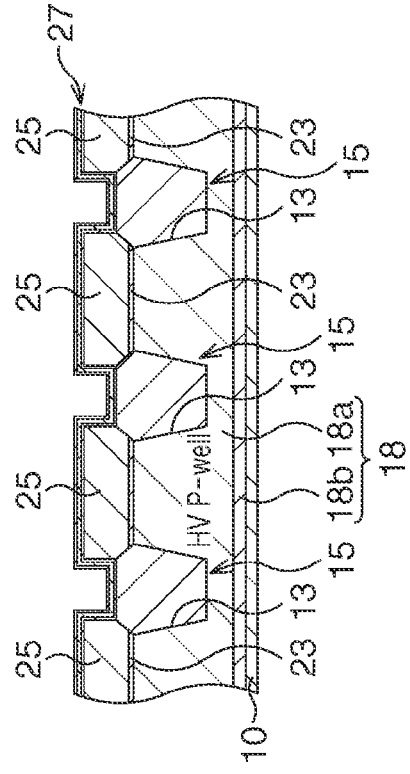
Figure 30C:
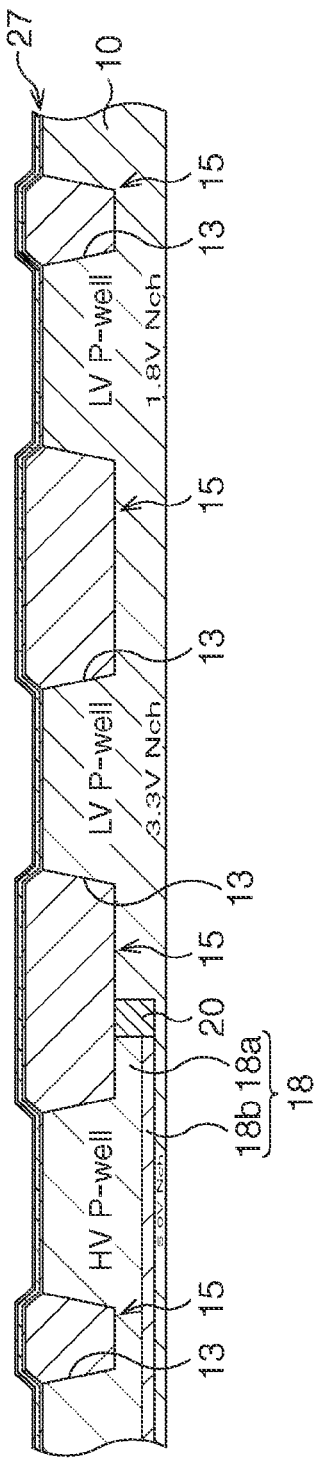

In this embodiment, processes similar to those of FIG. 1A to FIG. 1C to FIG. 11A to FIG. 11C in the first embodiment are first performed. Thereby, as illustrated in FIG. 30A to FIG. 30C, an ONO film 27 is formed on an entire surface of a semiconductor substrate 10.

Figure 31B:
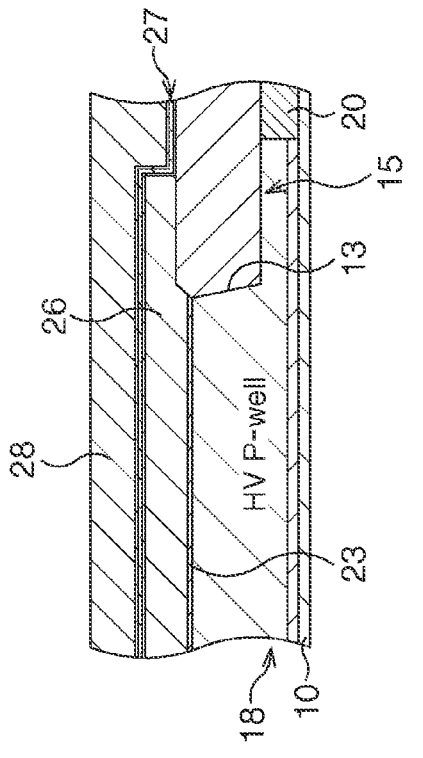
FIG. 31A to FIG. 31C are schematic cross-sectional views illustrating the manufacturing method of the nonvolatile semiconductor memory according to the second embodiment, subsequently to FIG. 30A to FIG. 30C.
Figure 31A:
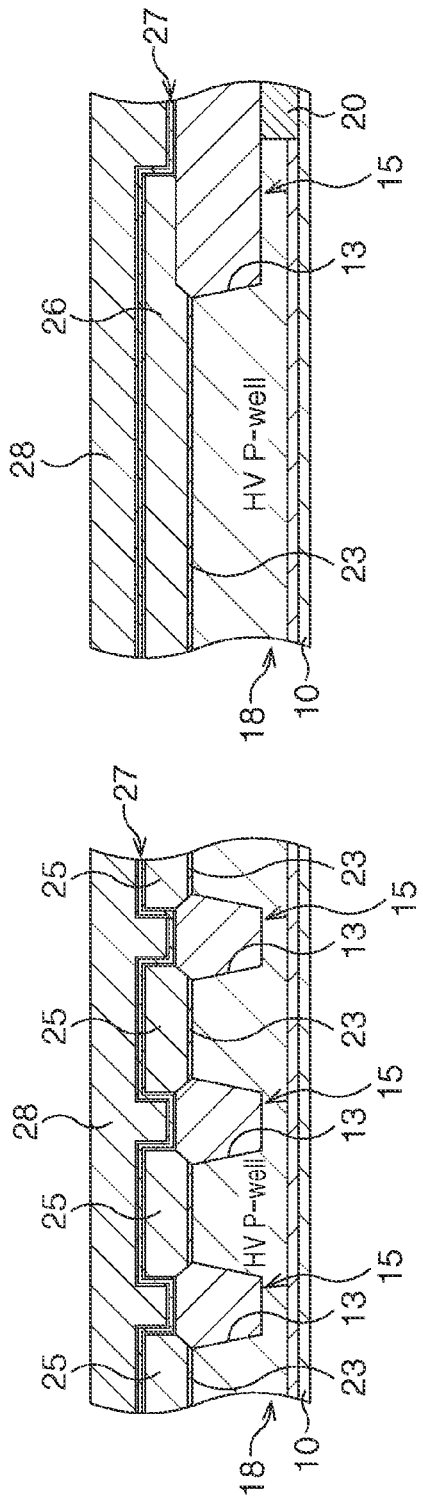
Figure 31C:
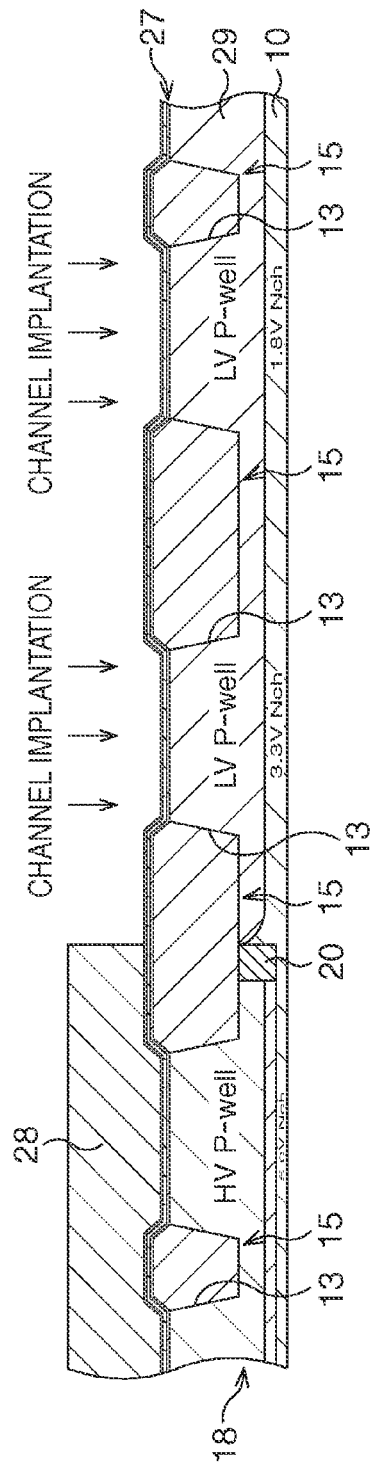

Subsequently, as illustrated in FIG. 31A to FIG. 31C, a P-type well 29 is formed in the respective active regions of the N-type transistor of 1.8 V and the N-type transistor of 3.3 V in the peripheral circuit region, and channel implantation is performed.

Specifically, a resist is first coated on the entire surface of the semiconductor substrate 10, and then the resist is processed by lithography. Thereby, a resist mask 28 having an opening that exposes the respective active regions of the N-type transistor of 1.8 V and the N-type transistor of 3.3 V in the peripheral circuit region is formed.

With the resist mask 28, a P-type impurity, which is, for example, boron ($B^+$), is ion implanted into the exposed active regions under conditions of a dose amount of $3.0 \times 10^{13}/cm^2$ and acceleration energy of 230 keV. Thereby, the P-type well 29 is formed in the active regions exposed from the resist mask 28.

With the resist mask 28, channel implantation is performed in the exposed active regions. Here, a P-type impurity, which is, for example, boron ($B^+$), is ion implanted into the exposed active regions under conditions of a dose amount of $5.6 \times 10^{12}/cm^2$ and acceleration energy of 32 keV.

The resist mask 28 is removed by an asking process or a wet process.

Subsequently, similarly, an N-type well is formed in the respective active regions of the P-type transistor of 1.8 V and the P-type transistor of 3.3 V in the peripheral circuit region, and channel implantation is performed.

Subsequently, as illustrated in FIG. 32A to FIG. 32C, channel implantation is performed in the active region of the N-type transistor of 1.8 V in the peripheral circuit region.

Specifically, a resist is first coated on the entire surface of the semiconductor substrate 10, and then the resist is processed by lithography. Thereby, a resist mask 62 having an opening that exposes the active region of the N-type transistor of 1.8 V in the peripheral circuit region is formed.

With the resist mask 62, channel implantation is performed in the exposed active region. Here, a P-type impurity, which is, for example, boron ($B^+$), is ion implanted into the exposed active region under conditions of a dose amount of $7.4 \times 10^{12}/cm^2$ and acceleration energy of 32 keV.

Figure 33A:
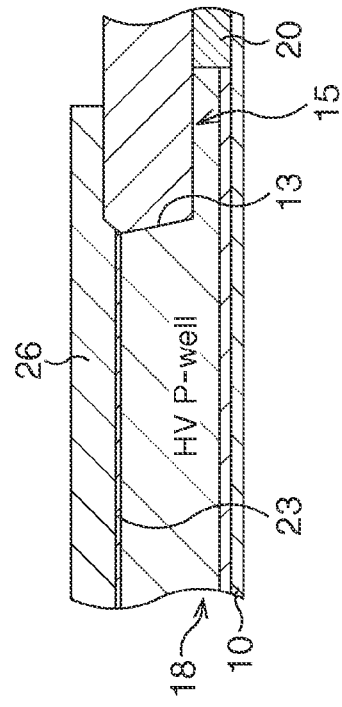
FIG. 33A to FIG. 33C are schematic cross-sectional views illustrating the manufacturing method of the nonvolatile semiconductor memory according to the second embodiment, subsequently to FIG. 32A to FIG. 32C.
Figure 33B:
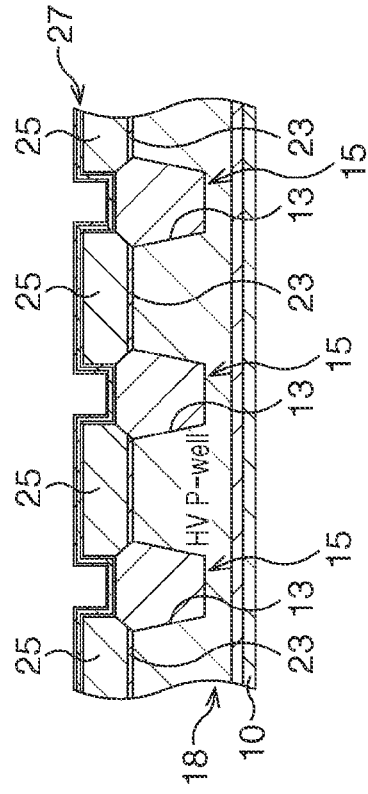
Figure 33C:
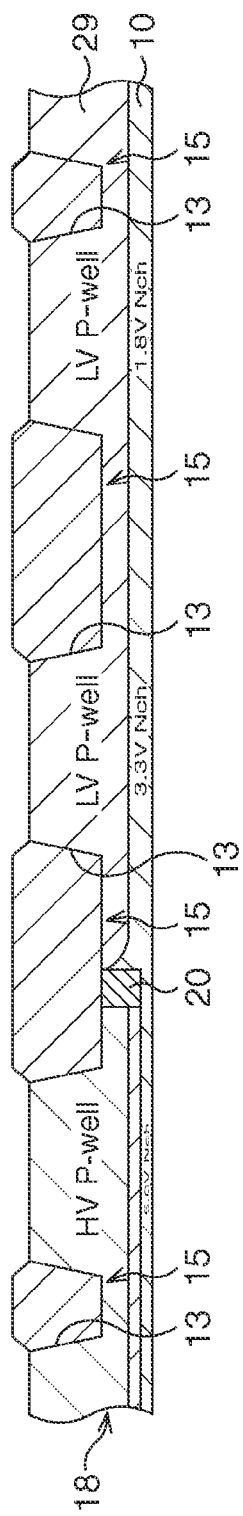

Subsequently, as illustrated in FIG. 33A to FIG. 33C, the ONO film 27 is left only in the formation region of the storage element.

Specifically, the resist mask 62 is first removed by an asking process or a wet process.

Lithography, dry etching, and wet etching are performed on the ONO film 27 to thereby remove the ONO film 27 in the formation region of the bypass capacitor and the peripheral circuit region, and the ONO film 27 is selectively left only in the formation region of the storage element.

Figure 34A:
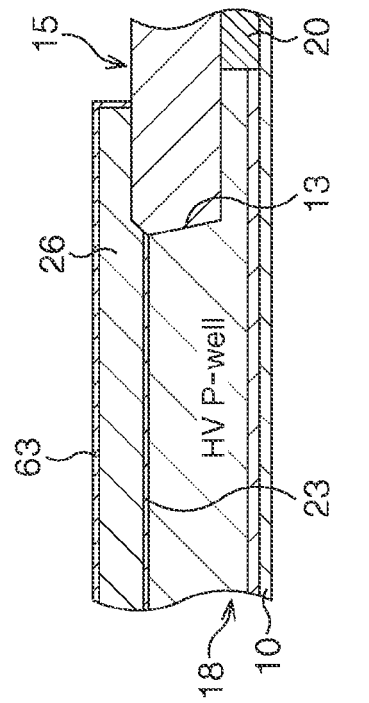
FIG. 34A to FIG. 34C are schematic cross-sectional views illustrating the manufacturing method of the nonvolatile semiconductor memory according to the second embodiment, subsequently to FIG. 33A to FIG. 33C.
Figure 34B:
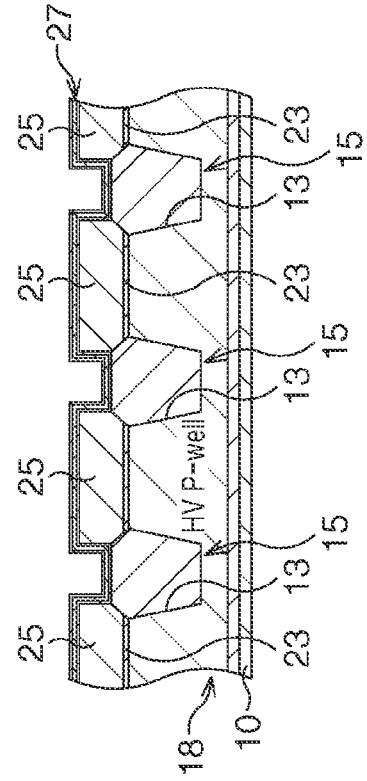
Figure 34C:
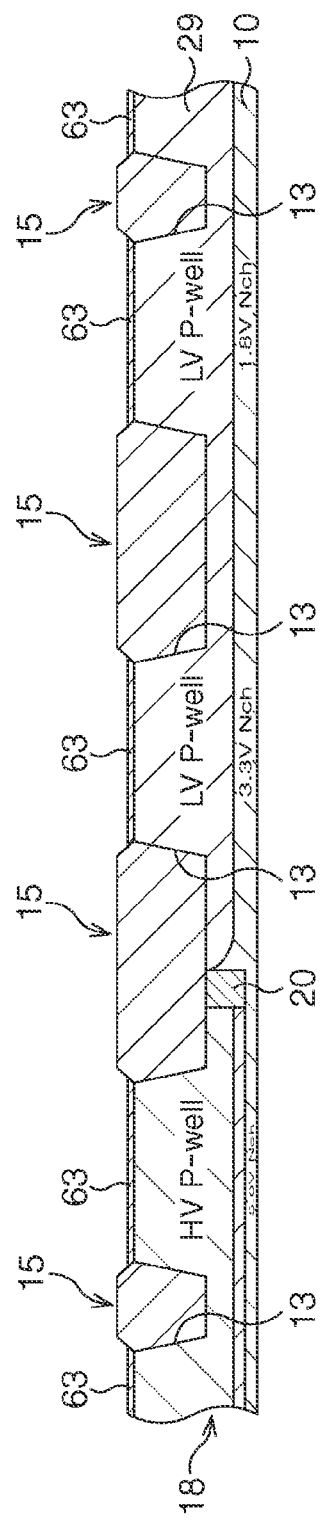

Subsequently, as illustrated in FIG. 34A to FIG. 34C, silicon oxide films 63 are formed.

Specifically, the surface of the semiconductor substrate 10 is thermally oxidized. Thereby, the silicon oxide films 63 are each formed on a surface of a first electrode 26 in the formation region of the bypass capacitor and on the surface, in the respective active regions, of the semiconductor substrate 10 in the peripheral circuit region. Here, the silicon oxide films 63 are each formed to have a film thickness of 10.5 nm or so in the peripheral circuit region. In contrast to this, in the formation region of the bypass capacitor, the silicon oxide film 63 is formed thicker than those in the peripheral circuit region due to the enhanced oxidation because the first electrode 26 is a doped·amorphous silicon film 24. In the formation region of the storage element, the ONO film 27 is formed on the entire surface, and is not easily oxidized as compared with the amorphous silicon, so that it is hardly oxidized.

Here, the silicon oxide films may also be formed by a radical oxidation method in place of the thermal oxidation method.

Figure 35B:
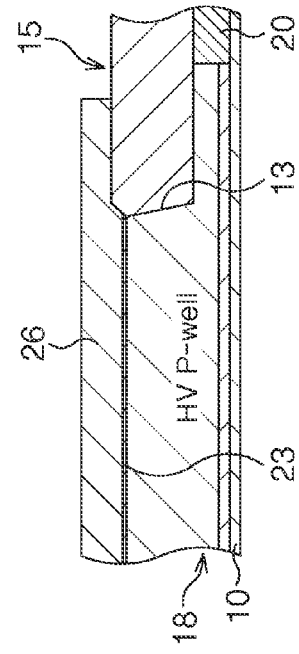
FIG. 35A to FIG. 35C are schematic cross-sectional views illustrating the manufacturing method of the nonvolatile semiconductor memory according to the second embodiment, subsequently to FIG. 34A to FIG. 34C.
Figure 35A:
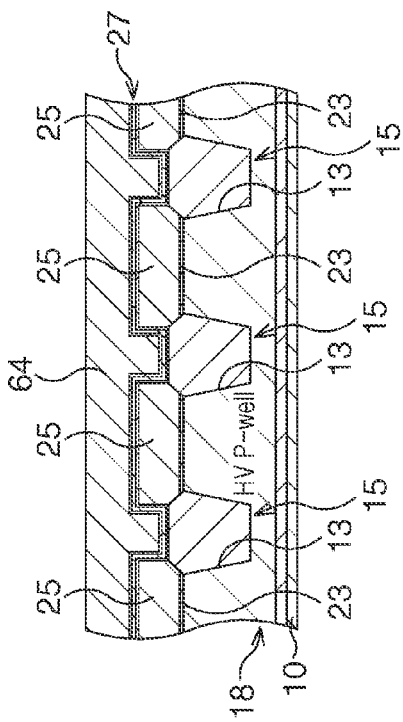
Figure 35C:
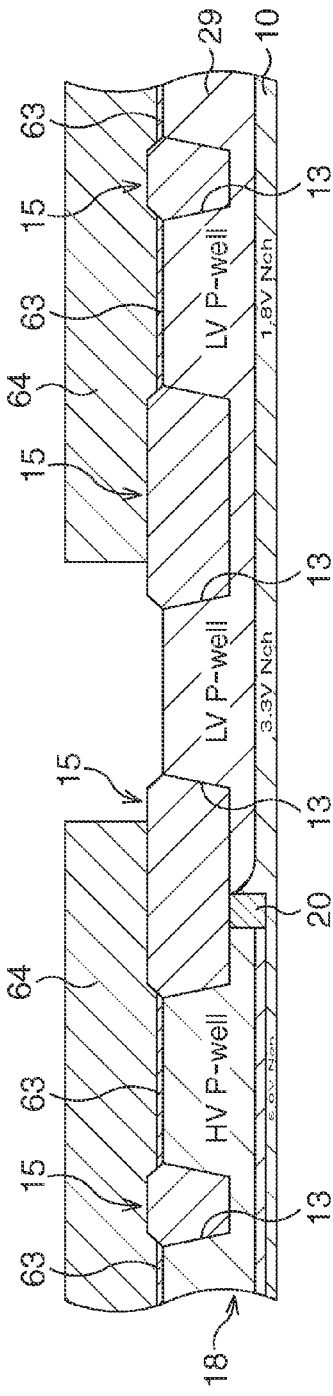

Subsequently, as illustrated in FIG. 35A to FIG. 35C, the silicon oxide films 63 formed in the formation region of the bypass capacitor and the respective active regions of the transistors of 3.3 V in the peripheral circuit region are removed.

Specifically, a resist is coated on the entire surface of the semiconductor substrate 10, and then the resist is processed by lithography. Thereby, a resist mask 64 having openings that expose the formation region of the bypass capacitor and the respective active regions of the transistors of 3.3 V in the peripheral circuit region is formed.

With the resist mask 64, the silicon oxide film 63 formed in the formation region of the bypass capacitor, and the silicon oxide films 63 formed in the respective active regions of the transistors of 3.3 V in the peripheral circuit region are removed by wet etching.

Figure 36A:
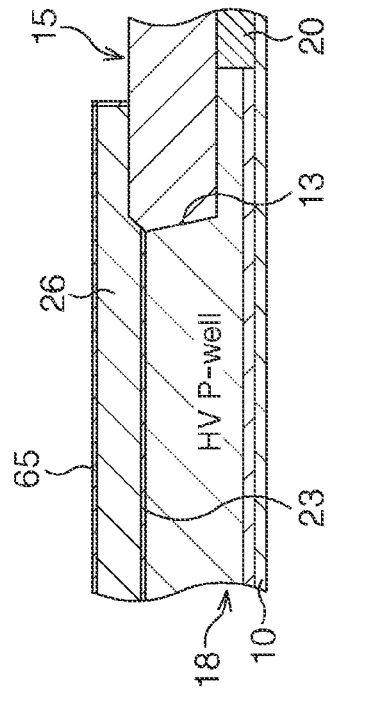
FIG. 36A to FIG. 36C are schematic cross-sectional views illustrating the manufacturing method of the nonvolatile semiconductor memory according to the second embodiment, subsequently to FIG. 35A to FIG. 35C.
Figure 36B:
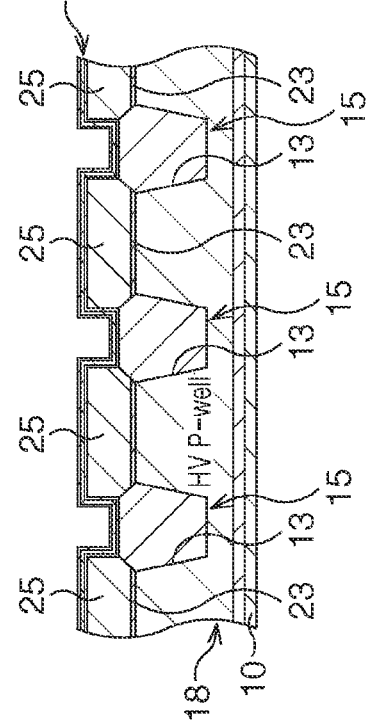
Figure 36C:
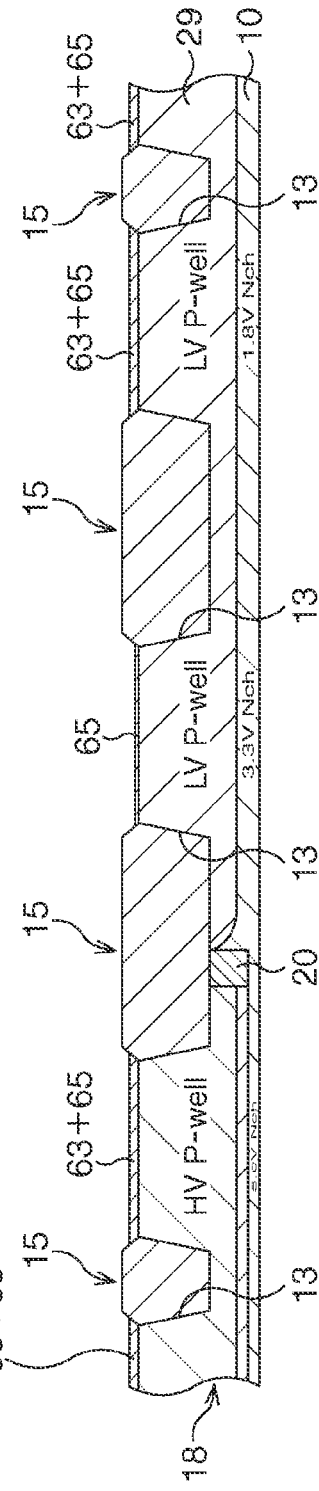

Subsequently, as illustrated in FIG. 36A to FIG. 36C, silicon oxide films 65 are formed.

Specifically, the resist mask 64 is first removed by an asking process or a wet process.

The surface of the semiconductor substrate 10 is thermally oxidized. By the thermal oxidization, in the respective active regions of the transistors of 5.0 V and the transistors of 1.8 V in the peripheral circuit region, the silicon oxide film 65 with a film thickness of 4.5 nm or so is formed on the surface of the semiconductor substrate 10 in addition to the silicon oxide film 63.

In the respective active regions of the transistors of 3.3 V in the peripheral circuit region, the silicon oxide film 65 with a film thickness of 6.5 nm or so is formed on the surface of the semiconductor substrate 10.

In the formation region of the bypass capacitor, the silicon oxide film 65 is formed on the surface of the first electrode 26. In the above case, due to the enhanced oxidation of the first electrode 26, the silicon oxide film 65 is formed thicker than those in the peripheral circuit region.

The ONO film 27 formed in the formation region of the storage element is hardly oxidized.

Here, the silicon oxide films may also be formed by a radical oxidation method in place of the thermal oxidation method.

Figure 37B:
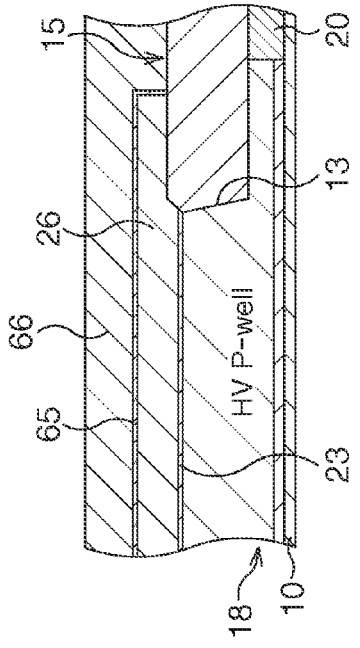
FIG. 37A to FIG. 37C are schematic cross-sectional views illustrating the manufacturing method of the nonvolatile semiconductor memory according to the second embodiment, subsequently to FIG. 36A to FIG. 36C.
Figure 37A:
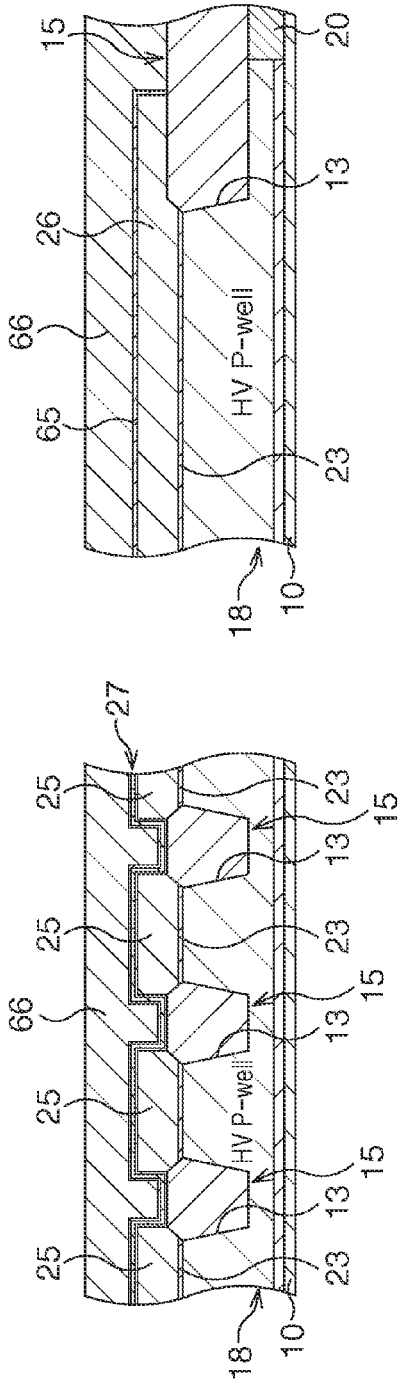
Figure 37C:
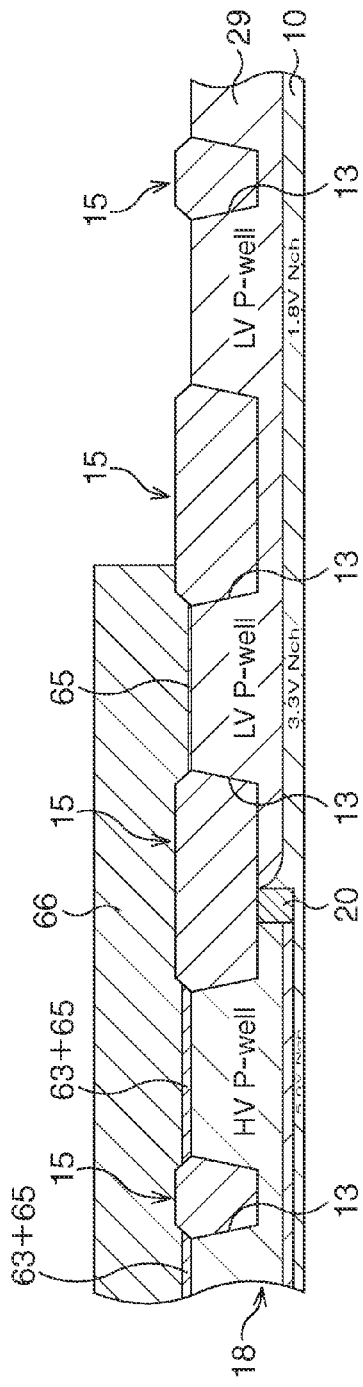

Subsequently, as illustrated in FIG. 37A to FIG. 37C, the silicon oxide films 63, 65 formed in the respective active regions of the transistors of 1.8 V in the peripheral circuit region are removed.

Specifically, a resist is coated on the entire surface of the semiconductor substrate 10, and then the resist is processed by lithography. Thereby, a resist mask 66 having an opening that exposes the respective active regions of the transistors of 1.8 V in the peripheral circuit region is formed.

With the resist mask 66, the silicon oxide films 63, 65 formed in the respective active regions of the transistors of 1.8 V in the peripheral circuit region are removed by wet etching.

Figure 38A:
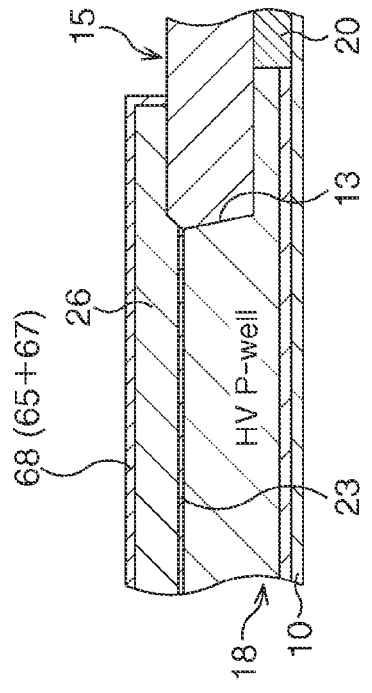
FIG. 38A to FIG. 38C are schematic cross-sectional views illustrating the manufacturing method of the nonvolatile semiconductor memory according to the second embodiment, subsequently to FIG. 37A to FIG. 37C.
Figure 38B:
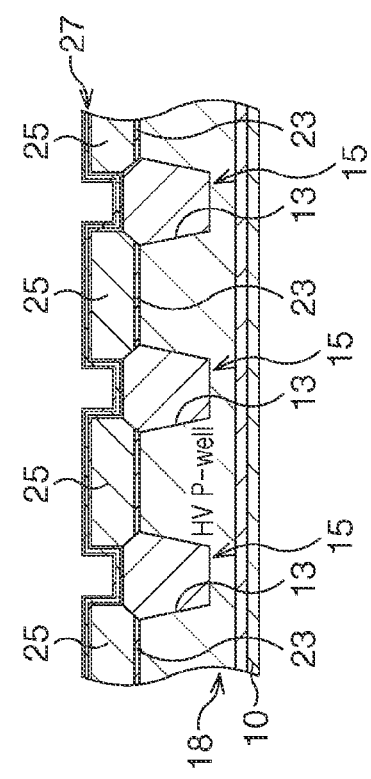
Figure 38C:
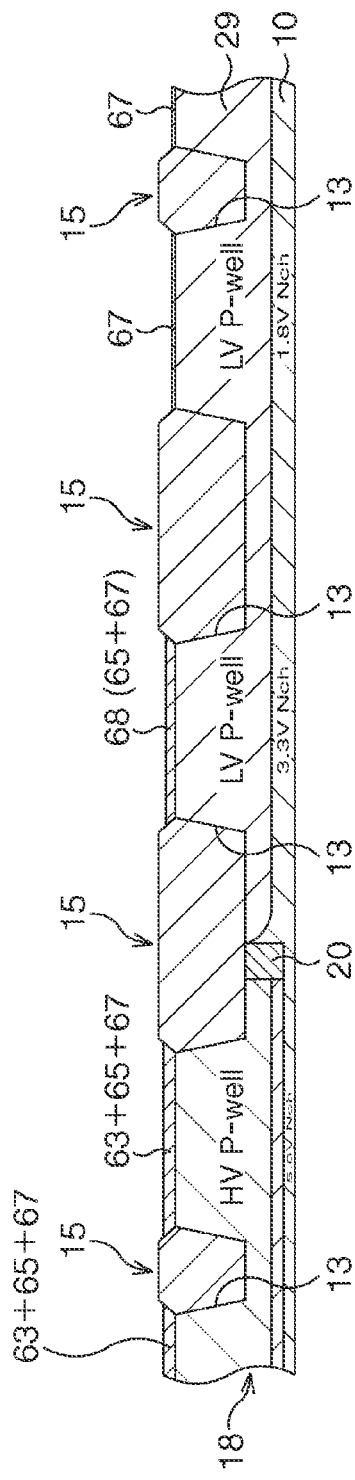

Subsequently, as illustrated in FIG. 38A to FIG. 38C, silicon oxide films 67 are formed.

Specifically, the resist mask 66 is first removed by an asking process or a wet process.

The surface of the semiconductor substrate 10 is thermally oxidized. By the thermal oxidization, in the respective active regions of the transistors of 5.0 V in the peripheral circuit region, the silicon oxide film 67 with a film thickness of 3 nm or so is formed on the surface of the semiconductor substrate 10 in addition to the silicon oxide films 63, 65. A stacked film of the silicon oxide films 63, 65, and 67 becomes a gate insulating film of the transistors of 5.0 V.

In the respective active regions of the transistors of 1.8 V in the peripheral circuit region, the silicon oxide film 67 with a film thickness of 3 nm or so is formed on the surface of the semiconductor substrate 10. The silicon oxide film 67 becomes a gate insulating film of the transistors of 1.8 V.

In the respective active regions of the transistors of 3.3 V in the peripheral circuit region, the silicon oxide film 67 with a film thickness of 3 nm or so is formed on the surface of the semiconductor substrate 10 in addition to the silicon oxide film 65. Thereby, a second insulating film 68 that is composed of the silicon oxide films 65, 67 and becomes a gate insulating film of the transistors of 3.3 V is formed.

In the formation region of the bypass capacitor, similarly to the respective active regions of the transistors of 3.3 V in the peripheral circuit region, the silicon oxide film 67 is formed on the surface of the first electrode 26 in addition to the silicon oxide film 65. Also in the above case, the silicon oxide film 67 is formed thicker than those in the peripheral circuit region due to the enhanced oxidation of the first electrode 26. Thereby, the second insulating film 68 that is composed of the silicon oxide films 65, 67 and becomes a second capacitor insulating film of the bypass capacitor is formed on the first electrode 26. The second insulating film 68 in the formation region of the bypass capacitor is formed thicker than that of the transistors of 3.3 V in the peripheral circuit region to have a film thickness of, for example, 11 nm or so due to the above-described enhanced oxidation.

The ONO film 27 formed in the formation region of the storage element is hardly oxidized.

Here, the silicon oxide films may also be formed by a radical oxidation method in place of the thermal oxidation method.

In this embodiment, a first insulating film 23 becomes a tunnel insulating film of the storage element, and becomes a first capacitor insulating film of the bypass capacitor. Further, the doped·amorphous silicon film 24 turns to floating gate electrodes 25 of the storage element, and turns to the first electrode (lower electrode) 26 of the bypass capacitor.

Further, the second insulating film 68 becomes the gate insulating film of one of the three types of transistors in the peripheral circuit, which is the transistors of 3.3 V here, and becomes the second capacitor insulating film of the bypass capacitor.

Subsequently, processes similar to those in FIG. 17A to FIG. 17C to FIG. 21A to FIG. 21C in the first embodiment are performed. Thereby, as illustrated in FIG. 39A to FIG. 39C, an opening 37a is formed in a second electrode 37 in the formation region of the bypass capacitor, and gate electrodes 41 are formed in the respective active regions in the peripheral circuit region respectively.

Subsequently, as illustrated in FIG. 40A to FIG. 40C, shallow N-type impurity regions 43 are each formed in the active region of the N-type transistor of 1.8 V in the peripheral circuit region.

Specifically, a resist is first coated on the entire surface of the semiconductor substrate 10, and then the resist is processed by lithography. Thereby, a resist mask 69 having an opening that exposes only the active region of the N-type transistor of 1.8 V in the peripheral circuit region is formed.

With the resist mask 69, an N-type impurity, which is, for example, arsenic ($As^+$), is ion implanted into the exposed active region of the N-type transistor of 1.8 V in the peripheral circuit region under conditions of a dose amount of $5.0 \times 10^{14}$/ cm² and acceleration energy of 15 keV. Thereby, in the active region, As⁺ is introduced into the surface, of both sides of the gate electrode 41, of the semiconductor substrate 10 to form the shallow N-type impurity regions 43.

Subsequently, as illustrated in FIG. 41A to FIG. 41C, shallow N-type impurity regions 71 are each formed in the active region of the N-type transistor of 3.3 V in the peripheral circuit region.

Specifically, the resist mask 69 is first removed by an asking process or a wet process.

A resist is coated on the entire surface of the semiconductor substrate 10, and then the resist is processed by lithography. Thereby, a resist mask 70 having an opening that exposes only the active region of the N-type transistor of 3.3 V in the peripheral circuit region is formed.

With the resist mask 70, an N-type impurity, which is, for example, arsenic (As⁺), is ion implanted into the exposed active region of the N-type transistor of 3.3 V in the peripheral circuit region under conditions of a dose amount of $4.0 \times 10^{13}/$ cm² and acceleration energy of 20 keV. Thereby, in the active region, As⁺ is introduced into the surface, of both sides of the gate electrode 41, of the semiconductor substrate 10 to form the shallow N-type impurity regions 71.

Subsequently, processes similar to those in FIG. 23A to FIG. 23C to FIG. 29A to FIG. 29C in the first embodiment are performed. Thereby, as illustrated in FIG. 42A to FIG. 42C, connection plugs 57 and wirings 61 are formed.

Thereafter, the semiconductor memory in this embodiment is formed through processes of forming an interlayer insulating film, the connection plugs, and the wirings in an upper layer, and the like.

Incidentally, in this embodiment, the case where the second capacitor insulating film, together with the gate insulating film of the transistors of 3.3 V in the peripheral circuit, is formed of the second insulating film 68 is indicated as an example, but the second capacitor insulating film may also be formed of an insulating film the same as the gate insulating film of the transistors of 5.5 or the transistors of 1.8 V in the peripheral circuit. The case where the second capacitor insulating film is formed of an insulating film the same as the gate insulating film of the transistors of 1.8 V is indicated in the following third embodiment as an example. That is, in this embodiment, it is possible to appropriately select the second capacitor insulating film from the three types of insulating films different in film thickness depending on the necessary bypass capacitor.

As explained above, according to this embodiment, the nonvolatile semiconductor memory provided with the bypass capacitor that excels in dielectric breakdown resistance, has no concern in terms of reliability, obtains a desired capacitance with a small occupied area, and has a high capacitance density is achieved without increase in manufacturing processes of the semiconductor memory.

(Third Embodiment)

FIG. 43A to FIG. 43C to FIG. 47A to FIG. 47C are schematic cross-sectional views illustrating a manufacturing method of a nonvolatile semiconductor memory according to a third embodiment in order of processes. In the respective drawings, A illustrates a formation region of a storage element, B illustrates a formation region of a bypass capacitor, and C illustrates a peripheral circuit region respectively. As for the formation region of the storage element, in FIG. 43A to FIG. 46A, the cross section of control gate electrodes taken along the longitudinal direction is illustrated, and in FIG. 47A, the cross section of the control gate electrodes taken along the short-side direction is illustrated respectively.

In this embodiment, the case where in the peripheral circuit region, N-type and P-type transistors each having its gate voltage (power supply voltage) of 1.8 V, N-type and P-type transistors of 3.3 V, and N-type and P-type transistors of 5.0 V are formed is indicated as an example. For the convenience of illustration, the N-type transistor of 1.8 V, the N-type transistor of 3.3 V, and the N-type transistor of 5.0 V are only illustrated in each of the drawings, and "1.8 V Nch", "3.3 V Nch", and "5.0 V Nch" are added to active regions of the peripheral circuit region.

In this embodiment, processes similar to those in FIG. 1A to FIG. 1C to FIG. 11A to FIG. 11C in the first embodiment are first performed, and subsequently, processes similar to those in FIG. 31A to FIG. 31C to FIG. 34A to FIG. 34C in the second embodiment are further performed. Thereby, similarly to FIG. 34A to FIG. 34C, silicon oxide films 63 are formed.

Figure 43A:
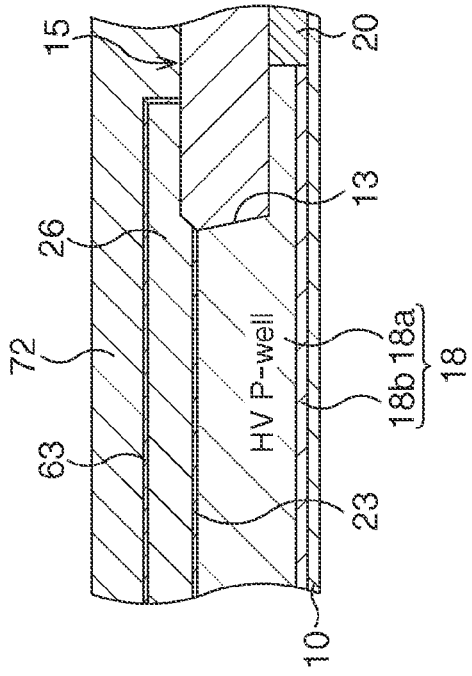
FIG. 43A to FIG. 43C are schematic cross-sectional views illustrating a manufacturing method of a nonvolatile semiconductor memory according to a third embodiment.
Figure 43B:
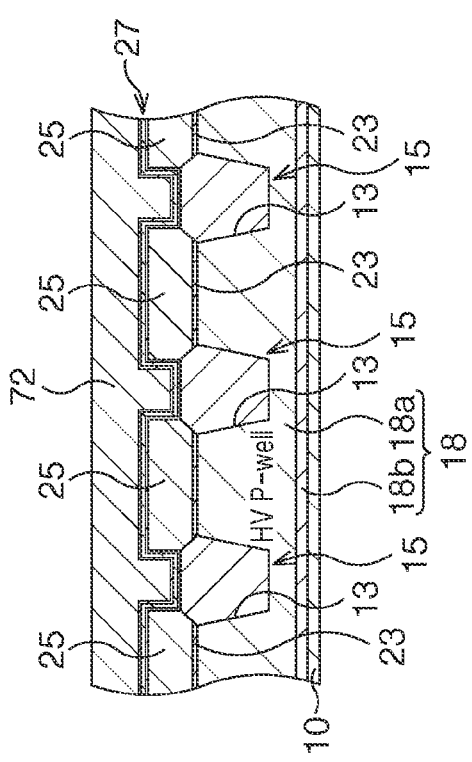
Figure 43C:
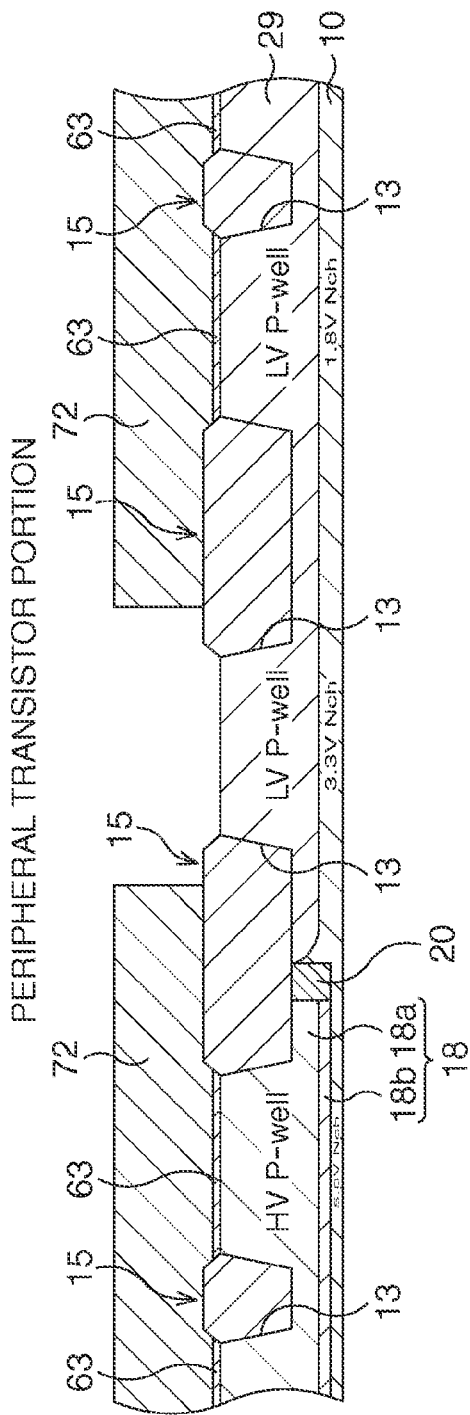

Subsequently, as illustrated in FIG. 43A to FIG. 43C, the silicon oxide films 63 formed in the respective active regions of the transistors of 3.3 V in the peripheral circuit region are removed.

Specifically, a resist is coated on an entire surface of a semiconductor substrate 10, and then the resist is processed by lithography. Thereby, a resist mask 72 having an opening that exposes the respective active regions of the transistors of 3.3 V in the peripheral circuit region is formed.

With the resist mask 72, the silicon oxide films 63 formed in the respective active regions of the transistors of 3.3 V in the peripheral circuit region are removed by wet etching.

Figure 44A:
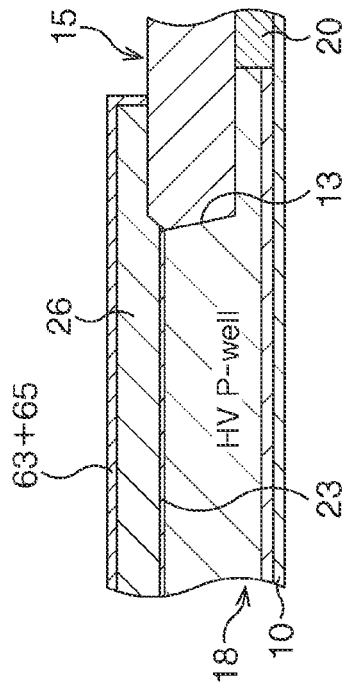
FIG. 44A to FIG. 44C are schematic cross-sectional views illustrating the manufacturing method of the nonvolatile semiconductor memory according to the third embodiment, subsequently to FIG. 43A to FIG. 43C.
Figure 44B:
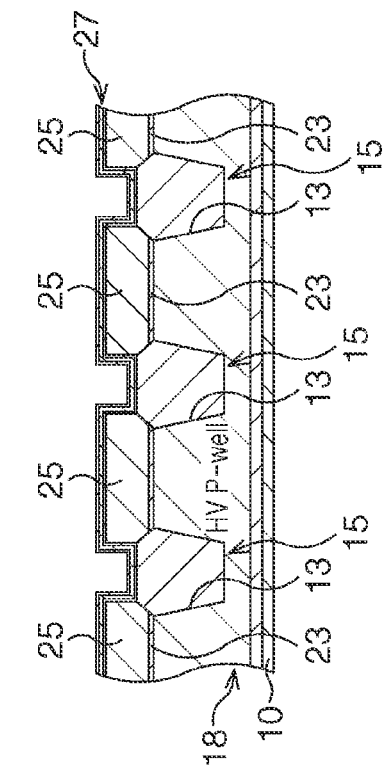
Figure 44C:
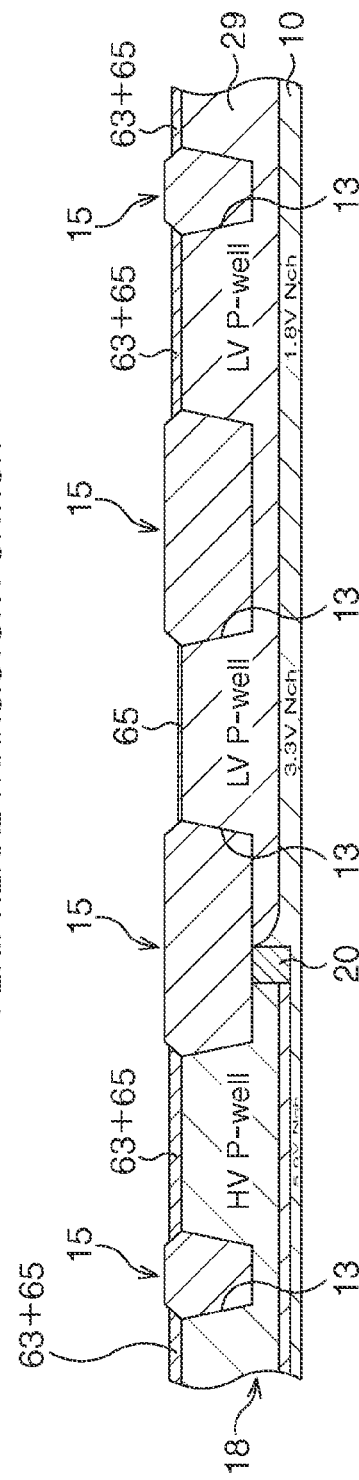

Subsequently, as illustrated in FIG. 44A to FIG. 44C, silicon oxide films 65 are formed.

Specifically, the resist mask 72 is first removed by an asking process or a wet process.

The surface of the semiconductor substrate 10 is thermally oxidized. By the thermal oxidization, in the respective active regions of the transistors of 5.0 V and the transistors of 1.8 V in the peripheral circuit region, the silicon oxide film 65 with a film thickness of 4.5 nm or so is formed on the surface of the semiconductor substrate 10 in addition to the silicon oxide film 63.

In the respective active regions of the transistors of 3.3 V in the peripheral circuit region, the silicon oxide film 65 with a film thickness of 6.5 nm or so is formed on the surface of the semiconductor substrate 10.

In the formation region of the bypass capacitor, similarly to the respective active regions of the transistors of 5.0 V and the transistors of 1.8 V in the peripheral circuit region, the silicon oxide film 65 is formed on a surface of a first electrode 26 in addition to the silicon oxide film 63. In the above case, the silicon oxide film 65 is formed thicker than those in the peripheral circuit region due to the enhanced oxidation of the first electrode 26.

An ONO film 27 formed in the formation region of the storage element is hardly oxidized.

Here, the silicon oxide films may also be formed by a radical oxidation method in place of the thermal oxidation method.

Subsequently, as illustrated in FIG. 45A to FIG. 45C, the silicon oxide films 63, 65 formed in the formation region of the bypass capacitor and the respective active regions of the transistors of 1.8 V in the peripheral circuit region are removed.

Specifically, a resist is coated on the entire surface of the semiconductor substrate 10, and then the resist is processed by lithography. Thereby, a resist mask 73 having openings that expose the formation region of the bypass capacitor and the respective active regions of the transistors of 1.8 V in the peripheral circuit region is formed.

With the resist mask 73, the silicon oxide films 63, 65 formed in the formation region of the bypass capacitor and the silicon oxide films 63, 65 formed in the respective active regions of the transistors of 1.8 V in the peripheral circuit region are removed by wet etching.

Figure 46B:
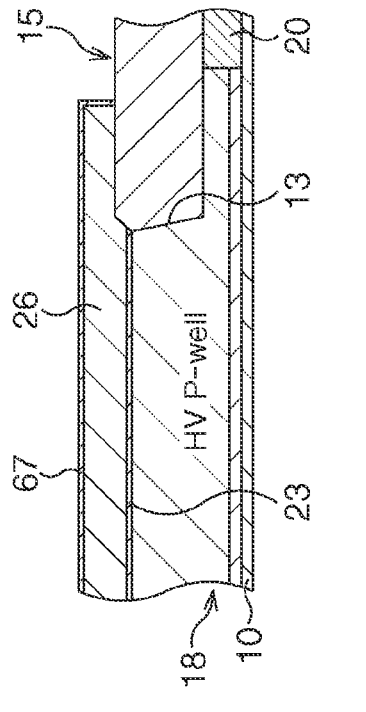
FIG. 46A to FIG. 46C are schematic cross-sectional views illustrating the manufacturing method of the nonvolatile semiconductor memory according to the third embodiment, subsequently to FIG. 45A to FIG. 45C.
Figure 46A:
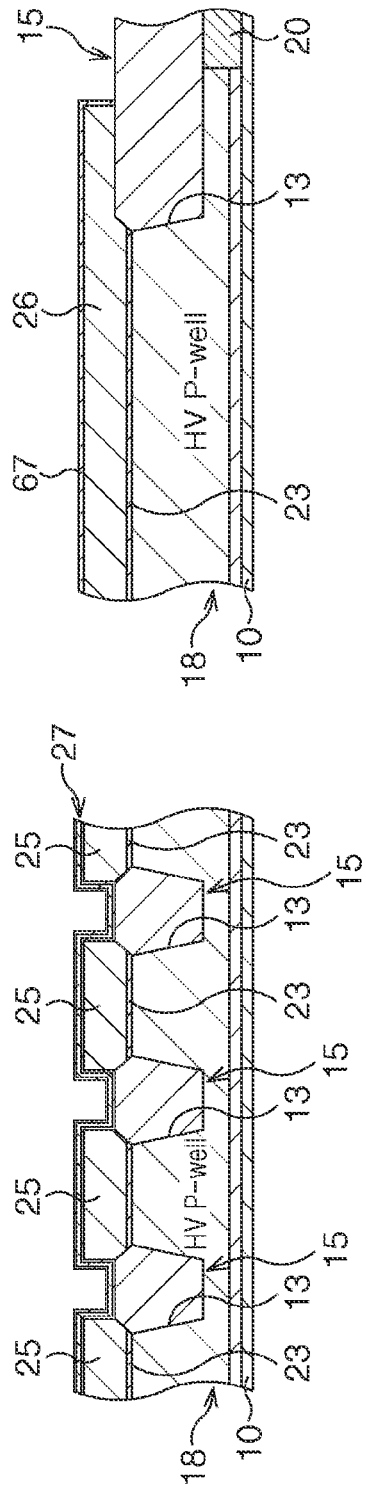
Figure 46C:
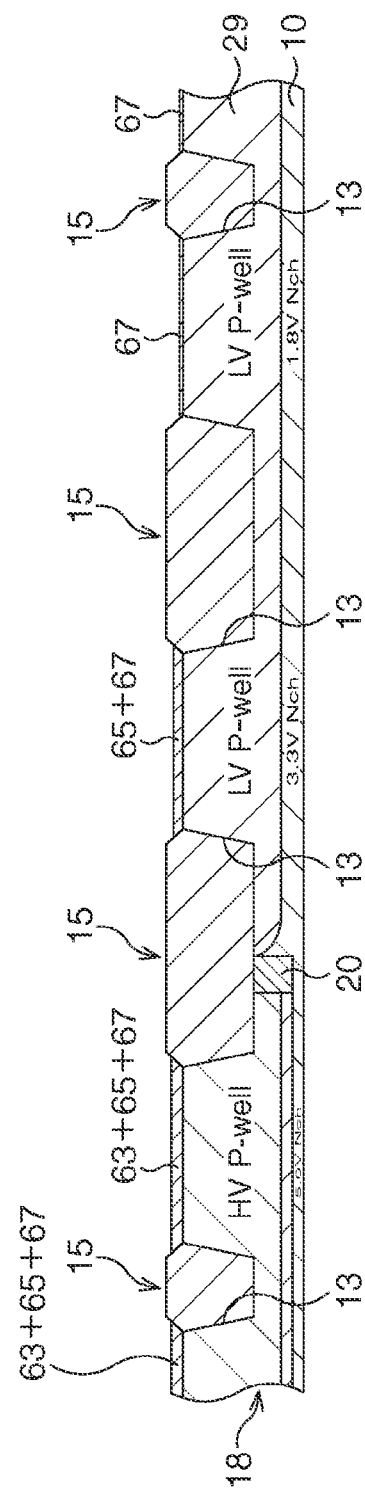

Subsequently, as illustrated in FIG. 46A to FIG. 46C, silicon oxide films 67 are formed.

Specifically, the resist mask 73 is first removed by an asking process or a wet process.

The surface of the semiconductor substrate 10 is thermally oxidized.

By the thermal oxidization, in the active region of the N-type transistor of 5.0 V in the peripheral circuit region, the silicon oxide film 67 with a film thickness of 3 nm or so is formed on the surface of the semiconductor substrate 10 in addition to the silicon oxide films 63, 65. A stacked film of the silicon oxide films 63, 65, and 67 becomes a gate insulating film of the transistors of 5.0 V.

In the active regions of the transistors of 3.3 V in the peripheral circuit region, the silicon oxide film 67 with a film thickness of 3 nm or so is formed on the surface of the semiconductor substrate 10 in addition to the silicon oxide film 65. A stacked film of the silicon oxide films 65, 67 becomes a gate insulating film of the transistors of 3.3 V.

In the active regions of the transistors of 1.8 V in the peripheral circuit region, the silicon oxide film 67 with a film thickness of 3 nm or so is formed on the surface of the semiconductor substrate 10. The silicon oxide film 67 is a second insulating film to be a gate insulating film of the transistors of 1.8 V.

In the formation region of the bypass capacitor, the silicon oxide film 67 is formed on the surface of the first electrode 26. Also in the above case, the silicon oxide film 67 is formed thicker than those in the peripheral circuit region due to the enhanced oxidation of the first electrode 26. The silicon oxide film 67 is the second insulating film to be a second capacitor insulating film of the bypass capacitor. The silicon oxide film 67 in the formation region of the bypass capacitor, due to the above-described enhanced oxidation, is formed thicker than those of the transistors of 1.8 V in the peripheral circuit region to have a film thickness of 5.5 nm or so, for example.

The ONO film 27 formed in the formation region of the storage element is hardly oxidized.

Here, the silicon oxide films may also be formed by a radical oxidation method in place of the thermal oxidation method.

In this embodiment, a first insulating film 23 becomes a tunnel insulating film of the storage element and becomes a first capacitor insulating film of the bypass capacitor. Further, a doped-amorphous silicon film 24 turns to floating gate electrodes 25 of the storage element, and turns to the first electrode (lower electrode) 26 of the bypass capacitor.

Further, the silicon oxide film 67 being the second insulating film becomes the gate insulating film of one of the three types of transistors in the peripheral circuit, which is the transistors of 1.8 V here, and becomes the second capacitor insulating film of the bypass capacitor.

Subsequently, processes similar to those in FIG. 17A to FIG. 17C to FIG. 21A to FIG. 21C in the first embodiment are performed. Subsequently, processes similar to those in FIG. 41A to FIG. 41C and FIG. 42A to FIG. 42C in the second embodiment are further performed. Thereby, as illustrated in FIG. 47A to FIG. 47C, connection plugs 57 and wirings 61 are formed.

Thereafter, the semiconductor memory in this embodiment is formed through processes of forming an interlayer insulating film, the connection plugs, and the wirings in an upper layer, and the like.

As explained above, according to this embodiment, the nonvolatile semiconductor memory provided with the bypass capacitor that excels in dielectric breakdown resistance, has no concern in terms of reliability, obtains a desired capacitance with a small occupied area, and has a high capacitance density is achieved without increase in manufacturing processes of the semiconductor memory.

By appropriately combining the above-described first to third embodiments, a plurality of types (two types or three types, here) of bypass capacitors different in film thickness of the second capacitor insulating film may also be formed.

For example, a bypass capacitor A whose second capacitor insulating film is formed of the second insulating film the same as the gate insulating film of the transistors of 3.3 V in the peripheral circuit region, and a bypass capacitor B whose second capacitor insulating film is formed of the second insulating film the same as the gate insulating film of the transistors of 1.8 V are formed. In the above case, in a series of processes of forming the storage element and the transistors in the peripheral circuit, the bypass capacitor A is formed in the respective processes in the second embodiment, and the bypass capacitor B is formed in the respective processes in the third embodiment. This makes it possible to form a plurality of types of bypass capacitors having different power supply voltages and corresponding to the need, together with the storage element and the transistors in the peripheral circuit without increasing the number of processes.

Incidentally, in the above-described first to third embodiments, the case where the bypass capacitor is formed together with the nonvolatile storage element and the transistors in the peripheral circuit is indicated as an example, but it is also possible to apply the bypass capacitor to another capacitor being a functional element to be mounted on the semiconductor memory. That is, in the above case, the capacitor is formed together with the nonvolatile storage element and the transistors in the peripheral circuit similarly to the above-described first to third embodiments.

According to the above-described aspects, the semiconductor device provided with the bypass capacitor that excels in dielectric breakdown resistance, has no concern in terms of reliability, obtains a desired capacitance with a small occupied area, and has a high capacitance density is achieved without increase in manufacturing processes of the semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:
1. A manufacturing method of a semiconductor device comprising:
forming a first insulating material on a semiconductor substrate that comprises a first region, a second region and a third region;

forming a first conductive material on the first insulating material;

patterning the first conductive material and the first insulating material to expose the semiconductor substrate of the second region, to form a first insulating film on the semiconductor substrate of the first region and a first gate on the first insulating film, and to form a fourth insulating film on the semiconductor substrate of the third region and first electrode on the fourth insulating film;

forming a second insulating material on the semiconductor substrate of the second region, the first gate and the first electrode;

patterning the second insulating material to form a second insulating film on the first gate and to remove the second insulating material on the first electrode and the semiconductor substrate of the second region;

forming a third insulating film on the semiconductor substrate of the second region and a fifth insulating film on the first electrode by oxidizing the semiconductor substrate of the second region and the first electrode after patterning the second insulating material;

forming a second conductive material on the second insulating film, the third insulating film and the fifth insulating film after oxidizing the semiconductor substrate and the first electrode;

patterning the second conductive material to form a second gate on the second insulating film, a third gate on the third insulating film and a second electrode on the fifth insulating film.

2. The manufacturing method of the semiconductor device according to claim 1, wherein the semiconductor substrate further comprises a fourth region; and the second conductive material is formed in the fourth region, and the manufacturing method of the semiconductor device according to claim 1 further comprising forming a sixth insulating film that has a thickness different from a thickness of the third insulating film by oxidizing the semiconductor substrate of the fourth region after patterning the second insulating material; and forming a fourth gate above the sixth insulating film by patterning the second conductive material.

3. The manufacturing method of the semiconductor device according to claim 2, wherein a thickness of the fifth insulating film is different from the thickness of the sixth insulating film.

4. The manufacturing method of the semiconductor device according to claim 1, wherein the third insulating film and fifth insulating film are formed by a radical oxidation method.

5. The manufacturing method of the semiconductor device according to claim 1, wherein the fifth insulating film is thicker than the sixth insulating film.

6. The manufacturing method of the semiconductor device according to claim 1, further comprising forming an opening in the second electrode that expose a part of the first electrode.

7. The manufacturing method of the semiconductor device according to claim 6, wherein forming the opening by etching the second conductive material on the first electrode and forming the third gate by etching the second conductive material in the second region are performed simultaneously.

8. The manufacturing method of the semiconductor device according to claim 2, further comprising forming an opening in the second electrode that expose a part of the first electrode.

9. The manufacturing method of the semiconductor device according to claim 8, wherein forming the opening by etching the second conductive material on the first electrode, forming the third gate by etching the second conductive material in the second region and forming the fourth gate by etching the second conductive material in the fourth region are performed simultaneously.

10. The manufacturing method of the semiconductor device according to claim 1, wherein the first insulating film and the fourth insulating film are formed simultaneously.

11. The manufacturing method of the semiconductor device according to claim 1, wherein the second gate and the second electrode are formed simultaneously.

12. The manufacturing method of the semiconductor device according to claim 1, wherein the third insulating film and the fifth insulating film are formed simultaneously.

13. The manufacturing method of the semiconductor device according to claim 2, wherein forming the third insulating film and the fifth insulating film is performed by a plurality of times of oxidizing of the semiconductor substrate of the second region and the first gate, and forming the sixth insulating film is performed by one time of oxidizing of the semiconductor substrate of the fourth region.

14. The manufacturing method of the semiconductor device according to claim 13, wherein one of the plurality of times of oxidizing and the one time of oxidizing are performed simultaneously.

15. The manufacturing method of the semiconductor device according to claim 1, wherein an upper surface of the first electrode is exposed by patterning the second insulating material.

16. The manufacturing method of the semiconductor device according to claim 1, wherein oxidizing the semiconductor substrate of the second region and the first electrode is performed under the second insulating film exposed.

* * * * *